United States Patent

Yoshino

(10) Patent No.: US 9,519,214 B2
(45) Date of Patent: Dec. 13, 2016

(54) ACTINIC-RAY- OR RADIATION-SENSITIVE RESIN COMPOSITION, ACTINIC-RAY- OR RADIATION-SENSITIVE FILM, PATTERN FORMING METHOD, PROCESS FOR MANUFACTURING ELECTRONIC DEVICE AND ELECTRONIC DEVICE

(71) Applicant: FUJIFILM Corporation, Tokyo (JP)

(72) Inventor: Fumihiro Yoshino, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/818,310

(22) Filed: Aug. 5, 2015

(65) Prior Publication Data

US 2015/0338732 A1 Nov. 26, 2015

Related U.S. Application Data

(63) Continuation of application No. PCT/JP2014/052528, filed on Feb. 4, 2014.

(30) Foreign Application Priority Data

Feb. 5, 2013 (JP) ................................. 2013-020758

(51) Int. Cl.
| | |
|---|---|
| G03F 7/004 | (2006.01) |
| G03F 7/039 | (2006.01) |
| G03F 7/32 | (2006.01) |
| G03F 7/30 | (2006.01) |
| G03F 7/20 | (2006.01) |
| G03F 7/075 | (2006.01) |
| G03F 7/11 | (2006.01) |

(52) U.S. Cl.
CPC ........... *G03F 7/0045* (2013.01); *G03F 7/0046* (2013.01); *G03F 7/0397* (2013.01); *G03F 7/0758* (2013.01); *G03F 7/11* (2013.01); *G03F 7/20* (2013.01); *G03F 7/2041* (2013.01); *G03F 7/30* (2013.01); *G03F 7/322* (2013.01); *G03F 7/325* (2013.01)

(58) Field of Classification Search
None
See application file for complete search history.

(56) References Cited

U.S. PATENT DOCUMENTS

| | | | |
|---|---|---|---|
| 7,033,727 | B2 | 4/2006 | Kodama |
| 8,227,183 | B2 | 7/2012 | Tsubaki et al. |
| 8,440,386 | B2 | 5/2013 | Hatakeyama et al. |
| 8,703,384 | B2 | 4/2014 | Kobayashi et al. |
| 8,865,395 | B2 | 10/2014 | Nakamura et al. |
| 8,951,718 | B2 | 2/2015 | Tsubaki et al. |
| 2004/0072097 | A1 | 4/2004 | Kodama |
| 2008/0187860 | A1 | 8/2008 | Tsubaki et al. |
| 2011/0236826 | A1 | 9/2011 | Hatakeyama et al. |
| 2012/0058436 | A1 | 3/2012 | Tsubaki et al. |
| 2012/0077122 | A1* | 3/2012 | Iwato ........................ G03F 7/38 430/270.1 |
| 2012/0282548 | A1 | 11/2012 | Enomoto et al. |
| 2012/0315449 | A1 | 12/2012 | Tsubaki et al. |
| 2014/0212808 | A1 | 7/2014 | Funatsu et al. |

(Continued)

FOREIGN PATENT DOCUMENTS

| | | |
|---|---|---|
| JP | 04-39665 | 2/1992 |
| JP | 2002-255930 | 9/2002 |

(Continued)

OTHER PUBLICATIONS

"Written Opinion of the International Searching Authority" of PCT/JP2014/052528, mailed on Mar. 25, 2014, p. 1-p. 4.
"Office Action of Korea Counterpart Application", mailed on Dec. 2, 2015, pp. 1-10, with English translation thereof.
"Office Action of Japan Counterpart Application", issued on Mar. 1, 2016, pp. 1-7, with machine English translation by Global Dossier thereof.

(Continued)

*Primary Examiner* — Sin Lee
(74) *Attorney, Agent, or Firm* — Jianq Chyun IP Office

(57) ABSTRACT

An actinic-ray- or radiation-sensitive resin composition includes a compound (A) that is configured to produce an acid when exposed to actinic rays or radiation, and a resin (B). The compound (A) is expressed by general formula (1) or (2) below. The resin (B) contains a repeating unit (b) containing a group that is configured to decompose when acted on by an acid to thereby produce an alcoholic hydroxyl group.

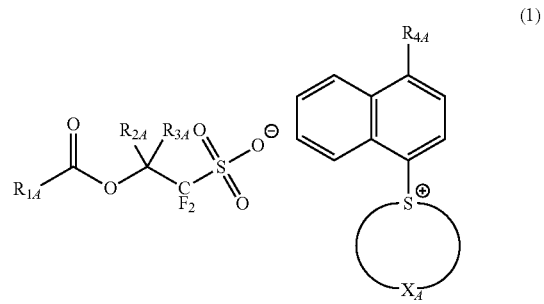

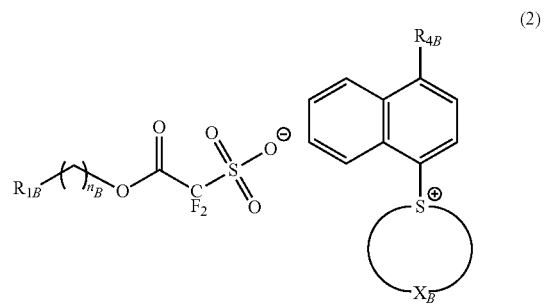

14 Claims, No Drawings

(56) References Cited

U.S. PATENT DOCUMENTS

2015/0079522 A1 3/2015 Tsubaki et al.

FOREIGN PATENT DOCUMENTS

| | | |
|---|---|---|
| JP | 2002-351077 | 12/2002 |
| JP | 2004-117688 | 4/2004 |
| JP | 2008-281975 | 11/2008 |
| JP | 2008-292975 | 12/2008 |
| JP | 2009-25707 | 2/2009 |
| JP | 2010-139996 | 6/2010 |
| JP | 2010-164958 | 7/2010 |
| JP | 2011-186247 | 9/2011 |
| JP | 2011-197339 | 10/2011 |
| JP | 2011-221513 | 11/2011 |
| JP | 2012-073402 | 4/2012 |
| JP | 2012-113143 | 6/2012 |
| JP | 2012-128383 | 7/2012 |
| JP | 2012-153644 | 8/2012 |
| JP | 2012-208431 | 10/2012 |
| JP | 2013-3155 | 1/2013 |
| JP | 2014-145809 | 8/2014 |
| WO | WO 2013/100189 A1 * | 7/2013 |

* cited by examiner

ACTINIC-RAY- OR RADIATION-SENSITIVE RESIN COMPOSITION, ACTINIC-RAY- OR RADIATION-SENSITIVE FILM, PATTERN FORMING METHOD, PROCESS FOR MANUFACTURING ELECTRONIC DEVICE AND ELECTRONIC DEVICE

CROSS-REFERENCE TO RELATED APPLICATIONS

This application is a Continuation Application of PCT Application No. PCT/JP2014/052528, filed Feb. 4, 2014, and based upon and claiming the benefit of priority from Japanese Patent Application No. 2013-020758, filed Feb. 5, 2013, the entire contents of which are incorporated herein by reference.

BACKGROUND OF THE INVENTION

1. Field of the Invention

The present invention relates to an actinic-ray- or radiation-sensitive resin composition that can find appropriate application in a semiconductor production process for an IC or the like, a circuit board production process for a liquid crystal, a thermal head or the like and other photofabrication lithography processes. The present invention also relates to an actinic-ray- or radiation-sensitive film formed from the composition and a pattern forming method using the composition. Further, the present invention relates to a process for manufacturing an electronic device and an electronic device.

2. Description of the Related Art

Since the development of the resist for a KrF excimer laser (248 nm), a pattern forming method in which chemical amplification is utilized has been employed in semiconductor lithography.

Shortening of the wavelength of exposure light sources and realization of high numerical apertures (high NA) for projector lenses have been promoted in order to cope with the miniaturization of semiconductor elements. To now, an exposure unit comprising an ArF excimer laser of 193 nm wavelength as a light source has been developed. A method (known as a liquid-immersion method) in which the space between a projector lens and a sample is filled with a liquid of high refractive index (hereinafter also referred to as an "immersion liquid") has been proposed as a technology for enhancing the resolving power. Moreover, an EUV lithography in which the exposure is carried out using an ultraviolet of further shorter wavelength (13.5 nm) has been proposed.

However, the current situation is that it is extremely difficult to discover an appropriate combination of resist composition, developer, rinse liquid, etc., required for the formation of a pattern realizing comprehensively excellent performance, so that there is a demand for further enhancement.

In the above-mentioned current situation, a variety of compounds have been developed as photoacid generators that constitute a major component of the chemically amplified resist composition. For example, sulfonium salt photoacid generators are described in patent references 1 to 4.

In recent years, methods of forming a pattern with a developer comprising an organic solvent are being developed (see, for example, patent references 5 to 12). For example, patent references 6 to 11 describe methods of forming a pattern, each comprising the operation of developing a resist composition, in which a resin containing a repeating unit containing a group that is configured to decompose when acted on by an acid to thereby produce a polar group is incorporated, with a developer comprising an organic solvent.

CITATION LIST

Patent Literature

Patent reference 1: Jpn. Pat. Appln. KOKAI Publication No. (JP-A-) 2002-351077,
Patent reference 2: JP-A-2002-255930,
Patent reference 3: JP-A-2004-117688,
Patent reference 4: JP-A-2012-153644,
Patent reference 5: JP-A-2008-292975,
Patent reference 6: JP-A-2008-281975,
Patent reference 7: JP-A-2010-139996,
Patent reference 8: JP-A-2010-164958,
Patent reference 9: JP-A-2009-25707,
Patent reference 10: JP-A-2011-221513,
Patent reference 11: JP-A-2012-208431, and
Patent reference 12: JP-A-H4-39665.

SUMMARY OF THE INVENTION

The inventors have conducted extensive and intensive studies. As a result, it has been found that in this technology, there is room for further improvements with respect to a problem such as a change of pattern line width associated with a time delay between post-exposure bake (PEB) and development, dependence of PEB temperature (post-exposure bake sensitivity; PEBs) and focus latitude (depth of focus; DOE).

It is an object of the present invention to provide an actinic-ray- or radiation-sensitive resin composition excelling in performances associated with dependence on time delay after PEB, dependence on PEB temperature and focus latitude (DOE). It is other objects of the present invention to provide a relevant actinic-ray- or radiation-sensitive film, pattern forming method, process for manufacturing an electronic device and electronic device.

Embodiments of the present invention are as described below.

[1] An actinic-ray- or radiation-sensitive resin composition comprising a compound (A) that is configured to produce an acid when exposed to actinic rays or radiation, the compound expressed by general formula (1) or (2) below, and a resin (B) containing a repeating unit (b) containing a group that is configured to decompose when acted on by an acid to thereby produce an alcoholic hydroxyl group,

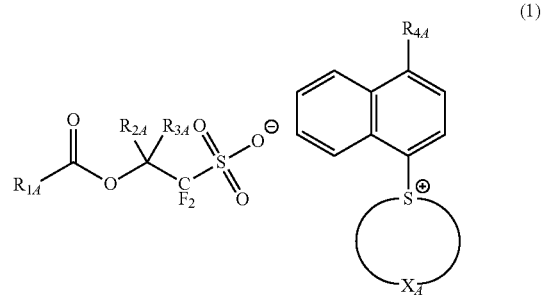

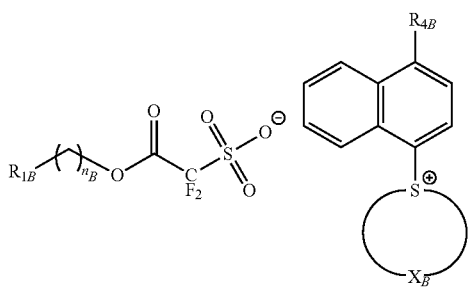
(2)

in general formula (1), $R_{1A}$ represents a linear, branched-chain or cyclic organic group;

each of $R_{2A}$ and $R_{3A}$ independently represents a hydrogen atom, a methyl group or $CF_3$;

$R_{4A}$ represents a hydrogen atom, a hydroxyl group, a linear or branched-chain alkyl group, a cycloalkyl group, a linear, branched-chain or cyclic alkyloxy group or any of groups of general formula (1a) below, provided that a fluorine atom may be contained in each of the alkyl group and the alkyloxy group; and $X_A$ represents an alkylene chain in which a heteroatom may be contained, the alkylene chain constructing a ring in cooperation with the S atom in the formula, and in general formula (2), $R_{1B}$ represents a linear, branched-chain or cyclic organic group;

$R_{4B}$ represents a hydrogen atom, a hydroxyl group, a linear or branched-chain alkyl group, a cycloalkyl group, a linear, branched-chain or cyclic alkyloxy group or any of groups of general formula (1a) below, provided that a fluorine atom may be contained in each of the alkyl group and the alkyloxy group;

$X_B$ represents an alkylene chain in which a heteroatom may be contained, the alkylene chain constructing a ring in cooperation with the S atom in the formula; and $n_B$ is 0 or 1,

(1a)

in general formula (1a), n is an integer of 1 or greater; and

* represents a site of bonding to the naphthyl group in general formula (1) or (2).

[2] The actinic-ray- or radiation-sensitive resin composition according to item [1], wherein $R_{4A}$ in general formula (1), or $R_{4B}$ in general formula (2), is any of groups of general formula (3a) or (3b) below,

*—O—R (3a)

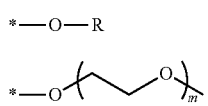
(3b)

in general formula (3a),

R represents a linear or branched-chain fluoroalkyl group having 1 to 4 carbon atoms in which at least one fluorine atom is introduced; and

* represents a site of bonding to the naphthyl group in general formula (1) or (2), and in general formula (3b), m is an integer of 1 to 4; and

* represents a site of bonding to the naphthyl group in general formula (1) or (2).

[3] The actinic-ray- or radiation-sensitive resin composition according to item [1], wherein the resin (B) contains at least any of structures of general formula (OR-1) below as the group that is configured to decompose when acted on by an acid to thereby produce an alcoholic hydroxyl group,

(OR-1)

in which each of $Rx_1$s independently represents a hydrogen atom or a monovalent organic group, provided that two $Rx_1$s may be bonded to each other to thereby form a ring;

$Rx_2$ represents a monovalent organic group, provided that one of $Rx_1$s and $Rx_2$ may be bonded to each other to thereby form a ring; and

* represents a site of bonding to residue of repeating unit (b).

[4] The actinic-ray- or radiation-sensitive resin composition according to item [1], further comprising any of nitrogen-containing compounds (C) of general formula (5) below,

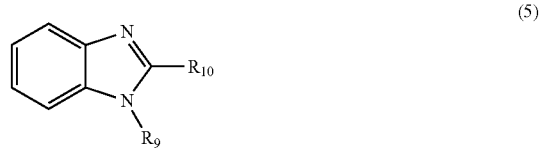
(5)

in which $R_9$ represents a hydrogen atom or an organic group that is configured to decompose when acted on by an acid, and $R_{10}$ represents a hydrogen atom, an alkyl group or an aryl group.

[5] The actinic-ray- or radiation-sensitive resin composition according to item [1], further comprising (D) any of compounds of general formula (6a) or (6b) below, or any of salts of the compounds,

(6a)

(6b)

in general formula (6a), Ra represents an organic group, provided that one in which a carbon atom directly bonded to the carboxylic acid group in the formula is substituted with a fluorine atom is excluded, and in general formula (6b), Rb represents an organic group, provided that one in which a carbon atom directly bonded to the sulfonic acid group in the formula is substituted with a fluorine atom is excluded.

[6] The actinic-ray- or radiation-sensitive resin composition according to item [1], further comprising a hydrophobic resin (HR) containing a fluorine atom or a silicon atom.

[7] The actinic-ray- or radiation-sensitive resin composition according to item [6], wherein the hydrophobic resin (HR) contains a repeating unit containing a basic group or a group whose basicity is increased when acted on by an acid.

[8] The actinic-ray- or radiation-sensitive resin composition according to item [1], further comprising a solvent containing a compound (G) expressed by formula (7) below, in which the compound (G) is contained in an amount of 10% or less based on the whole mass of the solvent.

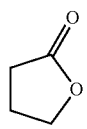
(7)

[9] An actinic-ray- or radiation-sensitive film formed from the actinic-ray- or radiation-sensitive resin composition of item [1].

[10] A method of forming a pattern, comprising forming the actinic-ray- or radiation-sensitive resin composition of item [1] into an actinic-ray- or radiation-sensitive film, exposing the actinic-ray- or radiation-sensitive film to actinic rays or radiation, and developing the exposed actinic-ray- or radiation-sensitive film.

[11] The pattern forming method according to item [10], wherein the development is performed with a developer comprising an organic solvent.

[12] A process for manufacturing an electronic device, comprising the pattern forming method according to item [10].

[13] An electronic device manufactured by the electronic device manufacturing process according to item [12].

The present invention makes it feasible to provide an actinic-ray- or radiation-sensitive resin composition excelling in performances associated with dependence on time delay after PEB, dependence on PEB temperature and focus latitude (DOF). Further, the present invention makes it feasible to provide a relevant actinic-ray- or radiation-sensitive film, pattern forming method, process for manufacturing an electronic device and electronic device.

DESCRIPTION OF THE INVENTION

Embodiments of the present invention will be described in detail below.

Herein, the term "group (atomic group)" for which no statement is made as to substitution or nonsubstitution is to be interpreted as including not only one containing no substituent but also one containing a substituent. For example, the term "alkyl group" is to be interpreted as including not only an alkyl group containing no substituent (unsubstituted alkyl group) but also an alkyl group containing a substituent (substituted alkyl group).

Herein, the term "actinic rays or radiation" means, for example, brightline spectra from a mercury lamp, far ultraviolet represented by an excimer laser, extreme ultraviolet (EUV), X-rays, soft X-rays, electron beams (EB) or the like. In the present invention, the term "light" means actinic rays or radiation.

Moreover, herein, the term "exposure to light" unless otherwise specified means not only irradiation with light, such as a mercury lamp, far ultraviolet represented by an excimer laser, X-rays or EUV light, but also lithography using particle beams, such as electron beams and ion beams.

<Actinic-ray- or Radiation-sensitive Resin Composition>

The actinic-ray- or radiation-sensitive resin composition of the present invention (hereinafter also referred to as "composition of the present invention") comprises a compound (hereinafter also referred to as "compound (A)") that is configured to produce an acid when exposed to actinic rays or radiation, the compound expressed by general formula (1) or (2) to be shown below, and a resin (hereinafter also referred to as "resin (B)") containing a repeating unit (b) containing a group that is configured to decompose when acted on by an acid to thereby produce an alcoholic hydroxyl group.

The composition of the present invention in its one form may further comprise at least one of a hydrophobic resin, a basic compound, a solvent and other additives.

Each of these components will be described below.

[1] Compound (A) that is Configured to Produce an Acid when Exposed to Actinic Rays or Radiation The composition of the present invention comprises (A) a compound (hereinafter also referred to as "compound (A)," "acid generator (A)" or the like) that is configured to produce an acid when exposed to actinic rays or radiation, the compound expressed by general formula (1) or (2) below. Compound (A) having a naphthyl skeleton not only exhibits a high thermal stability but also is high in the capability of inhibiting any diffusion of acid after decomposition. Hence, especially with respect to the actinic-ray- or radiation-sensitive resin composition in which the compound is used in combination with resin (B) containing a group (acid-decomposable hydroxyl protective group) that is configured to decompose when acted on by an acid to thereby produce an alcoholic hydroxyl group, the compound is effective in enhancing the performances associated with dependence on PEB temperature, dependence on time delay after PEB and focus latitude (DOF). The reason therefor is presumed to be that although the acid-decomposable hydroxyl protective group not only exhibits high reactivity to acids but also tends to lower film Tg, so that, for example, deprotection attributed to PEB temperature, time delay after PEB or focus change is likely to occur to thereby tend to invite CD changes, the deprotection of acid-decomposable hydroxyl protective group attributed to PEB temperature, time delay after PEB or focus change can be inhibited by compound (A)'s capability of inhibiting any diffusion of acid after decomposition to thereby suppress CD changes.

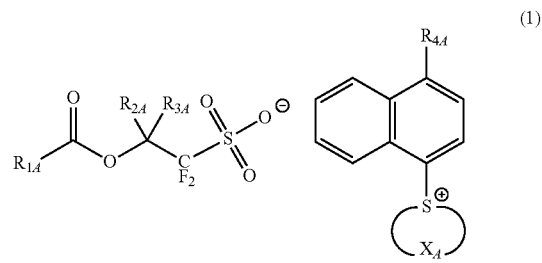
(1)

-continued

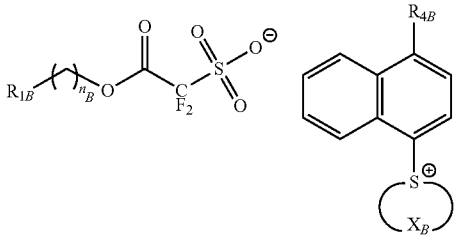

(2)

In general formula (1), $R_{1A}$ represents a linear, branched-chain or cyclic organic group.

Each of $R_{2A}$ and $R_{3A}$ independently represents a hydrogen atom, a methyl group or $CF_3$.

$R_{4A}$ represents a hydrogen atom, a hydroxyl group, a linear or branched-chain alkyl group, a cycloalkyl group, a linear, branched-chain or cyclic alkyloxy group or any of groups of general formula (1a) below, provided that a fluorine atom may be introduced in each of the alkyl group and the alkyloxy group.

$X_A$ represents an alkylene chain in which a heteroatom may be introduced, the alkylene chain constructing a ring in cooperation with the S atom in the formula.

In general formula (2), $R_{1B}$ represents a linear, branched-chain or cyclic organic group.

$R_{4B}$ represents a hydrogen atom, a hydroxyl group, a linear or branched-chain alkyl group, a cycloalkyl group, a linear, branched-chain or cyclic alkyloxy group or any of groups of general formula (1a) below, provided that a fluorine atom may be introduced in each of the alkyl group and the alkyloxy group.

$X_B$ represents an alkylene chain in which a heteroatom may be introduced, the alkylene chain constructing a ring in cooperation with the S atom in the formula; and $n_B$ is 0 or 1,

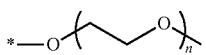

(1a)

In general formula (1a), n is an integer of 1 or greater; and

* represents a site of bonding to the naphthyl group in general formula (1) or (2).

General formulae (1) and (2) will be described in greater detail below.

The linear, branched-chain or cyclic organic groups represented by $R_{1A}$ and $R_{1B}$ are, for example, groups each having 1 to 30 carbon atoms, in which a heteroatom may be introduced. Further, a polar group, such as a hydroxyl group, a carbonyl group or a carboxyl group, may be introduced in each of the organic groups.

In an aspect of the present invention, $R_{1A}$ and $R_{1B}$ are each, for example, a linear or branched alkyl group having 1 to 6 carbon atoms, or a group with a cyclic structure having 3 to 8 carbon atoms. A group with a cyclic structure is preferred. As the cyclic structure, there can be mentioned an alicyclic group, an aryl group, any of heterocyclic groups (including not only those exhibiting aromaticity but also those not exhibiting aromaticity, and including, for example, a lactone ring structure, a sultone ring structure, a cyclic amide structure, a cyclic sulfoamide structure, a cyclic ketone structure, a cyclic carbonate structure and the like) or the like.

The alicyclic group may be monocyclic or polycyclic. As the alicyclic group, there can be mentioned, for example, a monocycloalkyl group, such as a cyclopentyl group, a cyclohexyl group or a cyclooctyl group, or a polycycloalkyl group, such as a norbornyl group, a tricyclodecanyl group, a tetracyclodecanyl group, a tetracyclododecanyl group or an adamantyl group. Among the mentioned groups, alicyclic groups each with a bulky structure having at least 7 carbon atoms, such as a norbornyl group, a tricyclodecanyl group, a tetracyclodecanyl group, a tetracyclododecanyl group and an adamantyl group, are preferred.

The aryl group preferably has 6 to 20 carbon atoms. As the aryl group, there can be mentioned, for example, a phenyl group, a naphthyl group, a phenanthryl group, an anthryl group or the like.

The aryl group may be substituted with at least one fluorine atom. As the aryl group substituted with at least one fluorine atom, there can be mentioned a perfluorophenyl group or the like.

As the lactone structure, there can be mentioned, for example, any of the lactone structures to be described hereinafter as being introducible in repeating unit (c). In particular, there can be mentioned any of the lactone structures of general formulae (LC1-1) to (LC1-17) to be shown hereinafter.

As the sultone structure, there can be mentioned, for example, any of the sultone structures of general formulae (SL1-1) to (SL1-3) below. $Rb_2$ and $n_2$ appearing in the formulae have the same meanings as those in general formulae (LC1-1) to (LC1-17) to be shown hereinafter.

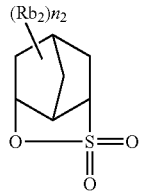

SL1-1

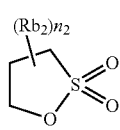

SL1-2

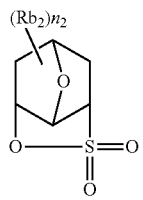

SL1-3

The cyclic amide structure is preferably, for example, any of 5- to 7-membered ring cyclic amide structures of the formula below. Each of the 5- to 7-membered ring amide structures may be condensed with another cyclic structure.

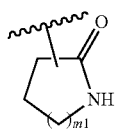

m1: an integer of 1 to 3

The cyclic sulfoamide structure is preferably, for example, any of 5- to 7-membered ring cyclic sulfoamide structures of the formula below. Each of the 5- to 7-membered ring sulfoamide structures may be condensed with another cyclic structure.

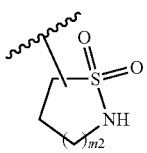

m2: an integer of 1 to 3

The cyclic ketone structure is preferably, for example, any of 5- to 7-membered ring cyclic ketone structures of the formula below. Each of the 5- to 7-membered ring ketone structures may be condensed with another cyclic structure.

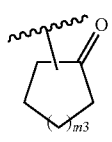

m3: an integer of 1 to 3

The cyclic carbonate structure is preferably a 5- to 7-membered cyclic carbonate structure. As such, there can be mentioned 1,3-dioxoran-2-one, 1,3-dioxan-2-one or the like.

In an aspect of the present invention, it is preferred for $R_{1A}$ and $R_{1B}$ to be expressed by general formula (2a) or (2b) below.

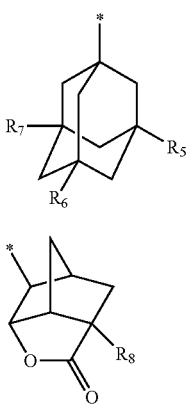

In general formula (2a), each of $R_5$, $R_6$ and $R_7$ independently represents a hydrogen atom, a hydroxyl group, or a linear or branched-chain alkyl group.

The linear or branched-chain alkyl group represented by each of $R_5$, $R_6$ and $R_7$ preferably has, for example, 1 to 3 carbon atoms.

In an aspect of the present invention, it is especially preferred for at least any one of $R_5$, $R_6$ and $R_7$ to be a hydroxyl group.

In general formula (2b), $R_8$ represents a hydrogen atom, CN, or a linear or branched-chain alkyl group.

The linear or branched-chain alkyl group represented by $R_8$ preferably has, for example, 1 to 3 carbon atoms. In an aspect of the present invention, it is especially preferred for $R_8$ to be H.

Nonlimiting examples of the organic groups represented by $R_{1A}$ and $R_{1B}$ are shown below.

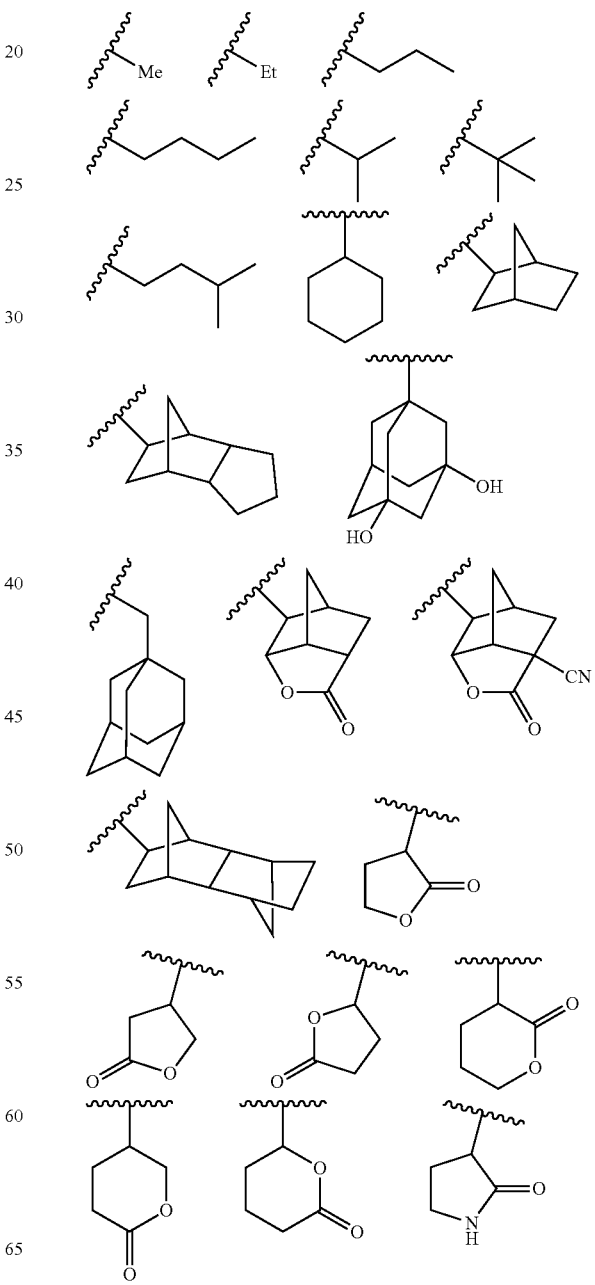

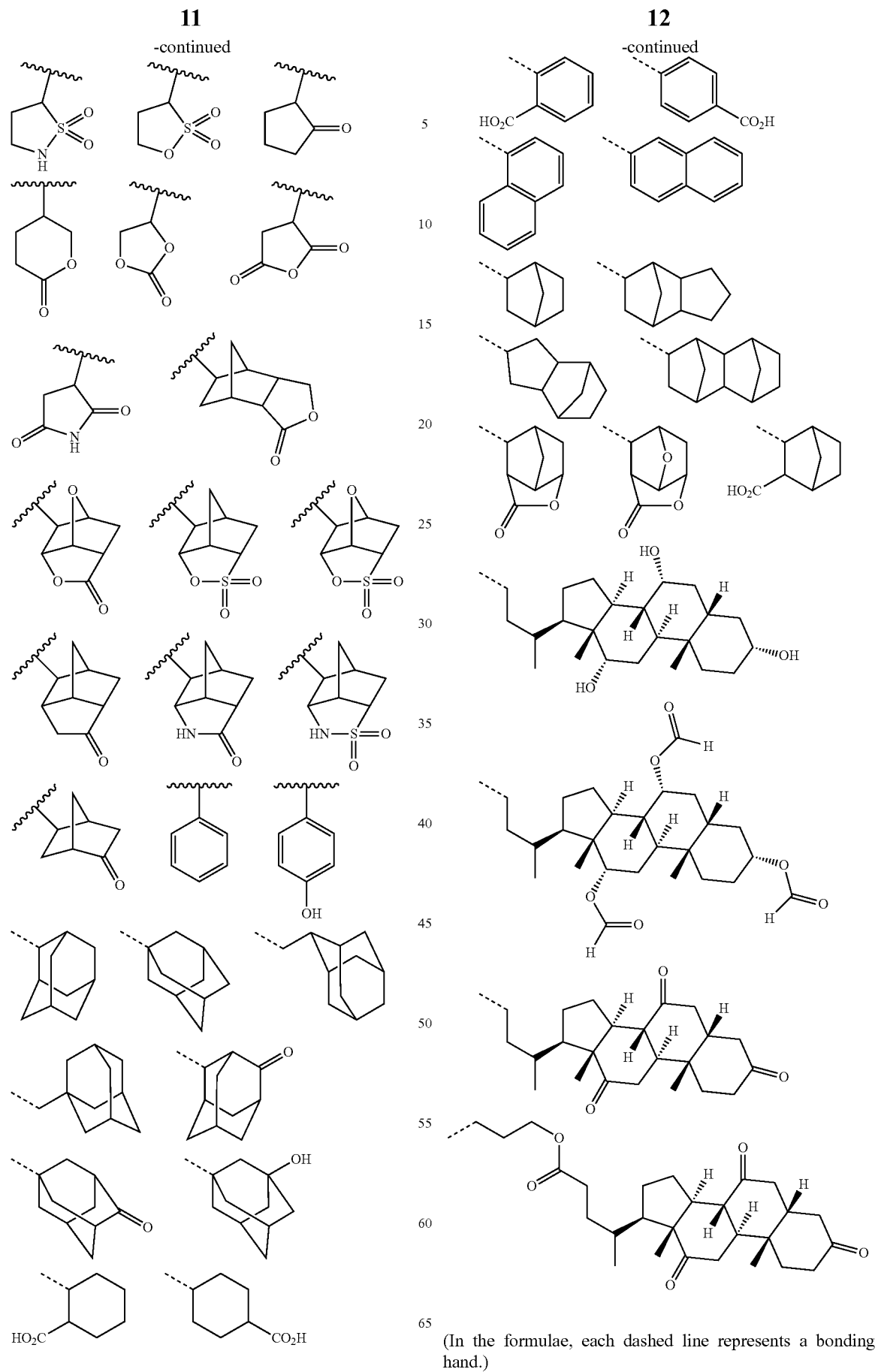
(In the formulae, each dashed line represents a bonding hand.)

As mentioned above, each of $R_{2A}$ and $R_{3A}$ independently represents a hydrogen atom, a methyl group or $CF_3$. In an aspect of the present invention, it is preferred for each of $R_{2A}$ and $R_{3A}$ to be $CF_3$.

As mentioned above, each of $R_{4A}$ and $R_{4B}$ represents a hydrogen atom, a hydroxyl group, a linear or branched-chain alkyl group, a cycloalkyl group, a linear, branched-chain or cyclic alkyloxy group or any of groups of general formula (1a).

The linear or branched-chain alkyl group represented by each of $R_{4A}$ and $R_{4B}$ is preferably, for example, an alkyl group having 1 to 4 carbon atoms. The linear or branched-chain alkyl group may be substituted with a fluorine atom. A preferred alkyl group is, for example, an n-butyl group.

The cycloalkyl group represented by each of $R_{4A}$ and $R_{4B}$ is preferably, for example, a cycloalkyl group having 5 or 6 carbon atoms. As such, there can be mentioned a cyclohexyl group or the like.

The linear, branched or cyclic alkyloxy group represented by each of $R_{4A}$ and $R_{4B}$ is preferably, for example, an alkyloxy group having 1 to 4 carbon atoms. The linear, branched-chain or cyclic alkyloxy group may be substituted with a fluorine atom.

In an aspect of the present invention, it is preferred for the alkyloxy group to be expressed by general formula (3a) below.

(3a)

In the formula, R represents a linear or branched-chain fluoroalkyl group having 1 to 4 carbon atoms in which at least one fluorine atom is introduced; and * represents a site of bonding to the naphthyl group in general formula (1) or (2).

The groups of general formula (1a) represented by each of $R_{4A}$ and $R_{4B}$ are preferably expressed by general formula (3b) below.

(3b)

In the formula, m is an integer of 1 to 4; and * represents a site of bonding to the naphthyl group in general formula (1) or (2).

Preferably, m is 1 or 2.

In an aspect of the present invention, it is preferred for $R_{4A}$ and $R_{4B}$ to be the groups of general formula (3a) or (3b).

Nonlimiting examples of the groups represented by $R_{4A}$ and $R_{4B}$ are shown below.

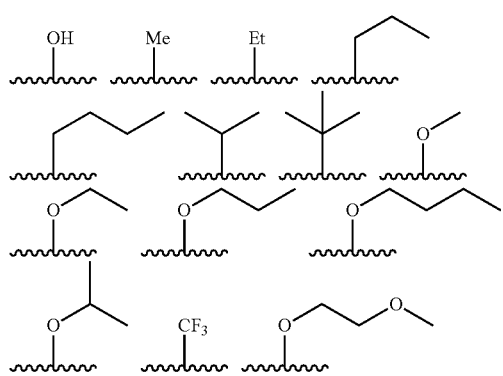

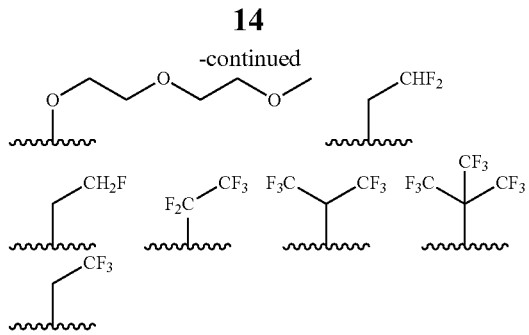

As mentioned above, each of $X_A$ and $X_B$ represents an alkylene chain in which a heteroatom may be introduced, the alkylene chain constructing a ring in cooperation with the S atom in the formula. The introducible heteroatom is, for example, O.

A substituent may be introduced in the ring structure constructed in cooperation with the S atom in the formula. As substituents, there can be mentioned, for example, a hydroxyl group, a carboxyl group, a cyano group, a nitro group, an alkyl group, a cycloalkyl group, an alkoxy group, an alkoxyalkyl group, an alkoxycarbonyl group, an alkoxycarbonyloxy group and the like. A plurality of substituents may be introduced in the ring structure. The substituents may be bonded to each other to thereby form a ring (e.g., an aromatic or nonaromatic hydrocarbon ring, an aromatic or nonaromatic heterocycle, or a polycyclic condensed ring resulting from a combination of two or more of these rings).

In an aspect of the present invention, a structure in which the alkylene chain (in which a heteroatom may be introduced) represented by $X_A$ or $X_B$ constructs a 5- or 6-membered ring in cooperation with the S atom in the formula is preferred. A structure in which a 5-membered ring (namely, a tetrahydrothiophene ring) is constructed is more preferred.

Preferred examples of the ring structures are shown below.

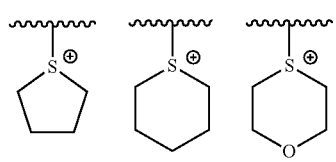 [SMILES: *[S+]1CCCC1 ; *[S+]1CCCCC1 ; *[S+]1CCOCC1]

Compounds (A) of general formula (1) can be synthesized by the method according to, for example, the synthesizing method described in Examples in JP-A-2012-106986. Compounds (A) of general formula (2) can be synthesized by the method according to, for example, the synthesizing method described in Examples in JP-A-2007-161707.

Nonlimiting particular examples of compounds (A) are shown below.

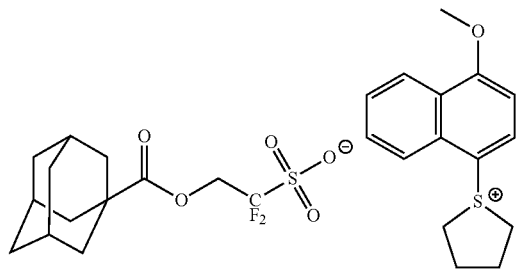

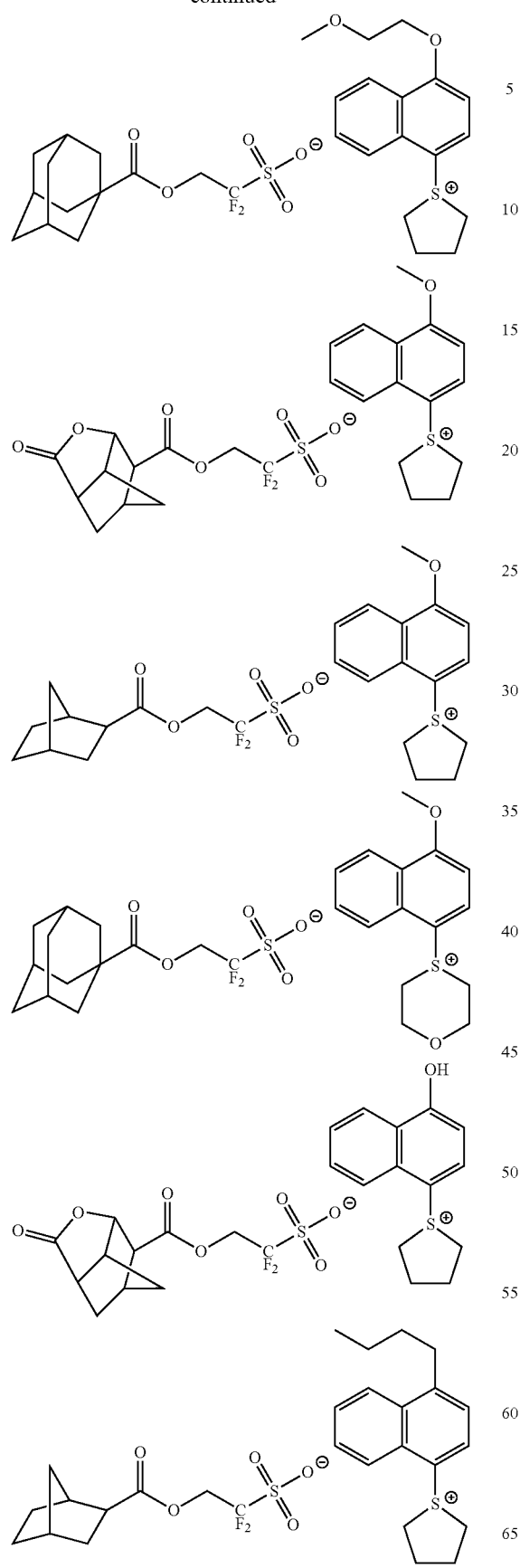
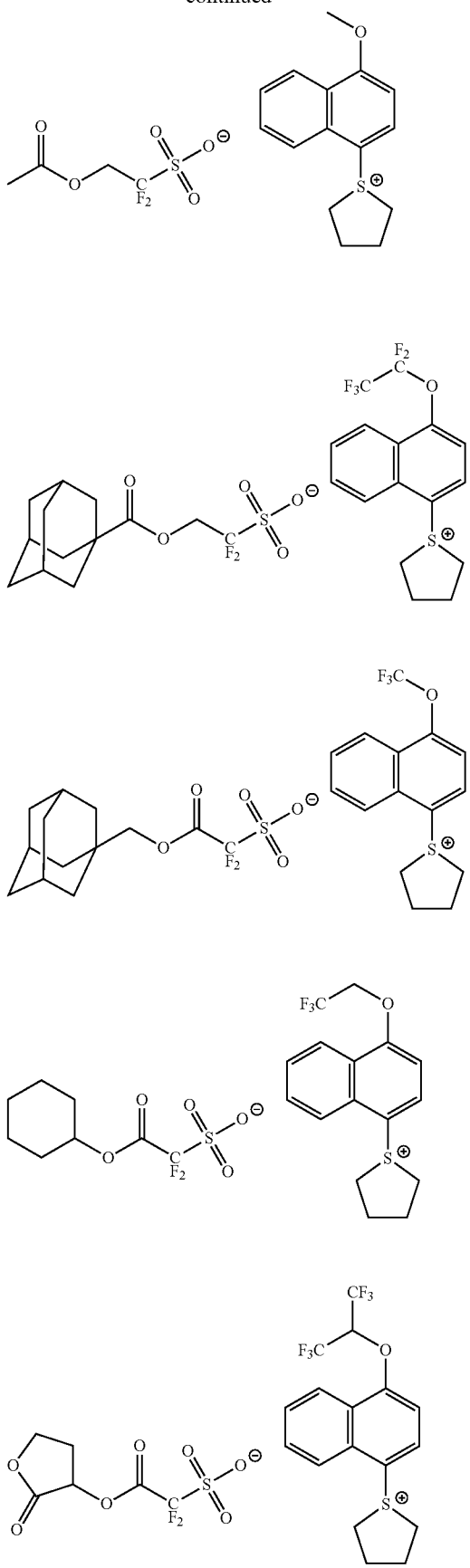

-continued

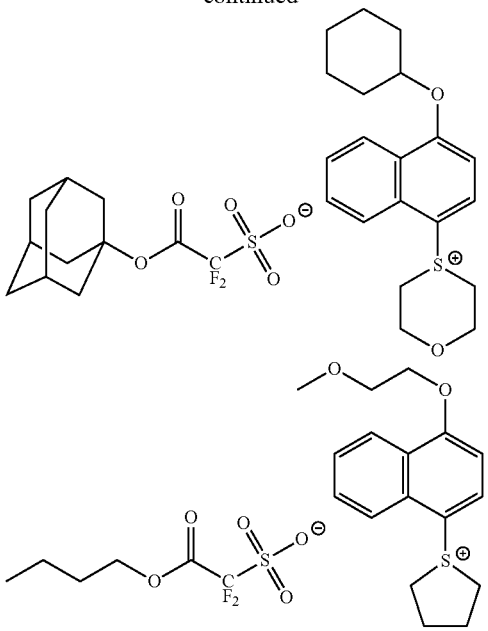

In the composition of the present invention, one of compounds (A) of general formula (1) or (2) above may be used alone, or two or more thereof may be used in combination. The content of compound (A) in the composition of the present invention, based on the total solids of the composition, is preferably in the range of 1 to 30 mass %, more preferably 5 to 25 mass % and further more preferably 10 to 20 mass %.

In the present invention, as acid generators, a compound other than the above-mentioned compounds (A) may be used in combination with compound (A). Acid generators that can be used in combination with compound (A) are not particularly limited. For example, there can be mentioned compounds described in sections 0261 to 0265 of JP-A-2012-208431, and the like.

[2] Resin (B)

The composition of the present invention comprises a resin (hereinafter also referred to as "resin (B)," "acid-decomposable resin (B)" or the like) containing a repeating unit (b) containing a group that is configured to decompose when acted on by an acid to thereby produce an alcoholic hydroxyl group.

Herein, the alcoholic hydroxyl group refers to a hydroxyl group bonded to a hydrocarbon group, which is other than the hydroxyl group (phenolic hydroxyl group) directly bonded to an aromatic ring. Any aliphatic alcohol group substituted at its α-position with an electron withdrawing group, such as a fluorine atom, as an acid group (for example, a fluorinated alcohol group (a hexafluoroisopropanol group, etc.)) is not included in the category of the alcoholic hydroxyl group.

The pKa value of the alcoholic hydroxyl group produced by the decomposition of the above acid-decomposable group capable of producing an alcoholic hydroxyl group under the action of an acid is, for example, 12 or greater, typically in the range of 12 to 20. When the pKa value is extremely small, the stability of the composition containing the acid-decomposable resin tends to decrease and the change over time of the resist performance tends to be large. Herein, the term "pKa" means the value calculated using "ACD/pKa DB" compiled by Fujitsu Limited under noncustomized initial setting.

In an aspect of the present invention, it is preferred for resin (B) to contain at least any of structures of general formulae (OR-1) to (OR-9) below as a group that is configured to decompose when acted on by an acid to thereby produce an alcoholic hydroxyl group. Of these, the groups of general formulae (OR-1) to (OR-4) are each a group that is configured to decompose when acted on by an acid to thereby produce one alcoholic hydroxyl group. The groups of general formulae (OR-5) to (OR-9) are each a group that is configured to decompose when acted on by an acid to thereby produce two or three alcoholic hydroxyl groups.

In general formula (OR-1) above, each of $Rx_1$s independently represents a hydrogen atom or a monovalent organic group, provided that $Rx_1$s may be bonded to each other to thereby form a ring.

$Rx_2$ represents a monovalent organic group, provided that $Rx_1$ and $Rx_2$ may be bonded to each other to thereby form a ring.

At least one of the carbon atoms (carbon atoms contributing to ring formation) constructing the ring formed by the mutual bonding of $Rx_1$s or the ring formed by the mutual bonding of $Rx_1$ and $Rx_2$ may be replaced with an oxygen atom or a sulfinyl group.

In general formula (OR-2) above, each of $Rx_3$s independently represents a monovalent organic group, provided that $Rx_3$s may be bonded to each other to thereby form a ring.

In general formula (OR-3) above, $Rx_4$ represents a hydrogen atom or a monovalent organic group.

Each of $Rx_5$s independently represents a monovalent organic group, provided that $Rx_5$s may be bonded to each other to thereby form a ring. $Rx_4$ and $Rx_5$ may be bonded to each other to thereby form a ring.

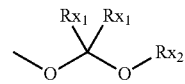 (OR-1)

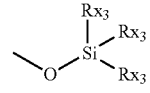 (OR-2)

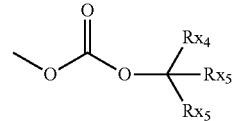 (OR-3)

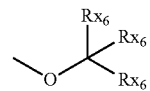 (OR-4)

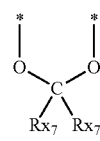 (OR-5)

(OR-6)

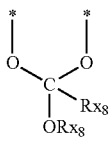

(OR-7)

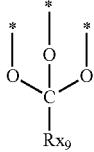

(OR-8)

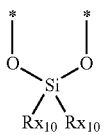

(OR-9)

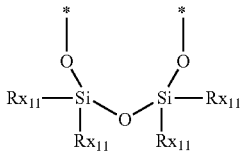

In general formula (OR-4) above, each of $Rx_6$s independently represents a hydrogen atom, an alkyl group, a cycloalkyl group, an aryl group, an alkenyl group or an alkynyl group, provided that two $Rx_6$s may be bonded to each other to thereby form a ring, and provided that when one or two of three $Rx_6$s are hydrogen atoms, the remaining at least one $Rx_6$ is an aryl group, an alkenyl group or an alkynyl group.

(OR-5)

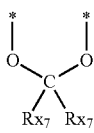

(OR-6)

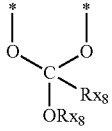

(OR-7)

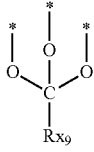

(OR-8)

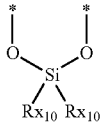

(OR-9)

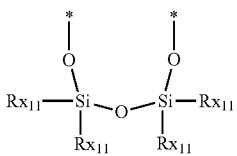

In general formula (OR-5) above,
each of $Rx_7$s independently represents a hydrogen atom or a monovalent organic group, provided that $Rx_7$s may be bonded to each other to thereby form a ring.

In general formula (OR-6) above,
each of $Rx_8$s independently represents a hydrogen atom or a monovalent organic group, provided that $Rx_8$s may be bonded to each other to thereby form a ring.

In general formula (OR-7) above,
$Rx_9$ represents a monovalent organic group.

In general formula (OR-8) above,
each of $Rx_{10}$s independently represents a monovalent organic group, provided that $Rx_{10}$s may be bonded to each other to thereby form a ring.

In general formula (OR-9) above,
each of $Rx_{11}$s independently represents a monovalent organic group, provided that $Rx_{11}$s may be bonded to each other to thereby form a ring.

In general formulae (OR-5) to (OR-9) above, * represents the bonding hand to the principal chain or a side chain of the resin.

The group that is configured to decompose when acted on by an acid to thereby produce an alcoholic hydroxyl group is preferably expressed by at least one selected from among general formulae (OR-1) to (OR-3). More preferably, the group is expressed by general formula (OR-1) or (OR-3). Most preferably, the group is expressed by general formula (OR-1). The reason for the preference of (OR-1) structure is that not only is the thermal stability of acid-unstable group high but also the film Tg is high for a resin containing an alcoholic hydroxyl protective group.

As mentioned above, each of $Rx_1$ and $Rx_4$ independently represents a hydrogen atom or a monovalent organic group. Each of $Rx_1$ and $Rx_4$ is preferably a hydrogen atom, an alkyl group or a cycloalkyl group, more preferably a hydrogen atom or an alkyl group.

The alkyl group represented by each of $Rx_1$ and $Rx_4$ may be in the form of a linear or branched chain. The alkyl group represented by each of $Rx_1$ and $Rx_4$ preferably has 1 to 10 carbon atoms, more preferably 1 to 3 carbon atoms.

The cycloalkyl group represented by each of $Rx_1$ and $Rx_4$ may be monocyclic or polycyclic. The cycloalkyl group represented by each of $Rx_1$ and $Rx_4$ preferably has 3 to 10 carbon atoms, more preferably 4 to 8 carbon atoms.

In general formula (OR-1), it is preferred for at least one of $Rx_1$s to be a monovalent organic group. Especially high sensitivity can be attained by employing this structure.

Substituents may be introduced in $Rx_1$ and $Rx_4$. As the substituents, there can be mentioned, for example, an alkyl group (1 to 4 carbon atoms), a cycloalkyl group (3 to 8 carbon atoms), a halogen atom, a hydroxyl group, an alkoxy group (1 to 4 carbon atoms), a carboxyl group, an alkoxycarbonyl group (2 to 6 carbon atoms), an aryl group (6 to 10 carbon atoms) and the like. The number of carbon atoms of each of these substituents is preferably up to 8.

As mentioned above, each of $Rx_2$ and $Rx_5$ represents a monovalent organic group. Each of $Rx_2$ and $Rx_5$ is preferably an alkyl group or a cycloalkyl group, more preferably an alkyl group. Substituents may be introduced in these alkyl group and cycloalkyl group. As such substituents, there can be mentioned, for example, those described above as being introducible in $Rx_1$ and $Rx_4$.

Preferably, the alkyl group represented by each of $Rx_2$ and $Rx_5$ is unsubstituted or contains at least one aryl group and/or at least one silyl group as a substituent. The unsubstituted alkyl group preferably has 1 to 20 carbon atoms. The alkyl group moiety in the alkyl group substituted with at least one aryl group preferably has 1 to 25 carbon atoms.

As particular examples of the alkyl groups represented by $Rx_2$ and $Rx_5$, there can be mentioned, for example, those described above in connection with the alkyl groups represented by $Rx_1$ and $Rx_4$. The aryl group in the alkyl group substituted with at least one aryl group preferably has 6 to 10 carbon atoms. As particular examples thereof, there can be mentioned a phenyl group and a naphthyl group.

The alkyl group moiety in the alkyl group substituted with at least one silyl group preferably has 1 to 30 carbon atoms. When no substituent is introduced in the cycloalkyl group represented by each of $Rx_2$ and $Rx_5$, the cycloalkyl group preferably has 3 to 20 carbon atoms.

As particular examples of the cycloalkyl groups represented by $Rx_2$ and $Rx_5$, there can be mentioned, for example, those described above in connection with the cycloalkyl groups represented by $Rx_1$ and $Rx_4$.

Each of $Rx_3$s independently is preferably an alkyl group, a cycloalkyl group or an aryl group. An alkyl group and a cycloalkyl group are more preferred, and an alkyl group is further more preferred.

As particular examples and preferred examples of the alkyl groups and cycloalkyl groups represented by $Rx_3$, there can be mentioned those described above in connection with the alkyl groups and cycloalkyl groups represented by $Rx_1$ and $Rx_4$.

As the aryl group represented by $Rx_3$, there can be mentioned, for example, an aryl group having 6 to 10 carbon atoms, such as a phenyl group or a naphthyl group.

Substituents may be introduced in these alkyl group, cycloalkyl group and aryl group. As such substituents, there can be mentioned, for example, those described above as being introducible in $Rx_1$ and $Rx_4$.

$Rx_6$ represents a hydrogen atom, an alkyl group, a cycloalkyl group, an aryl group, an alkenyl group or an alkynyl group, provided that when one or two of three $Rx_6$s are hydrogen atoms, the remaining at least one $Rx_6$ is an aryl group, an alkenyl group or an alkynyl group. It is preferred for $Rx_6$ to be a hydrogen atom or an alkyl group. Substituents may be introduced in the alkyl group, cycloalkyl group, aryl group, alkenyl group and alkynyl group represented by $Rx_6$. As such substituents, there can be mentioned those described above as being introducible in $Rx_1$ and $Rx_4$.

As the alkyl groups and cycloalkyl groups represented by $Rx_6$, there can be mentioned, for example, those described above in connection with the alkyl groups and cycloalkyl groups represented by $Rx_1$ and $Rx_4$. In particular, when no substituent is introduced in the alkyl group, the alkyl group preferably has 1 to 6 carbon atoms, more preferably 1 to 3 carbon atoms.

As the aryl groups represented by $Rx_6$, there can be mentioned those described above in connection with the aryl groups represented by $Rx_3$.

As the alkenyl groups represented by $Rx_6$, there can be mentioned, for example, an alkenyl group having 2 to 5 carbon atoms, such as a vinyl group, a propenyl group or an allyl group.

As the alkynyl groups represented by $Rx_6$, there can be mentioned, for example, an alkynyl group having 2 to 5 carbon atoms, such as an ethynyl group, a propynyl group or a butynyl group.

As mentioned above, $Rx_7$ represents a hydrogen atom or a monovalent organic group. $Rx_7$ is preferably a hydrogen atom, an alkyl group or a cycloalkyl group; more preferably a hydrogen atom or an alkyl group; and further more preferably a hydrogen atom or an unsubstituted alkyl group. It is especially preferred for $Rx_7$ to be a hydrogen atom or an alkyl group having 1 to 10 carbon atoms. A hydrogen atom or an unsubstituted alkyl group having 1 to 10 carbon atoms is more preferred.

Substituents may be introduced in the alkyl groups and cycloalkyl groups represented by $Rx_7$. As such substituents, there can be mentioned those described above as being introducible in $Rx_1$ and $Rx_4$.

As particular examples of the alkyl groups and cycloalkyl groups represented by $Rx_7$, there can be mentioned, for example, those described above in connection with the alkyl groups and cycloalkyl groups represented by $Rx_1$ and $Rx_4$.

As mentioned above, each of $Rx_8$s independently represents a hydrogen atom or a monovalent organic group. Preferably, each of $Rx_8$s independently is a hydrogen atom, an alkyl group or a cycloalkyl group. A hydrogen atom and an alkyl group are more preferred.

As the alkyl groups and cycloalkyl groups represented by $Rx_8$, there can be mentioned, for example, those described above in connection with the alkyl groups and cycloalkyl groups represented by $Rx_1$ and $Rx_4$.

As mentioned above, each of $Rx_9$s, $Rx_{10}$s and $Rx_{11}$s independently represents a monovalent organic group. Preferably, each of $Rx_9$s, $Rx_{10}$s and $Rx_{11}$s independently is an alkyl group or a cycloalkyl group. An alkyl group is more preferred.

As the alkyl groups and cycloalkyl groups represented by $Rx_9$, $Rx_{10}$ and $Rx_{11}$, there can be mentioned, for example, those described above in connection with the alkyl groups and cycloalkyl groups represented by $Rx_1$ and $Rx_4$.

Particular examples of the groups that are configured to decompose when acted on by an acid to thereby produce an alcoholic hydroxyl group are shown below.

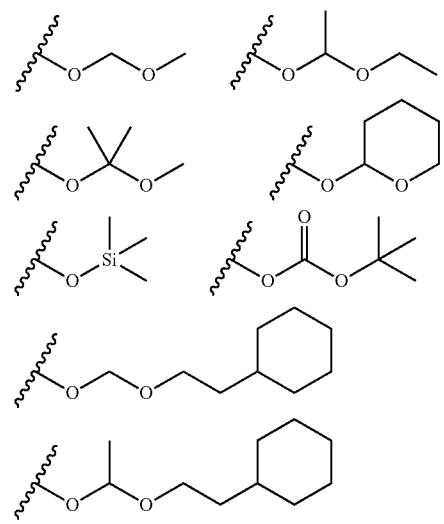

-continued
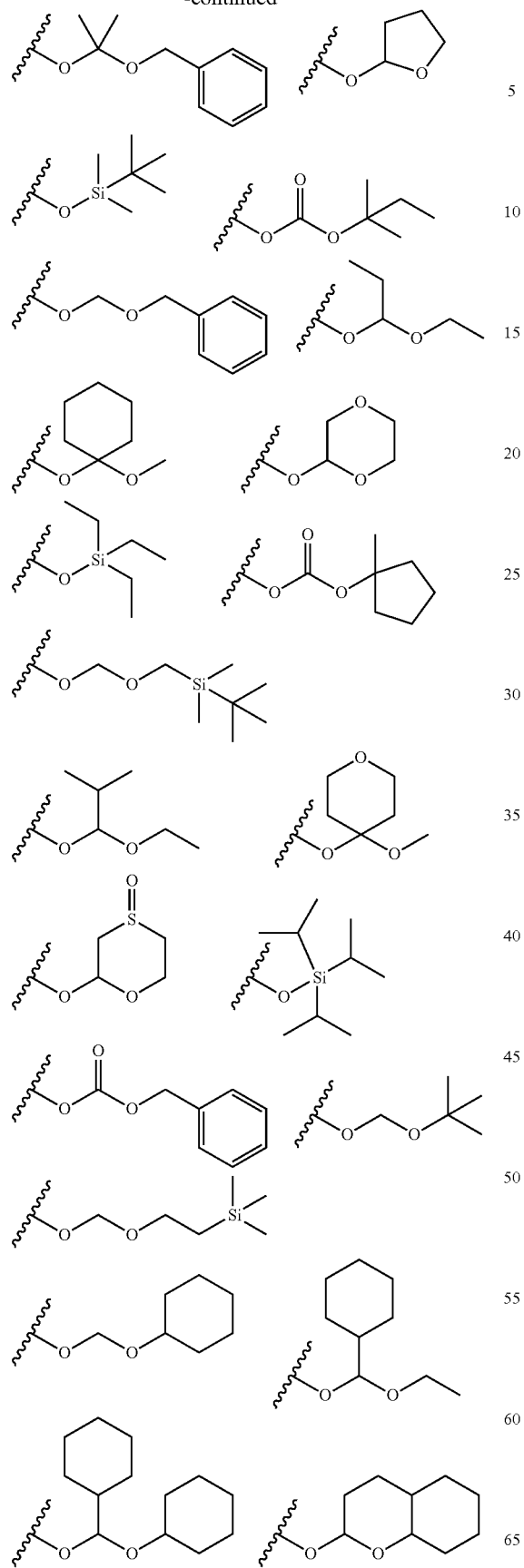
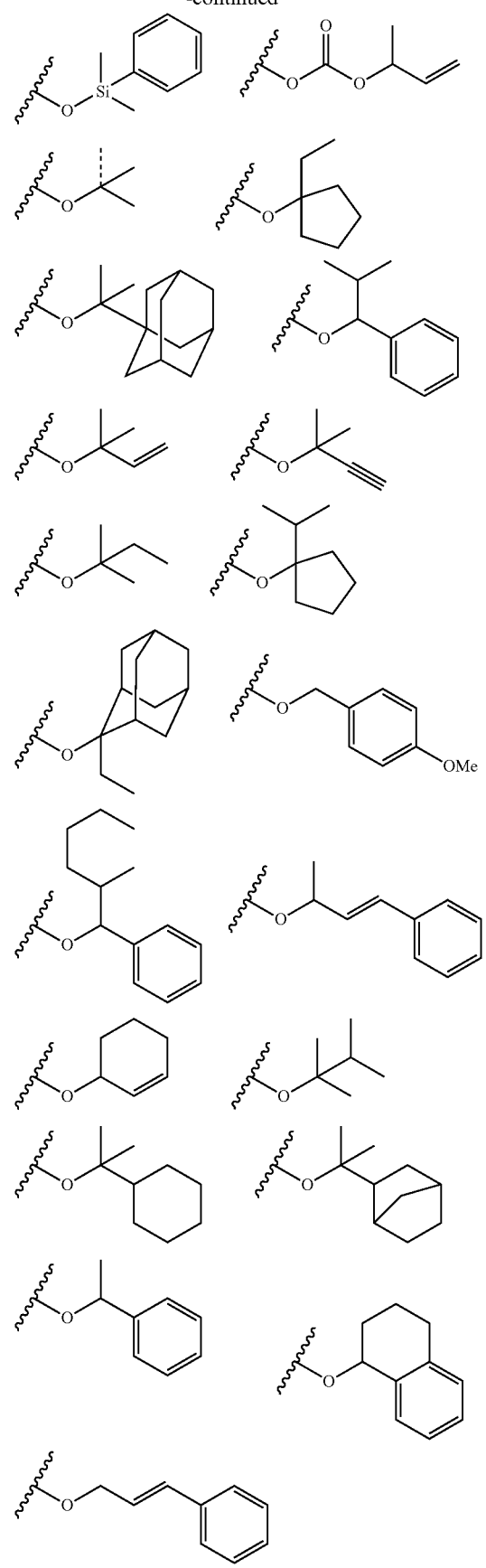

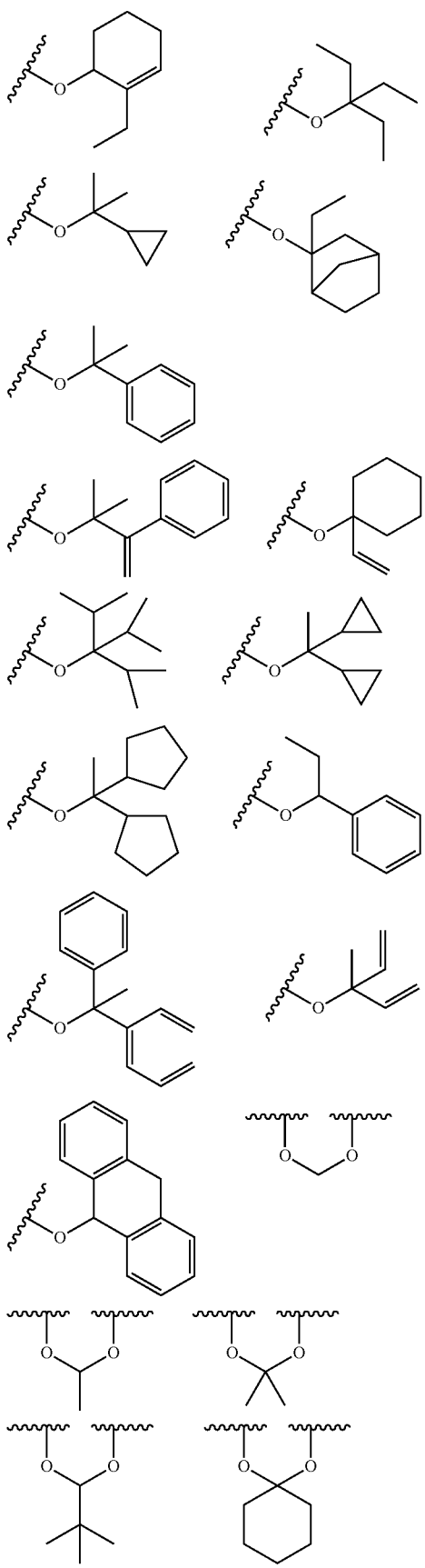
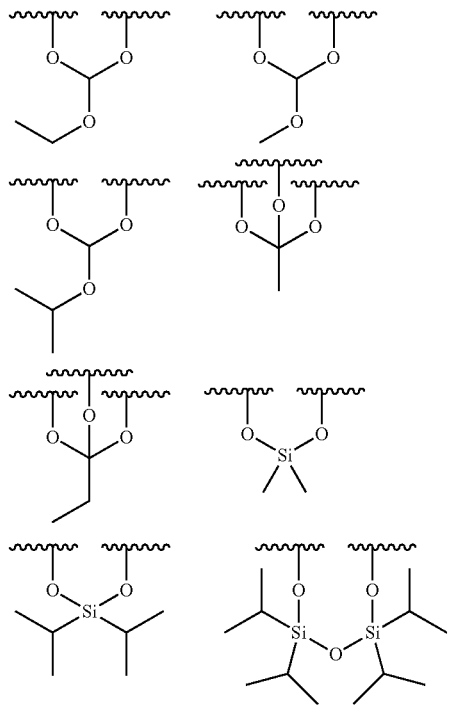

In an aspect of the present invention, it is preferred for repeating unit (b) to further contain a polyalicyclic hydrocarbon group. This repeating unit (b) is preferably expressed by at least one member selected from the group consisting of general formulae (b-1) to (b-8) below. More preferably, this repeating unit (b) is expressed by at least one member selected from the group consisting of general formulae (b-1) to (b-3) below. Further more preferably, this repeating unit (b) is preferably expressed by general formula (b-1) below.

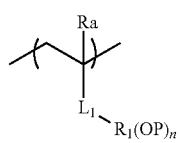

(b-1)

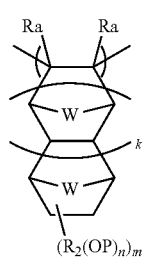

(b-2)

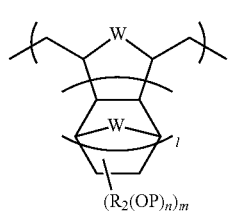

(b-3)

-continued

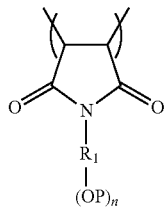
(b-4)

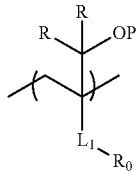
(b-5)

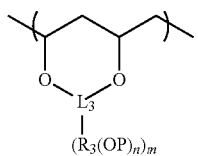
(b-6)

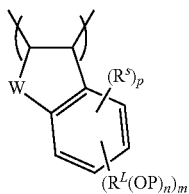
(b-7)

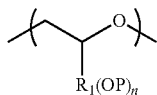
(b-8)

In these formulae,

Ra, or each of Ra's independently, represents a hydrogen atom, an alkyl group or any of groups of the formula —CH$_2$—O—Ra$_2$ in which Ra$_2$ represents a hydrogen atom, an alkyl group or an acyl group.

Each of R$_1$, R$_2$ and R$_3$ independently represents a single bond or a (n+1)-valent organic group. When there are a plurality of R$_2$s, the plurality of R$_2$s may be identical to or different from each other. When there are a plurality of R$_3$s, the plurality of R$_3$s may be identical to or different from each other.

OP, or each of OPs independently, represents the above acid-decomposable group that when acted on by an acid, is decomposed to thereby produce an alcoholic hydroxyl group. When n≥2 and/or m≥2, two or more OPs may be bonded to each other to thereby form a ring.

W represents a methylene group, an oxygen atom or a sulfur atom.

Each of n and m is an integer of 1 or greater. In general formula (b-2) or (b-3), when R$_2$ represents a single bond, n is 1. In general formula (b-6), when R$_3$ represents a single bond, n is 1.

Further, k is an integer of 0 or greater; and l is an integer of 1 or greater.

L$_1$ represents a connecting group of the formula —COO—, —OCO—, —CONH—, —O—, —Ar—, —SO$_3$— or —SO$_2$NH—, in which Ar represents a bivalent aromatic ring group.

Each of R's independently represents a hydrogen atom or an alkyl group.

R$_0$ represents a polyalicyclic hydrocarbon group.

L$_3$ represents a (m+2)-valent connecting group.

R$^L$ represents a (n+1)-valent polyalicyclic hydrocarbon group. When there are a plurality of R$^L$s, the plurality of R$^L$s may be identical to or different from each other.

R$^S$ represents a substituent. When there are a plurality of R$^S$s, the plurality of R$^S$s may be identical to or different from each other and may be bonded to each other to thereby form a ring; and p is an integer of 0 to 3.

As mentioned above, Ra represents a hydrogen atom, an alkyl group or any of groups of the formula —CH$_2$—O—Ra$_2$.

It is preferred for the alkyl group represented by Ra to have up to 6 carbon atoms. It is preferred for each of the alkyl group and acyl group represented by Ra$_2$ to have up to 5 carbon atoms. Substituents may be introduced in the alkyl group represented by Ra and the alkyl group and acyl group represented by Ra$_2$.

Ra is preferably a hydrogen atom, an alkyl group having 1 to 10 carbon atoms or an alkoxyalkyl group having 1 to 10 carbon atoms, more preferably a hydrogen atom or a methyl group.

W represents a methylene group, an oxygen atom or a sulfur atom. W is preferably a methylene group or an oxygen atom.

As mentioned above, each of R$_1$, R$_2$ and R$_3$ represents a single bond or a (n+1)-valent organic group.

In an aspect of the present invention, each of R$_1$, R$_2$ and R$_3$ is preferably a single bond or a nonaromatic hydrocarbon group. In particular, each of R$_1$, R$_2$ and R$_3$ may be a chain hydrocarbon group or an alicyclic hydrocarbon group.

When each of R$_1$, R$_2$ and R$_3$ is a chain hydrocarbon group, the chain hydrocarbon group may be in the form of a linear chain or a branched chain. The chain hydrocarbon group preferably has 1 to 8 carbon atoms. For example, when each of R$_1$, R$_2$ and R$_3$ is an alkylene group, it is preferred for each of R$_1$, R$_2$ and R$_3$ to be a methylene group, an ethylene group, an n-propylene group, an isopropylene group, an n-butylene group, an isobutylene group or a sec-butylene group.

When each of R$_1$, R$_2$ and R$_3$ is an alicyclic hydrocarbon group, the alicyclic hydrocarbon group may be monocyclic or polycyclic. The alicyclic hydrocarbon group has, for example, a monocyclo, bicyclo, tricyclo or tetracyclo structure. The alicyclic hydrocarbon group has generally 5 or more carbon atoms, preferably 6 to 30 carbon atoms and more preferably 7 to 25 carbon atoms.

As the alicyclic hydrocarbon groups represented by R$_1$, R$_2$ and R$_3$, there can be mentioned, for example, those having a series of partial structures shown below. As the (n+1)-valent polyalicyclic hydrocarbon groups represented by R$_1$ and R$_3$, there can be mentioned, for example, those having partial structures in which two or more rings are introduced among a series of partial structures shown below. A substituent may be introduced in each of these partial structures. In each of these partial structures, the methylene group (—CH$_2$—) may be replaced by an oxygen atom (—O—), a sulfur atom (—S—), a carbonyl group [—C(=O)—], a sulfonyl group [—S(=O)$_2$—], a sulfinyl group [—S(=O)—] or an imino group [—N(R)—] (R is a hydrogen atom or an alkyl group).

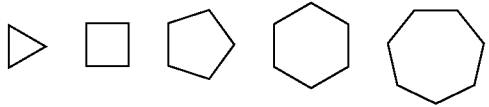

-continued
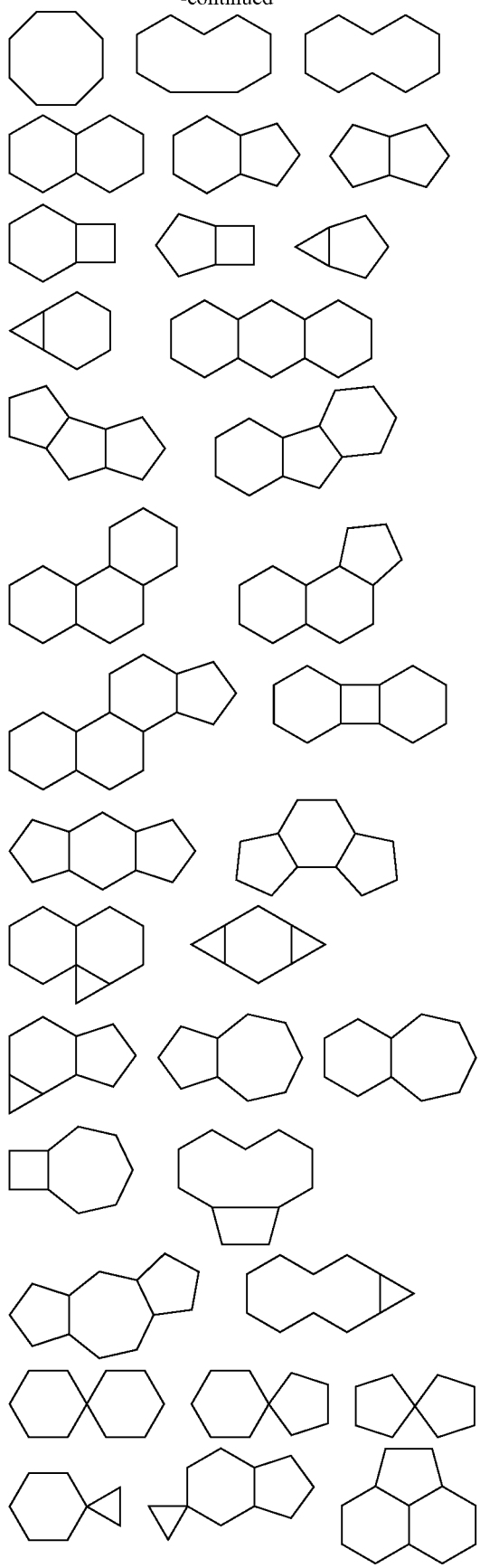
-continued
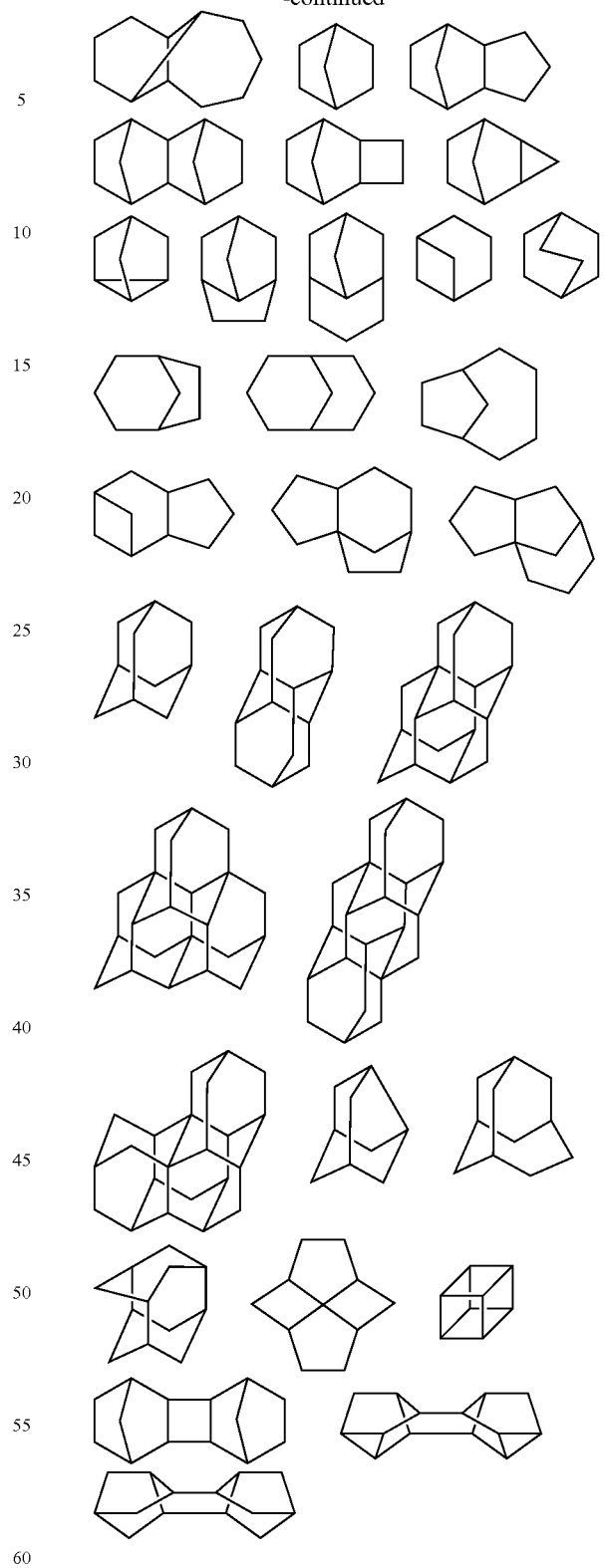
In another aspect of the present invention, it is preferred for each of $R_1$, $R_2$ and $R_3$ to be a (n+1)-valent polyalicyclic hydrocarbon group.
The (n+1)-valent polyalicyclic hydrocarbon group represented by each of $R_1$, $R_2$ and $R_3$ is preferably an adamantylene group, a noradamantylene group, a decahydronaphthylene group, a tricyclodecanylene group, a tetracyclododecanylene group or a norbornylene group; more preferably an adamantylene group, a norbornylene group, a tetracyclododecanylene group or a tricyclodecanylene group.

Substituents may be introduced in the (n+1)-valent polyalicyclic hydrocarbon group and nonaromatic hydrocarbon group represented by each of $R_1$, $R_2$ and $R_3$. As the substituents, there can be mentioned, for example, an alkyl group having 1 to 4 carbon atoms, a halogen atom, a hydroxyl group, an alkoxy group having 1 to 4 carbon atoms, a carboxyl group or an alkoxycarbonyl group having 2 to 6 carbon atoms. A substituent may further be introduced in each of these alkyl group, alkoxy group and alkoxycarbonyl group. As such a substituent, there can be mentioned, for example, a hydroxyl group, a halogen atom or an alkoxy group.

$L_1$ represents a connecting group of the formula —COO—, OCO—, —CONH—, —O—, —Ar—, —SO$_3$— or —SO$_2$NH— (in these connecting groups, left-hand "-" means the connection to the principal chain of the resin). Herein, Ar represents a bivalent aromatic ring group. Ar is preferably, for example, a bivalent aromatic ring group having 6 to 10 carbon atoms, such as a phenylene group or a naphthylene group. $L_1$ is preferably a connecting group of the formula —COO—, —CONH— or —Ar—, more preferably a connecting group of the formula —COO— or —CONH—.

R represents a hydrogen atom or an alkyl group. The alkyl group may be in the form of a linear chain or a branched chain. The alkyl group preferably has 1 to 6 carbon atoms, more preferably 1 to 3 carbon atoms. It is preferred for R to be a hydrogen atom or a methyl group, especially a hydrogen atom.

$R_0$ represents a polycycloalkyl group. As the polycycloalkyl group, there can be mentioned, for example, an adamantyl group, a noradamantyl group, a decahydronaphthyl group, a tricyclodecanyl group, a tetracyclododecanyl group, a norbornyl group or the like.

$L_3$ represents a (m+2)-valent connecting group. Namely, $L_3$ represents a tri- or higher valent connecting group.

$L_3$ is preferably a nonaromatic hydrocarbon group, and may be a chain hydrocarbon group or an alicyclic hydrocarbon group. As particular examples of the chain hydrocarbon groups, there can be mentioned, for example, groups resulting from the removal of m arbitrary hydrogen atoms from each of the groups set forth above as examples of the alkylene groups represented by $R_1$, $R_2$ and $R_3$. As particular examples of the alicyclic hydrocarbon groups, there can be mentioned, for example, groups resulting from the removal of m arbitrary hydrogen atoms from each of the groups set forth above as examples of the alicyclic hydrocarbon groups represented by $R_1$, $R_2$ and $R_3$.

$R^L$ represents a (n+1)-valent polyalicyclic hydrocarbon group. Namely, $R^L$ represents a bi- or higher valent polyalicyclic hydrocarbon group. As such a polyalicyclic hydrocarbon group, there can be mentioned, for example, any of those set forth above as the (n+1)-valent polyalicyclic hydrocarbon groups represented by $R_1$, $R_2$ and $R_3$. $R^L$s, or $R^L$ and $R^S$, may be bonded to each other to thereby form a ring structure.

$R^S$ represents a substituent. As the substituent, there can be mentioned, for example, an alkyl group, an alkenyl group, an alkynyl group, an aryl group, an alkoxy group, an acyloxy group, an alkoxycarbonyl group or a halogen atom.

In the formulae, n is an integer of 1 or greater, preferably an integer of 1 to 3, and more preferably 1 or 2. When n is 2 or greater, the contrast of dissolution in a developer comprising an organic solvent can be enhanced. Accordingly, if so, the limiting resolving power and roughness characteristic can be enhanced.

In the formulae, m is an integer of 1 or greater, preferably an integer of 1 to 3, and more preferably 1 or 2;

k is an integer of 0 or greater, preferably 0 or 1;

l is an integer of 1 or greater, preferably 1 or 2, and more preferably 1; and p is an integer of 0 to 3.

Particular examples of the repeating units each containing an acid-decomposable group capable of producing an alcoholic hydroxyl group are shown below. In the particular examples, Ra and OP are as defined in general formulae (b-1) to (b-3). When a plurality of OPs are bonded to each other to thereby form a ring, the corresponding ring structure is expressed as "O—P—O" for the sake of convenience.

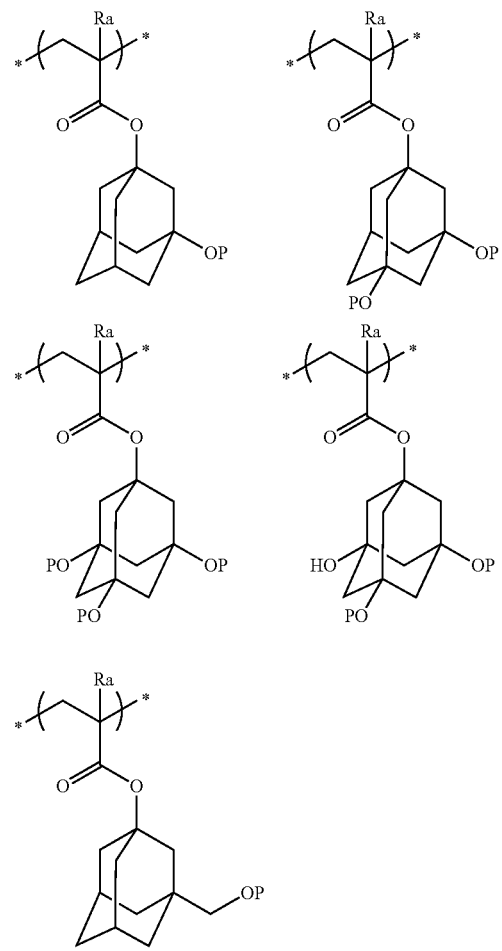

-continued

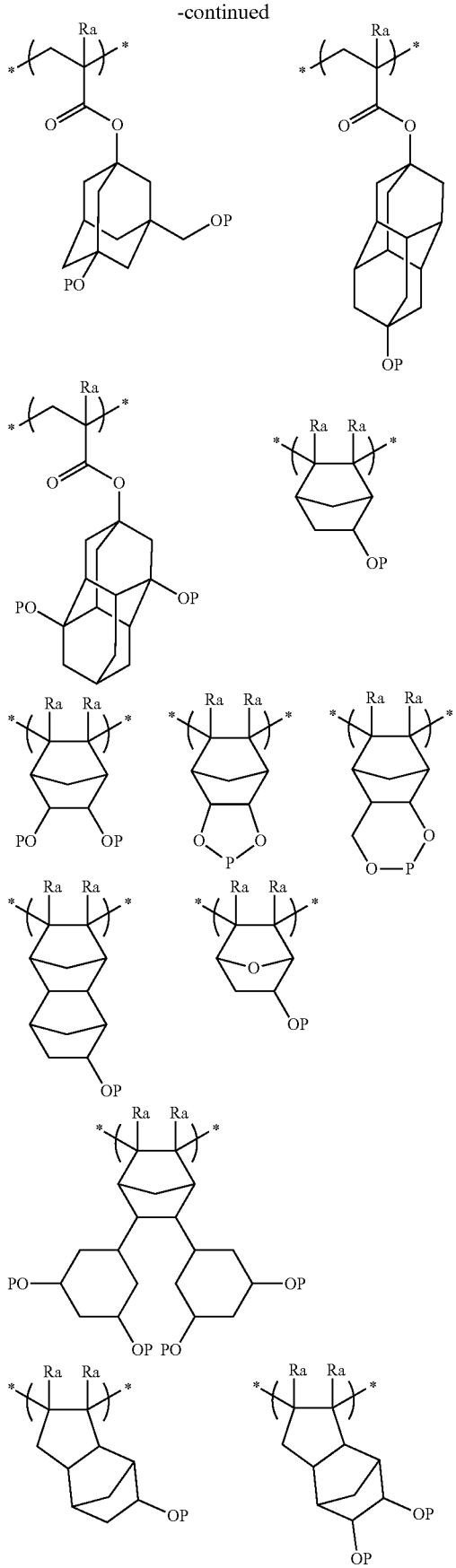

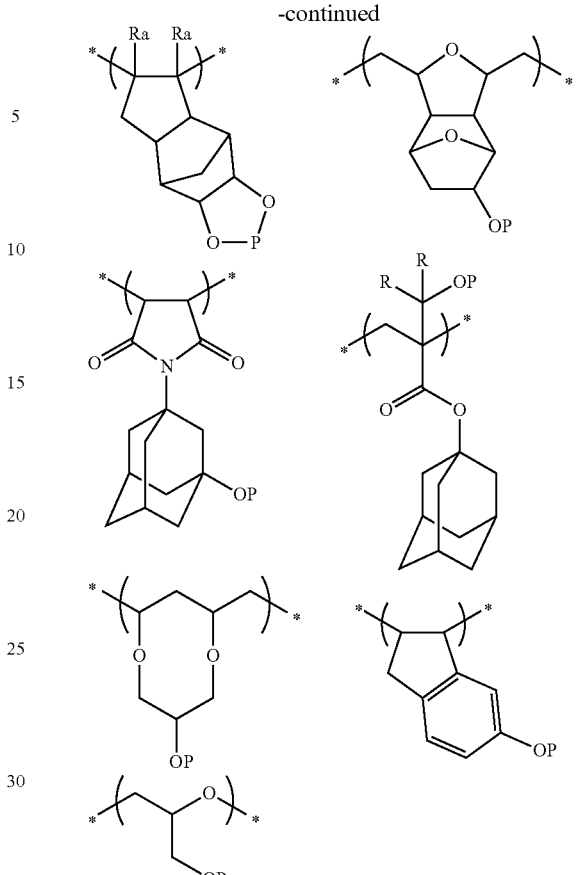

As mentioned above, it is most preferred for repeating unit (b) to be expressed by general formula (b-1) above. The group that is configured to decompose when acted on by an acid to thereby produce an alcoholic hydroxyl group is more preferably expressed by general formula (OR-1) or (OR-3) above, most preferably by general formula (OR-1) above.

In an aspect of the present invention, it is most preferred for repeating unit (b) to be expressed by general formula (IV-1) or (IV-2) below.

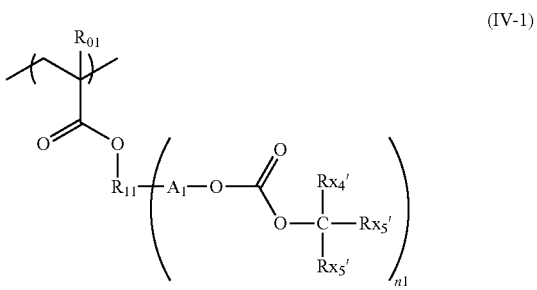

(IV-1)

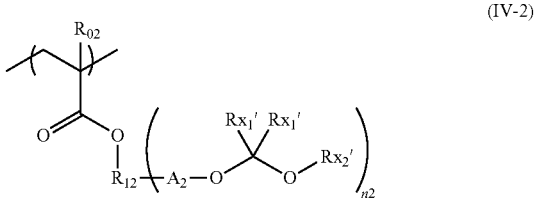

(IV-2)

In general formulae (IV-1) and (IV-2) above, each of $R_{01}$ and $R_{02}$ independently represents a hydrogen atom or a methyl group.

$R_{11}$ represents a (n1+1)-valent polyalicyclic hydrocarbon group.

$R_{12}$ represents a (n2+1)-valent polyalicyclic hydrocarbon group.

Each of $A_1$ and $A_2$ independently represents a single bond or an alkylene group.

$Rx_4'$ represents a hydrogen atom, an alkyl group or a cycloalkyl group.

Each of $Rx_5$'s independently represents an alkyl group or a cycloalkyl group. $Rx_5$'s may be bonded to each other to thereby form a ring. Further, $Rx_4'$ and $Rx_5'$ may be bonded to each other to thereby form a ring.

Each of $Rx_1$'s independently represents a hydrogen atom, an alkyl group or a cycloalkyl group. $Rx_1$'s may be bonded to each other to thereby form a ring.

$Rx_2'$ represents an alkyl group or a cycloalkyl group. $Rx_1'$ and $Rx_2'$ may be bonded to each other to thereby form a ring.

Each of n1 and n2 independently is an integer of 1 to 3.

When n1 is 2 or 3, each of a plurality of $A_1$s, a plurality of $Rx_4$'s, and a plurality of $Rx_5$'s independently may be identical to or different from each other.

When n2 is 2 or 3, each of a plurality of $A_2$s, a plurality of $Rx_1$'s, and a plurality of $Rx_2$'s independently may be identical to or different from each other.

As the (n1+1)-valent polyalicyclic hydrocarbon group represented by $R_{11}$ and the (n2+1)-valent polyalicyclic hydrocarbon group represented by $R_{12}$, there can be mentioned a norbornane ring group, a tetracyclodecane ring group, a tetracyclododecane ring group, an adamantane ring group, a diamantane ring group and the like. A polyalicyclic hydrocarbon group having 7 to 20 carbon atoms is preferred. A polyalicyclic hydrocarbon group having 7 to 15 carbon atoms is preferred. A polyalicyclic hydrocarbon group having 10 to 15 carbon atoms is most preferred.

As the alkylene groups represented by $A_1$ and $A_2$, there can be mentioned linear or branched-chain alkylene groups (for example, $-CH_2-$, $-C(CH_3)_2-$, $-(CH_2)_2-$, $-(CH_2)_3-$, $-(CH_2)_4-$, $-(CH_2)_{10}-$ and the like). An alkylene group having 1 to 8 carbon atoms is preferred. An alkylene group having 1 to 4 carbon atoms is more preferred. An alkylene group having 1 or 2 carbon atoms is most preferred.

It is most preferred for each of $A_1$ and $A_2$ to be a single bond or an alkylene group having 1 or 2 carbon atoms.

As particular examples and preferred examples of the alkyl groups and cycloalkyl groups represented by $Rx_1'$, $Rx_2'$, $Rx_4'$ and $Rx_5'$, there can be mentioned those set forth above in connection with the alkyl groups and cycloalkyl groups represented by $Rx_1$ and $Rx_4$.

At least one of the carbon atoms (carbon atoms contributing to ring formation) constructing the ring formed by the mutual bonding of $Rx_1$'s or the ring formed by the mutual bonding of $Rx_1'$ and $Rx_2'$ may be replaced with an oxygen atom or a sulfinyl group.

Nonlimiting preferred particular examples of repeating units (b) are shown below.

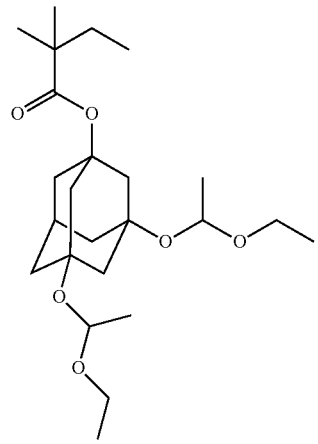

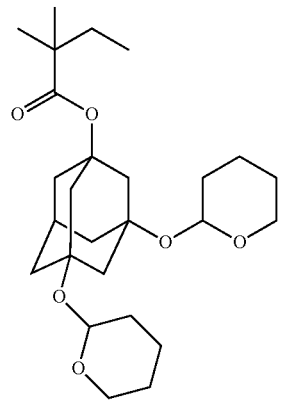

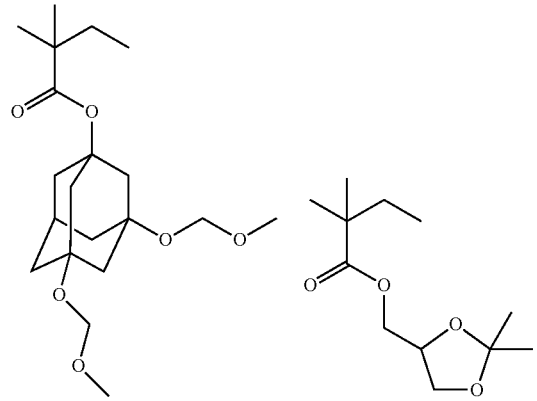

The content of repeating unit (b) in resin (B), based on all the repeating units, is preferably in the range of 30 to 80 mol %, more preferably 40 to 70 mol % and further more preferably 40 to 60 mol %. One of repeating units (b) may be used alone, or two or more thereof may be used in combination.

In the present invention, resin (B) may contain a repeating unit (b') containing an acid-decomposable group, other than the above repeating units. It is preferred for repeating unit (b') to be any of repeating units of general formula (AI) below.

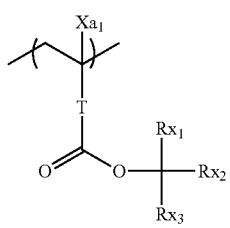

(AI)

In general formula (AI),

Xa$_1$ represents a hydrogen atom, an optionally substituted methyl group or any of groups of the formula —CH$_2$—R$_9$. R$_9$ represents a hydroxyl group or a monovalent organic group. The monovalent organic group is, for example, an alkyl group having 5 or less carbon atoms or an acyl group having 5 or less carbon atoms. Preferably, the monovalent organic group is a methyl group. Xa$_1$ is preferably a hydrogen atom, a methyl group, a trifluoromethyl group or a hydroxymethyl group.

T represents a single bond or a bivalent connecting group.

Each of Rx$_1$ to Rx$_3$ independently represents an alkyl group (linear or branched) or a cycloalkyl group (mono- or polycycle).

Any two of Rx$_1$ to Rx$_3$ may be bonded to each other to thereby form a ring structure [cycloalkyl group (mono- or polycycle)].

As the bivalent connecting group represented by T, there can be mentioned an alkylene group, any of groups of the formula —COO-Rt-, any of groups of the formula —O-Rt-, a phenylene group or the like. In the formulae, Rt represents an alkylene group or a cycloalkylene group.

T is preferably a single bond or any of groups of the formula —COO-Rt-. Rt is preferably an alkylene group having 1 to 5 carbon atoms, more preferably a —CH$_2$— group, a —(CH$_2$)$_2$— group or a —(CH$_2$)$_3$— group.

The alkyl group represented by each of Rx$_1$ to Rx$_3$ is preferably one having 1 to 4 carbon atoms.

The cycloalkyl group represented by each of Rx$_1$ to Rx$_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group.

The cycloalkyl group formed by the mutual bonding of any two of Rx$_1$ to Rx$_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group. A monocycloalkyl group having 5 or 6 carbon atoms is most preferred.

In a preferred form of the repeating unit, Rx$_1$ is a methyl group or an ethyl group, and Rx$_2$ and Rx$_3$ are bonded to each other to thereby form any of the above-mentioned cycloalkyl groups.

Substituents may be introduced in these groups. As the substituents, there can be mentioned, for example, an alkyl group (1 to 4 carbon atoms), a cycloalkyl group (3 to 8 carbon atoms), a halogen atom, an alkoxy group (1 to 4 carbon atoms), a carboxyl group, an alkoxycarbonyl group (2 to 6 carbon atoms) and the like. The number of carbon atoms of each of these substituents is preferably up to 8. From the viewpoint of enhancing the contrast of dissolution in a developer comprising an organic solvent between before and after acid decomposition, it is preferred for the substituent to be one not containing any heteroatom, such as an oxygen atom, a nitrogen atom or a sulfur atom (for example, preferably a substituent other than an alkyl group substituted with a hydroxyl group and the like). The substituent is more preferably a group comprised only of hydrogen and carbon atoms, most preferably a linear or branched alkyl group or a cycloalkyl group.

As preferred particular examples of repeating units (b'), there can be mentioned units set forth by way of example in section 0037 of JP-A-2012-208431, repeating units set forth by way of example in sections 0091 to 0096 of the above publication, etc., which are however nonlimiting.

Resin (B) may further contain a repeating unit (c) with a lactone structure. It is preferred for repeating unit (c) to be any of repeating units of general formula (AII) below.

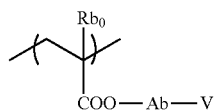

(AII)

In general formula (AII),

Rb$_0$ represents a hydrogen atom, a halogen atom or an optionally substituted alkyl group (preferably having 1 to 4 carbon atoms). Rb$_0$ is preferably a hydrogen atom, a methyl group, a hydroxymethyl group or a trifluoromethyl group. A hydrogen atom and a methyl group are especially preferred.

Ab represents a single bond, an alkylene group, a bivalent connecting group with a mono- or polycycloalkyl structure, an ether bond, an ester bond, a carbonyl group, or a bivalent connecting group resulting from a combination of these. Ab is preferably a single bond or any of bivalent connecting groups of the formula -Ab$_1$-CO$_2$—.

Ab$_1$ represents a linear or branched alkylene group or a mono- or polycycloalkylene group, preferably a methylene group.

V represents a group with a lactone structure.

The group with a lactone structure is not limited as long as a lactone structure is contained therein. However, lactone structures of 5 to 7-membered ring are preferred, and in particular, those resulting from condensation of lactone structures of 5 to 7-membered ring with other cyclic structures effected in a fashion to form a bicyclo structure or spiro structure are preferred. The introduction of a repeating unit containing a lactone structure expressed by any of the following general formulae (LC1-1) to (LC1-17) is more preferred. The lactone structures may be directly bonded to the principal chain. Preferred lactone structures are those of formulae (LC1-1), (LC1-4), (LC1-5), (LC1-6), (LC1-8), (LC1-13) and (LC1-14).

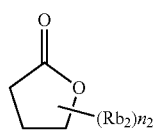

LC1-1

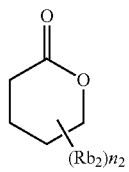

LC1-2

LC1-3 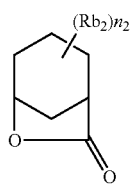

LC1-4 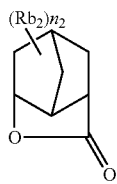

LC1-5 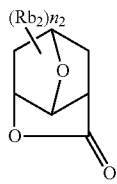

LC1-6 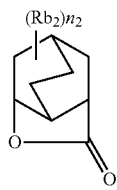

LC1-7 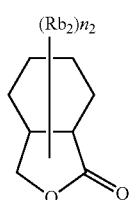

LC1-8 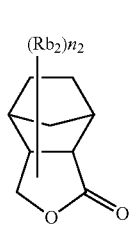

LC1-9 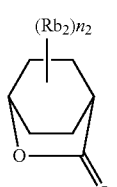

LC1-10 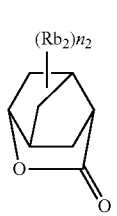

LC1-11 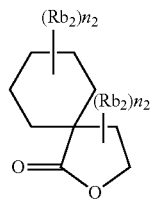

LC1-12 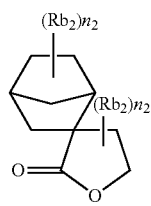

LC1-13 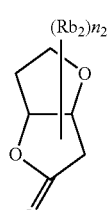

LC1-14 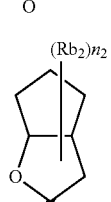

LC1-15 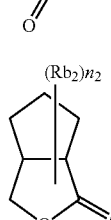

LC1-16 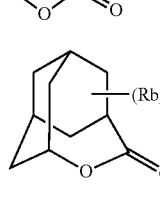

LC1-17 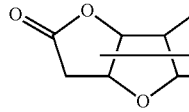

It is optional to introduce a substituent ($Rb_2$) in each portion of lactone structure. As a preferred substituent ($Rb_2$), there can be mentioned an alkyl group having 1 to 8 carbon atoms, a monocycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurally present substituents ($Rb_2$) may be identical to or different from each other. Further, the plurally present substituents ($Rb_2$) may be bonded to each other to thereby form a ring.

The repeating unit containing a lactone group is generally present in the form of optical isomers. Any optical isomer may be used. It is both appropriate to use a single type of optical isomer alone or a plurality of optical isomers in the form of a mixture. When a single type of optical isomer is mainly used, the optical purity (ee) thereof is preferably 90 or higher, more preferably 95 or higher.

When resin (B) contains repeating unit (c), the content of repeating unit (c) in resin (B), based on all the repeating units, is preferably in the range of 0.5 to 80 mol %, more preferably 1 to 65 mol % and further more preferably 3 to 50 mol %. One of repeating units (c) may be used alone, or two or more thereof may be used in combination. Using a specified lactone structure enhances LWR, uniformity of local pattern dimension and pattern collapse performance.

Particular examples of repeating units (c) in resin (B) are shown below, which however in no way limit the present invention. In the formulae, Rx represents H, $CH_3$, $CH_2OH$ or $CF_3$.

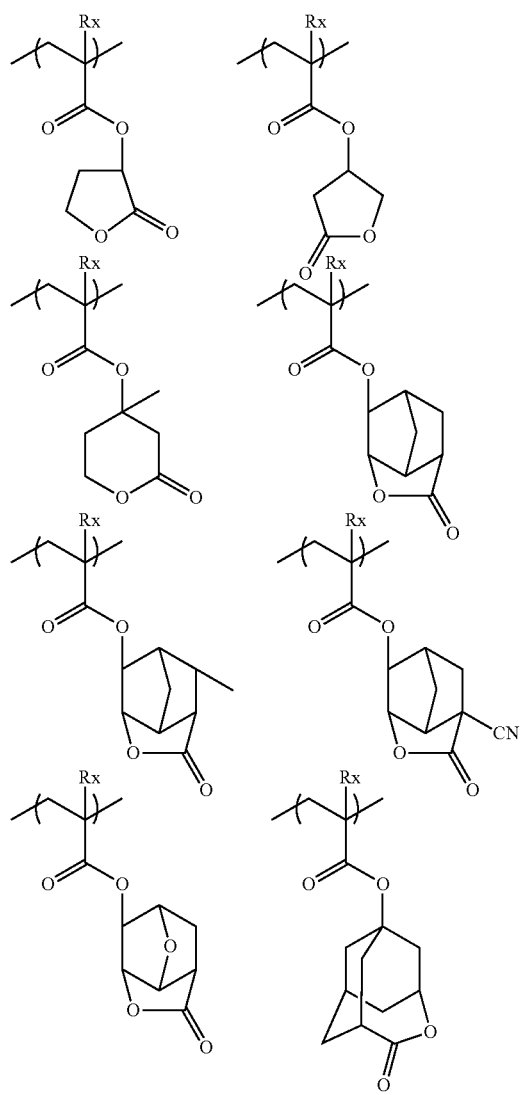

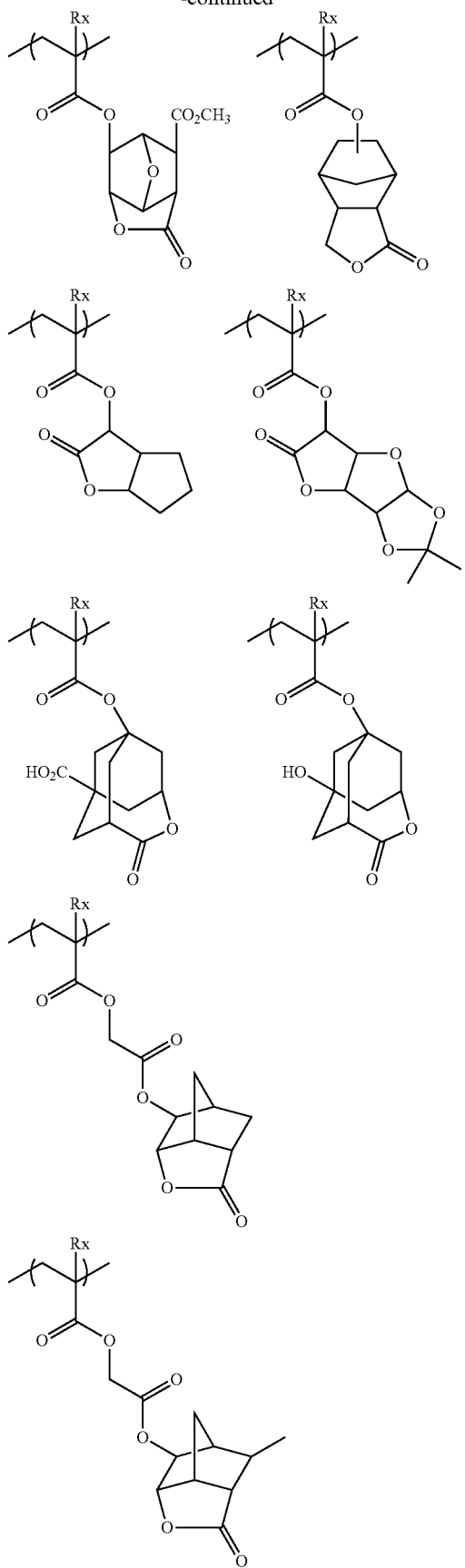

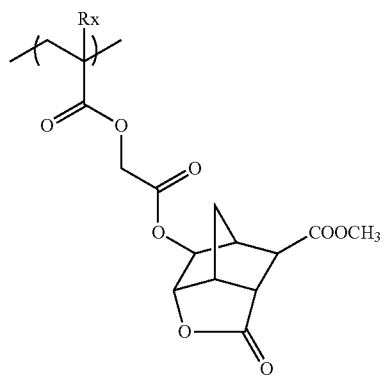
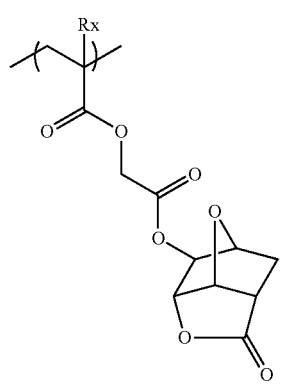
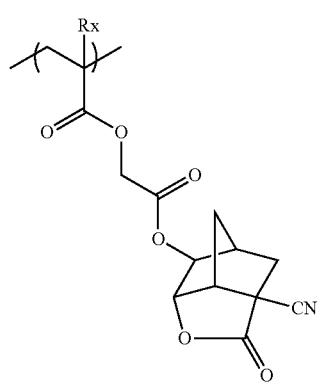
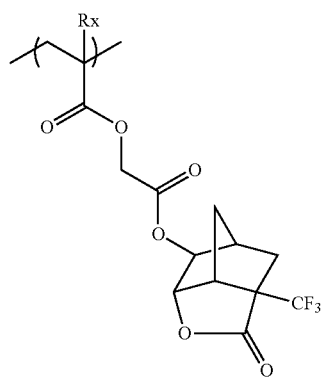
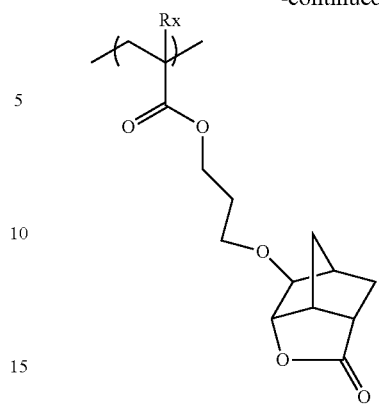
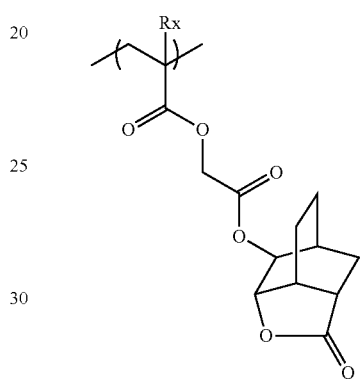
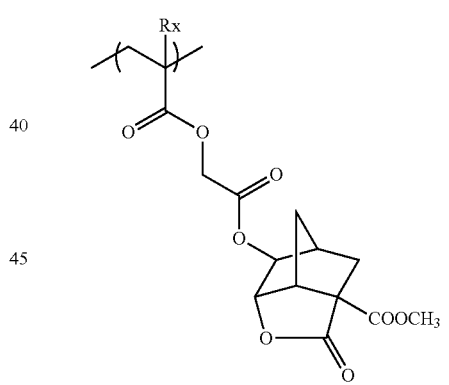
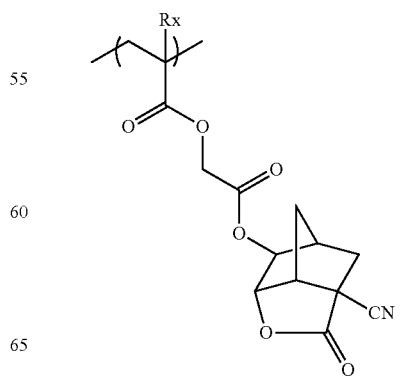

-continued

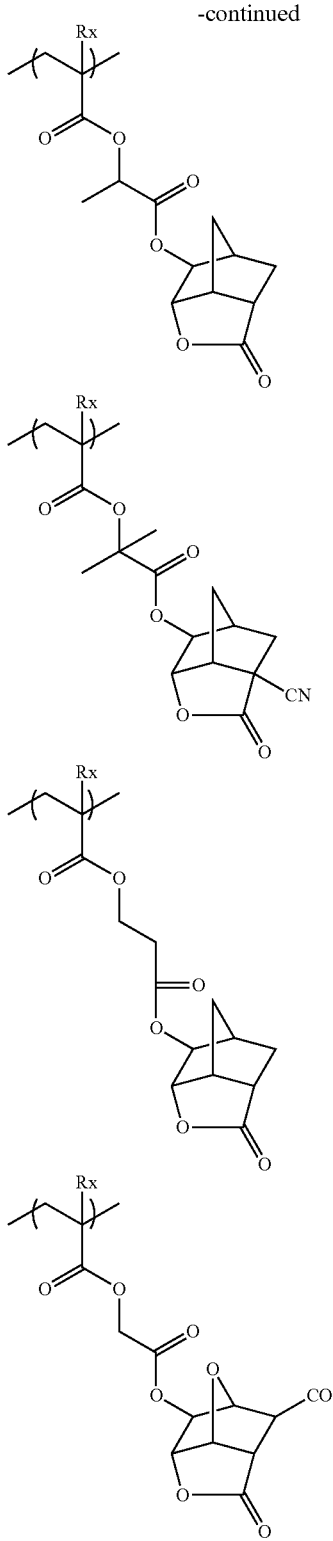

Resin (B) may contain a repeating unit containing an acid group. As the acid group, there can be mentioned a carboxyl group, a sulfonamido group, a sulfonylimido group, a bis-sulfonylimido group, or an aliphatic alcohol substituted at its α-position with an electron withdrawing group (for example, a hexafluoroisopropanol group). Preferably, the resin contains a repeating unit containing a carboxyl group.

Particular examples of repeating units each containing an acid group are shown below, which however in no way limit the present invention.

In the particular examples, Rx represents H, $CH_3$, $CH_2OH$ or $CF_3$.

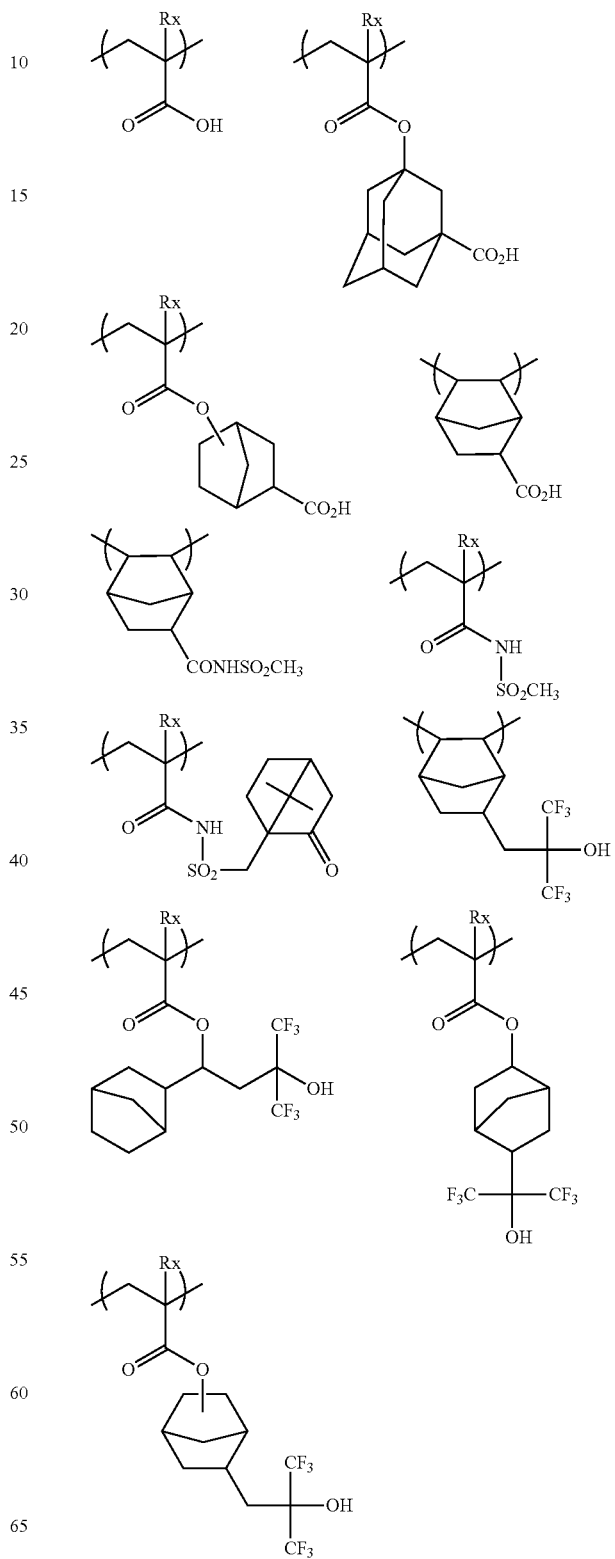

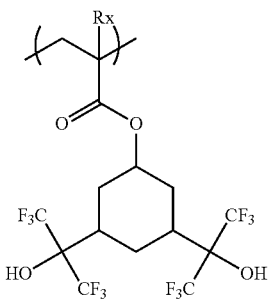

When exposure is performed using a KrF excimer laser light, electron beams, X-rays or high-energy rays of wavelength 50 nm or shorter (for example, EUV), it is preferred for the acid group to contain an aromatic ring group.

It is optional for resin (B) to contain a repeating unit containing an acid group. When resin (B) contains a repeating unit (d) containing an acid group, the content of repeating unit (d) based on all the repeating units of resin (B) is preferably in the range of 1 to 25 mol %, more preferably 1 to 20 mol % and further more preferably 3 to 20 mol %.

Resin (B) may further contain a repeating unit (e) containing a hydroxyl group or a cyano group other than the foregoing repeating units. This would realize enhancements of the adhesion to substrates and developer affinity. The repeating unit containing a hydroxyl group or a cyano group is preferably a repeating unit having an alicyclic hydrocarbon structure substituted with a hydroxyl group or a cyano group, which repeating unit preferably contains no acid-decomposable group. In the alicyclic hydrocarbon structure substituted with a hydroxyl group or a cyano group, the alicyclic hydrocarbon structure is preferably comprised of an adamantyl group, a diamantyl group or a norbornane group, more preferably an adamantyl group. The alicyclic hydrocarbon structure is preferably substituted with a hydroxyl group. It is especially preferred to contain a repeating unit containing an adamantyl group substituted with at least one hydroxyl group.

From the viewpoint of the inhibition of any diffusion of generated acid, it is most preferred for resin (B) to contain a repeating unit containing a hydroxyadamantyl group or a dihydroxyadamantyl group.

The alicyclic hydrocarbon structure substituted with a hydroxyl group or a cyano group is preferably any of the partial structures of general formulae (VIIa) to (VIId) below, more preferably the partial structure of general formula (VIIa).

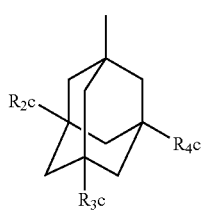
(VIIa)

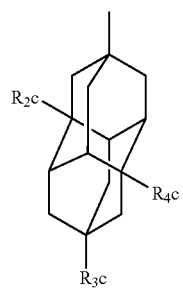
(VIIb)

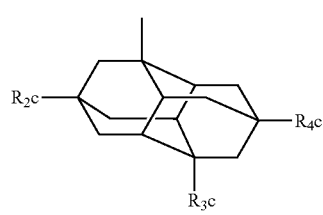
(VIIc)

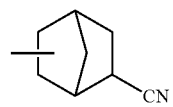
(VIId)

In general formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. Preferably, one or two of $R_2c$ to $R_4c$ are hydroxyl groups and the remainder is a hydrogen atom. In general formula (VIIa), more preferably, two of $R_2c$ to $R_4c$ are hydroxyl groups and the remainder is a hydrogen atom.

As the repeating units with partial structures of general formulae (VIIa) to (VIId), there can be mentioned the repeating units of general formulae (AIIa) to (AIId) below.

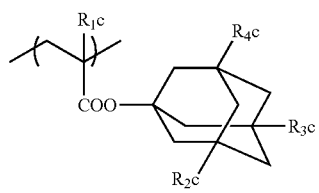
(AIIa)

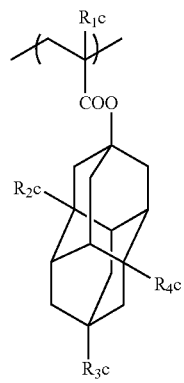
(AIIb)

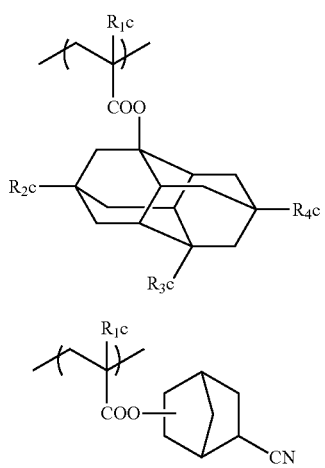

In general formulae (AIIa) to (AIId),

R₁c represents a hydrogen atom, a methyl group, a trifluoromethyl group or a hydroxymethyl group.

R₂c to R₄c have the same meanings as those of R₂c to R₄c in general formulae (VIIa) to (VIIc).

Specific examples of the repeating units (e) each containing a hydroxyl group or a cyano group are shown below, which however in no way limit the present invention.

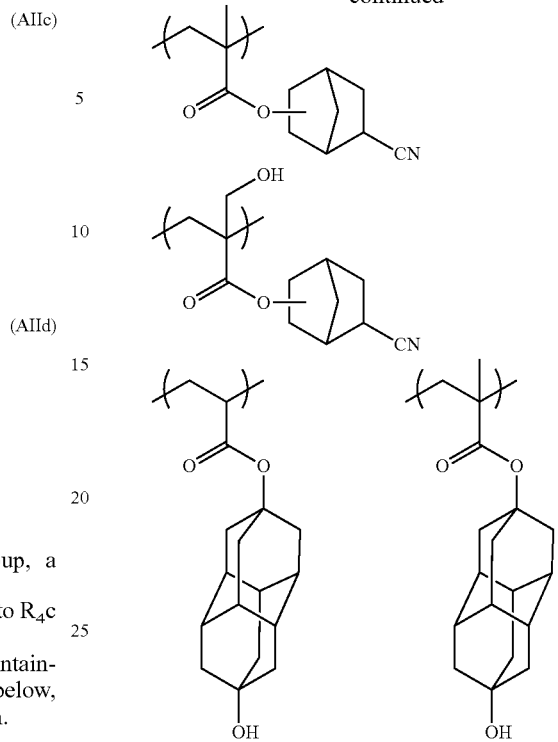

It is optional for resin (B) to contain the repeating unit containing a hydroxyl group or a cyano group. When repeating unit (e) is contained in resin (B), the content of repeating unit (e) containing a hydroxyl group or a cyano group, based on all the repeating units of resin (B), is preferably in the range of 1 to 40 mol %, more preferably 1 to 30 mol % and further more preferably 3 to 20 mol %.

Resin (B) according to the present invention can further contain a repeating unit having an alicyclic hydrocarbon structure in which no polar group (for example, the above acid group, hydroxyl group or cyano group) is introduced and exhibiting no acid-decomposability. This not only reduces any leaching of low-molecular components from the resist film into an immersion liquid in the stage of liquid immersion exposure but also realizes an appropriate regulation of the solubility of the resin in the stage of development with a developer comprising an organic solvent. As such a repeating unit, there can be mentioned any of the repeating units of general formula (IV) below.

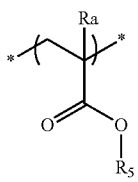

(IV)

In general formula (IV), $R_5$ represents a hydrocarbon group having at least one cyclic structure in which no polar group is introduced.

Ra represents a hydrogen atom, an alkyl group or a group of the formula —$CH_2$—O—$Ra_2$. In this formula, $Ra_2$ represents a hydrogen atom, an alkyl group or an acyl group. Ra is most preferably a hydrogen atom or a methyl group.

The cyclic structures introduced in $R_5$ include a monocyclic hydrocarbon group and a polycyclic hydrocarbon group. As the monocyclic hydrocarbon group, there can be mentioned, for example, a cycloalkyl group having 3 to 12 carbon atoms, such as a cyclopentyl group, a cyclohexyl group, a cycloheptyl group or a cyclooctyl group, or a cycloalkenyl group having 3 to 12 carbon atoms, such as a cyclohexenyl group. Preferably, the monocyclic hydrocarbon group is a monocyclic hydrocarbon group having 3 to 7 carbon atoms. A cyclopentyl group and a cyclohexyl group can be mentioned as being more preferred.

The polycyclic hydrocarbon groups include ring-assembly hydrocarbon groups and crosslinked-ring hydrocarbon groups. Examples of the ring-assembly hydrocarbon groups include a bicyclohexyl group and a perhydronaphthalenyl group.

As preferred crosslinked-ring hydrocarbon groups, there can be mentioned a norbornyl group, an adamantyl group, a bicyclooctanyl group and a tricyclo[5,2,1,0$^{2,6}$]decanyl group and the like. As more preferred crosslinked-ring hydrocarbon groups, there can be mentioned a norbornyl group and an adamantyl group.

Substituents may be introduced in these alicyclic hydrocarbon groups. As preferred substituents, there can be mentioned a halogen atom, an alkyl group, a hydroxyl group having its hydrogen atom replaced, an amino group having its hydrogen atom replaced and the like.

It is optional for resin (B) to contain the repeating unit having an alicyclic hydrocarbon structure in which no polar group is introduced and exhibiting no acid-decomposability. When the repeating unit (f) having an alicyclic hydrocarbon structure in which no polar group is introduced and exhibiting no acid-decomposability is contained in resin (B), the content of repeating unit (f) based on all the repeating units of resin (B) is preferably in the range of 1 to 40 mol %, more preferably 1 to 20 mol %.

Particular examples of repeating units (f) are shown below, which in no way limit the present invention. In the formulae, Ra represents H, $CH_3$, $CH_2OH$ or $CF_3$.

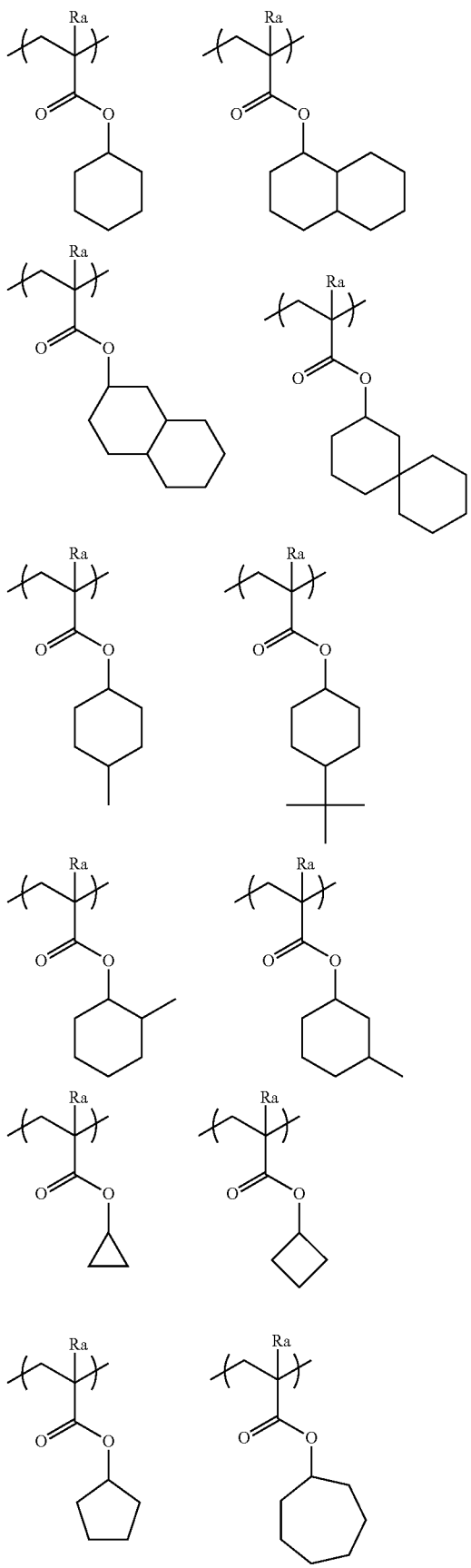

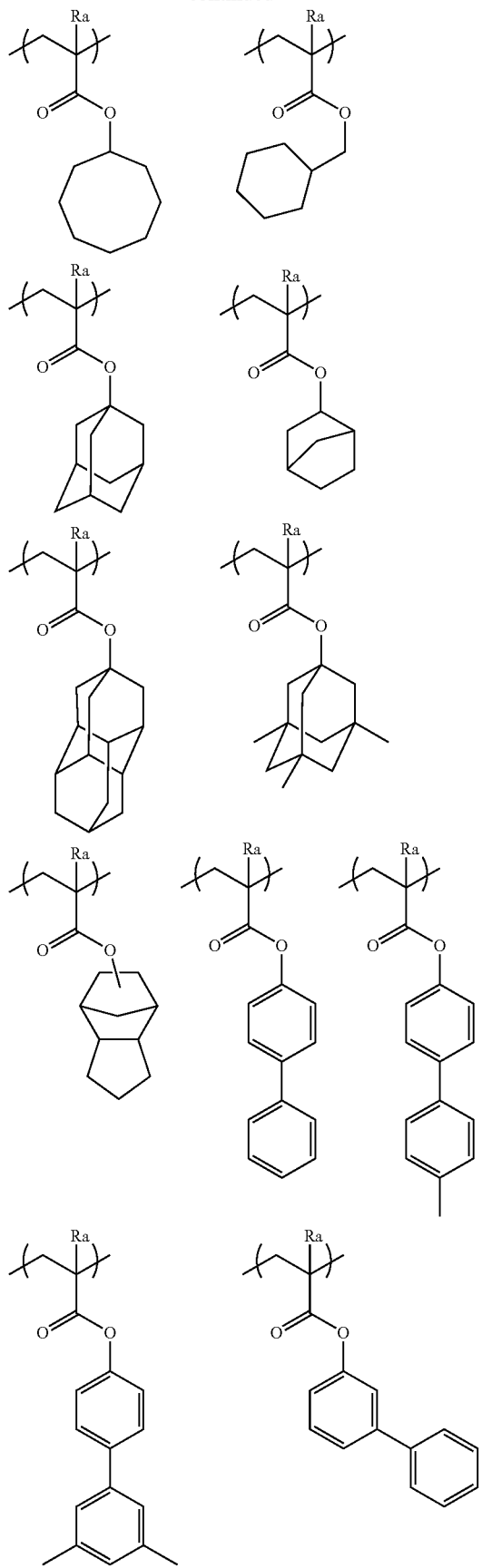
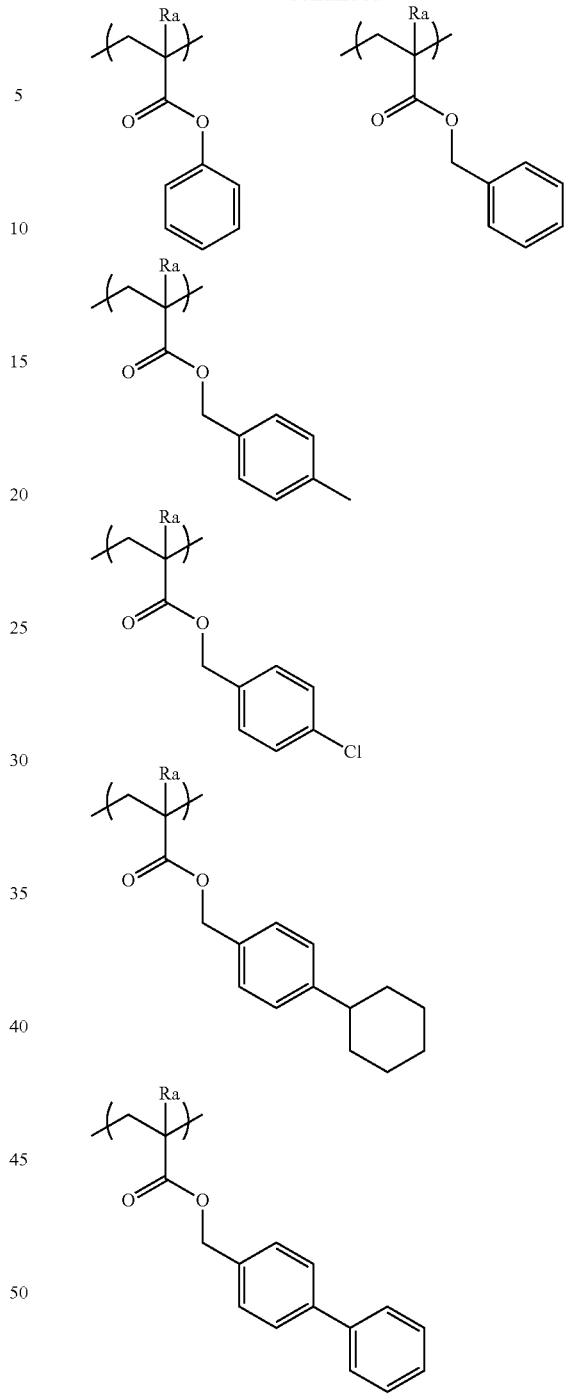

Resin (B) for use in the composition of the present invention can contain, in addition to the foregoing repeating structural units, various repeating structural units for the purpose of regulating the dry etching resistance, standard developer adaptability, substrate adhesion, resist profile and generally required properties of the actinic-ray- or radiation-sensitive resin composition such as resolving power, heat resistance and sensitivity.

As such repeating structural units, there can be mentioned repeating structural units corresponding to the following monomers, which however are nonlimiting.

The incorporation of such repeating structural units realizes fine regulation of the required properties of the resin for use in the composition of the present invention, especially:

(1) solubility in applied solvents,
(2) film forming easiness (glass transition point),
(3) alkali developability,
(4) film thinning (selections of hydrophilicity/hydrophobicity and alkali-soluble group),
(5) adhesion of unexposed area to substrate,
(6) dry etching resistance, etc.

As appropriate monomers, there can be mentioned, for example, compounds each having one unsaturated bond capable of addition polymerization, selected from among acrylic esters, methacrylic esters, acrylamides, methacrylamides, allyl compounds, vinyl ethers, vinyl esters, styrenes, crotonic esters and the like.

In addition, any unsaturated compound capable of addition polymerization that is copolymerizable with monomers corresponding to the above various repeating structural units may be copolymerized therewith.

In resin (B) for use in the composition of the present invention, the molar ratios of individual repeating structural units contained are appropriately determined from the viewpoint of regulating the dry etching resistance, standard developer adaptability, substrate adhesion and resist profile of the actinic-ray- or radiation-sensitive resin composition and generally required properties of the resist such as resolving power, heat resistance and sensitivity.

Resin (B) according to the present invention may have any of the random, block, comb and star forms. Resin (B) can be synthesized by, for example, the radical, cation or anion polymerization of unsaturated monomers corresponding to given structures. Alternatively, the intended resin can be obtained by first polymerizing unsaturated monomers corresponding to the precursors of given structures and thereafter carrying out a polymer reaction.

When the composition of the present invention is one for ArF exposure, from the viewpoint of transparency to ArF light, it is preferred for resin (B) for use in the composition of the present invention to contain substantially no aromatic ring (in particular, the ratio of repeating unit containing an aromatic group in the resin is preferably 5 mol % or less, more preferably 3 mol % or less, and ideally 0 mol %, namely, containing no aromatic group). It is preferred for resin (B) to contain a mono- or polyalicyclic hydrocarbon structure.

When the composition of the present invention contains a hydrophobic resin (HR) to be described hereinafter, it is preferred for resin (B) to contain neither a fluorine atom nor a silicon atom from the viewpoint of the compatibility with hydrophobic resin (HR).

In resin (B) for use in the composition of the present invention, preferably, all the repeating units thereof are comprised of (meth)acrylate repeating units. In that instance, use can be made of any of a resin wherein all the repeating units are comprised of methacrylate repeating units, a resin wherein all the repeating units are comprised of acrylate repeating units and a resin wherein all the repeating units are comprised of methacrylate repeating units and acrylate repeating units. However, it is preferred for the acrylate repeating units to account for 50 mol % or less of all the repeating units.

In the event of exposing the composition of the present invention to KrF excimer laser beams, electron beams, X-rays or high-energy light rays of wavelength 50 nm or shorter (EUV, etc.), it is preferred for resin (B) to further contain a hydroxystyrene repeating unit. More preferably, resin (B) contains a hydroxystyrene repeating unit, a hydroxystyrene repeating unit protected by an acid-decomposable group and an acid-decomposable repeating unit of a (meth)acrylic acid tertiary alkyl ester, etc.

As hydroxystyrene repeating units each containing a preferred acid-decomposable group, there can be mentioned, for example, repeating units derived from t-butoxycarbonyloxystyrene, a 1-alkoxyethoxystyrene and a (meth)acrylic acid tertiary alkyl ester. Repeating units derived from a 2-alkyl-2-adamantyl (meth)acrylate and a dialkyl(1-adamantyl)methyl (meth)acrylate are more preferred.

Resin (B) according to the present invention can be synthesized (for example, radical polymerization) and purified in accordance with routine methods. In particular, in view of appropriate application of the present invention to semiconductor uses, it is obvious to have to elaborately perform the purification of synthesized resin. A detailed description regarding the synthesis and purification of resins is provided in sections 0141 to 0146 of JPA-2012-208431. The contents thereof are incorporated in this description by reference.

The weight average molecular weight of resin (B) for use in the composition of the present invention, in terms of polystyrene-equivalent value measured by GPC, is preferably in the range of 1000 to 200,000. It is more preferably in the range of 2000 to 100,000, further more preferably 3000 to 70,000 and most preferably 5000 to 50,000. By regulating the weight average molecular weight so as to fall within the range of 1000 to 200,000, not only can any deteriorations of heat resistance and dry etching resistance be prevented but also any deterioration of developability and any increase of viscosity leading to poor film forming property can be prevented.

The polydispersity index (molecular weight distribution) of resin employed is generally in the range of 1.0 to 3.0, preferably 1.0 to 2.6, more preferably 1.2 to 2.4 and most preferably 1.4 to 2.2. When the molecular weight distribution falls within the above range, excellent resolution and resist shape can be realized. Further, the side wall of the resist pattern can be smooth, realizing excellent roughness characteristics.

In the actinic-ray- or radiation-sensitive resin composition of the present invention, the content of resin (B) in the whole composition is preferably in the range of 30 to 99 mass %, more preferably 60 to 95 mass %, based on the total solids of the composition.

In the present invention, one of resins (B) may be used alone, or two or more thereof may be used in combination. Moreover, in the present invention, resins other than the above resin containing a repeating unit containing a group that is configured to decompose when acted on by an acid to thereby produce an alcoholic hydroxyl group can be used in combination with resin (B).

[3] Basic Compound

The composition of the present invention may comprise a basic compound in order to diminish any performance change over time from exposure to baking.

As preferred basic compounds, there can be mentioned the compounds with structures of the following formulae (A) to (E).

(A)

-continued

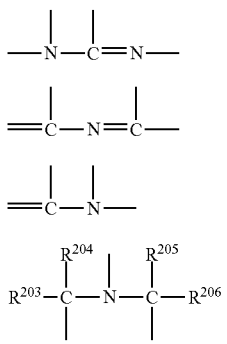

In general formulae (A) and (E),
$R^{200}$, $R^{201}$ and $R^{202}$ may be identical to or different from each other, and each represent a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded to each other to thereby form a ring. $R^{203}$, $R^{204}$, $R^{205}$ and $R^{206}$ may be identical to or different from each other, and each represent an alkyl group having 1 to 20 carbon atoms.

With respect to the above alkyl group, as a preferred substituted alkyl group, there can be mentioned an aminoalkyl group having 1 to 20 carbon atoms, a hydroxyalkyl group having 1 to 20 carbon atoms or a cyanoalkyl group having 1 to 20 carbon atoms.

In general formulae (A) and (E), it is preferred for the alkyl groups to be unsubstituted.

As preferred basic compounds, there can be mentioned guanidine, aminopyrrolidine, pyrazole, pyrazoline, piperazine, aminomorpholine, aminoalkylmorpholines, piperidine and the like. As further preferred compounds, there can be mentioned compounds with an imidazole structure, a diazabicyclo structure, an onium hydroxide structure, an onium carboxylate structure, a trialkylamine structure, an aniline structure and a pyridine structure; alkylamine derivatives containing a hydroxyl group and/or an ether bond; aniline derivatives containing a hydroxyl group and/or an ether bond; and the like.

As the compounds with an imidazole structure, there can be mentioned imidazole, 2,4,5-triphenylimidazole, benzimidazole and the like. As the compounds with a diazabicyclo structure, there can be mentioned 1,4-diazabicyclo[2,2,2]octane, 1,5-diazabicyclo[4,3,0]non-5-ene, 1,8-diazabicyclo[5,4,0]undec-7-ene and the like. As the compounds with an onium hydroxide structure, there can be mentioned a triarylsulfonium hydroxide, phenacylsulfonium hydroxide, and sulfonium hydroxides containing a 2-oxoalkyl group, such as triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. The compounds with an onium carboxylate structure correspond to the compounds with an onium hydroxide structure wherein the anion moiety is a carboxylate, and as such, there can be mentioned, for example, an acetate, adamantane-1-carboxylate, a perfluoroalkyl carboxylate and the like. As the compounds with a trialkylamine structure, there can be mentioned tri(n-butyl)amine, tri(n-octyl)amine and the like. As the compounds with an aniline structure, there can be mentioned 2,6-diisopropylaniline, N,N-dimethylaniline, N,N-dibutylaniline, N,N-dihexylaniline and the like. As the alkylamine derivatives containing a hydroxyl group and/or an ether bond, there can be mentioned ethanolamine, diethanolamine, triethanolamine, tris(methoxyethoxyethyl)amine and the like. As the aniline derivatives containing a hydroxyl group and/or an ether bond, there can be mentioned N,N-bis(hydroxyethyl)aniline and the like.

As preferred basic compounds, there can further be mentioned an amine compound containing a phenoxy group, an ammonium salt compound containing a phenoxy group, an amine compound containing a sulfonic ester group and an ammonium salt compound containing a sulfonic ester group.

Each of the above amine compound containing a phenoxy group, ammonium salt compound containing a phenoxy group, amine compound containing a sulfonic ester group and ammonium salt compound containing a sulfonic ester group preferably contains at least one alkyl group bonded to the nitrogen atom thereof. Further, preferably, this alkyl group in its chain contains an oxygen atom, thereby forming an oxyalkylene group. The number of oxyalkylene groups in each molecule is one or more, preferably 3 to 9 and more preferably 4 to 6. Among the oxyalkylene groups, the structures of —$CH_2CH_2O$—, —$CH(CH_3)CH_2O$— and —$CH_2CH_2CH_2O$— are preferred.

As specific examples of the above amine compound containing a phenoxy group, ammonium salt compound containing a phenoxy group, amine compound containing a sulfonic ester group and ammonium salt compound containing a sulfonic ester group, there can be mentioned the compounds (C1-1) to (C3-3) shown by way of example in section [0066] of U.S. Patent Application Publication No. 2007/0224539, which are however nonlimiting.

Moreover, as preferred basic compounds, there can be mentioned nitrogen-containing compounds (C) of general formula (5) below.

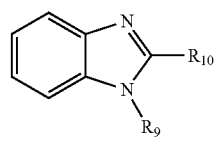

(5)

In the formula,
$R_9$ represents a hydrogen atom or an organic group that is configured to decompose when acted on by an acid.
$R_{10}$ represents a hydrogen atom, an alkyl group or an aryl group.

The group represented by $R_9$ is preferably a hydrogen atom.

It is preferred for the alkyl group represented by $R_{10}$ to be, for example, an alkyl group having 1 to 4 carbon atoms, such as a methyl group, an isopropyl group or the like.

It is preferred for the aryl group represented by $R_{10}$ to be, for example, an aryl group having 6 to 14 carbon atoms, such as a phenyl group, a naphthyl or the like.

Substituents may be introduced in these alkyl group and aryl group. As the substituents, there can be mentioned, for example, a fluorine atom and the like.

As particular examples of nitrogen-containing compounds (C), there can be mentioned, for example, the following compounds.

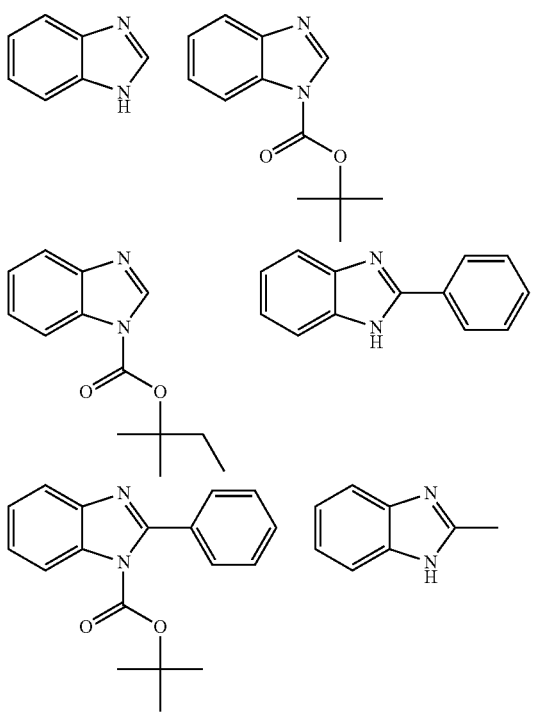

The molecular weight of each basic compound is preferably in the range of 80 to 2000, more preferably 100 to 1000. From the viewpoint of further reduction of LWR and uniformity of local pattern dimension, it is preferred for the molecular weight of basic compound to be 80 or greater. The molecular weight is more preferably 100 or greater and further more preferably 150 or greater.

When a basic compound is contained in the composition of the present invention, the content of basic compound, based on the solids of the actinic-ray- or radiation-sensitive resin composition, is generally in the range of 0.001 to 10 mass %, preferably 0.01 to 5 mass %.

With respect to the ratio of acid generator to basic compound used in the composition, it is preferred to satisfy the relationship: acid generator/basic compound (molar ratio)=2.5 to 300. Namely, a molar ratio of 2.5 or higher is preferred from the viewpoint of sensitivity and resolution. A molar ratio of 300 or below is preferred from the viewpoint of the inhibition of any resolution deterioration due to resist pattern thickening over time until baking treatment after exposure. The acid generator/basic compound (molar ratio) is more preferably in the range of 5.0 to 200, further more preferably 7.0 to 150.

[4] Compound (D)

The composition of the present invention may comprise any of compounds of general formula (6a) or (6b) below, or salts thereof (hereinafter also referred to as "compound (D)").

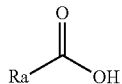
(6a)

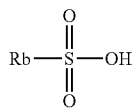
(6b)

In general formula (6a), Ra represents an organic group, provided that any one in which the carbon atom directly bonded to the carboxylic acid group in the formula is substituted with a fluorine atom is excluded.

In general formula (6b), Rb represents an organic group, provided that any one in which the carbon atom directly bonded to the sulfonic acid group in the formula is substituted with a fluorine atom is excluded.

It is preferred for the organic group represented by Ra or Rb to be one containing a carbon atom as an atom directly bonded to the carboxylic acid group or sulfonic acid group in the formula. In that instance, for the realization of an acid being relatively weak as compared to the acids produced from the above-mentioned acid generators (A), the carbon atom directly bonded to the sulfonic acid group or carboxylic acid group is in no event substituted with a fluorine atom.

As the organic groups represented by Ra and Rb, there can be mentioned, for example, an alkyl group having 1 to 20 carbon atoms, a cycloalkyl group having 3 to 20 carbon atoms, an aryl group having 6 to 30 carbon atoms, an aralkyl group having 7 to 30 carbon atoms, a heterocyclic group having 3 to 30 carbon atoms and the like. In each of these groups, the hydrogen atoms may be partially or entirely replaced by substituents.

As substituents introducible in the above alkyl group, cycloalkyl group, aryl group, aralkyl group and heterocyclic group, there can be mentioned, for example, a hydroxyl group, a halogen atom, an alkoxy group, a lactone group, an alkylcarbonyl group and the like.

When compound (D) is a salt, it is preferred for the same to be, for example, any of onium salts of general formula (6A) or (6B) below.

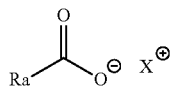
(6A)

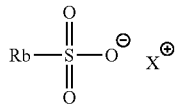
(6B)

In general formula (6A),

Ra represents an organic group, provided that any one in which the carbon atom directly bonded to the carboxylic acid group in the formula is substituted with a fluorine atom is excluded.

$X^+$ represents an onium cation.

In general formula (6B),

Rb represents an organic group, provided that any one in which the carbon atom directly bonded to the sulfonic acid group in the formula is substituted with a fluorine atom is excluded.

$X^+$ represents an onium cation.

Ra in general formula (6A) has the same meaning as that of Ra in general formula (6a) above. Rb in general formula (6B) has the same meaning as that of Rb in general formula (6b) above.

As the onium cations represented by X⁺ in general formulae (6A) and (6B), there can be mentioned a sulfonium cation, an ammonium cation, an iodonium cation, a phosphonium cation, a diazonium cation and the like. Of these, a sulfonium cation is preferred.

The sulfonium cation is preferably, for example, an arylsulfonium cation containing at least one aryl group, more preferably a triarylsulfonium cation. A substituent may be introduced in the aryl group, and the aryl group is preferably a phenyl group.

Particular examples of compounds (D) are shown below.

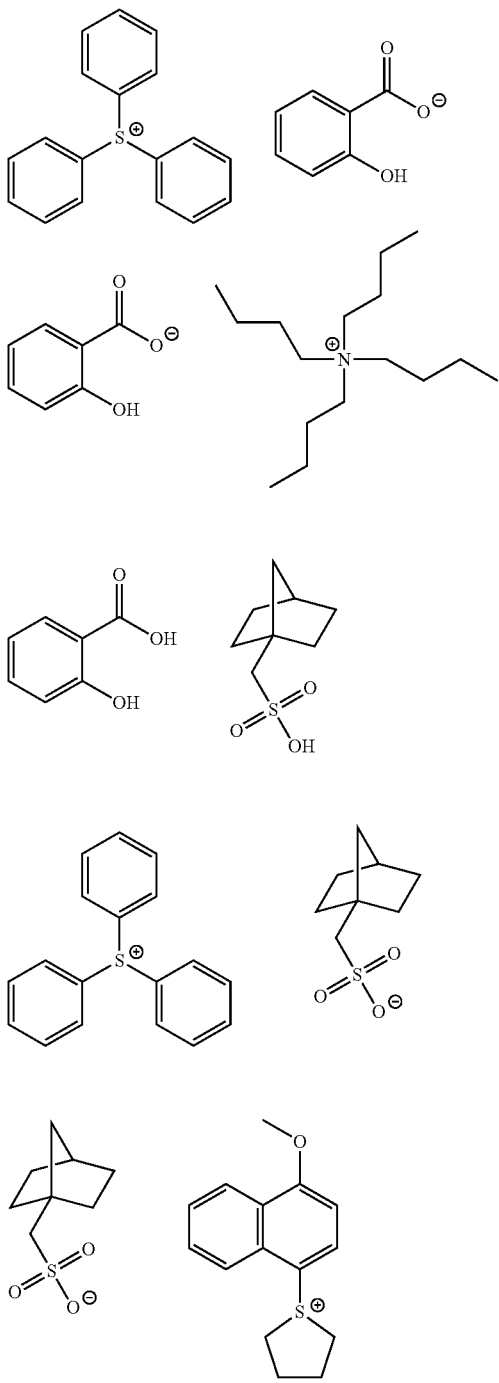

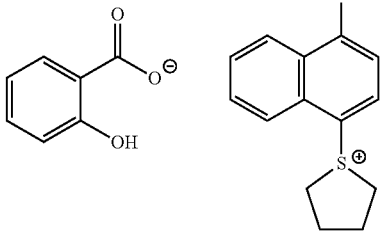

When the composition of the present invention comprises compound (D), the content thereof, based on the solids of the actinic-ray- or radiation-sensitive resin composition, is generally in the range of 0.01 to 10 mass %, preferably 0.1 to 5 mass %.

[5] Hydrophobic Resin

The composition of the present invention may comprise a hydrophobic resin (hereinafter also referred to as "hydrophobic resin (HR)" or "resin (HR)") containing at least either a fluorine atom or a silicon atom.

In hydrophobic resin (HR), the fluorine atom and/or silicon atom may be introduced in the principal chain of the resin, or a side chain thereof.

When hydrophobic resin (HR) contains a fluorine atom, it is preferred for the resin to contain, as a partial structure containing a fluorine atom, an alkyl group containing a fluorine atom, a cycloalkyl group containing a fluorine atom or an aryl group containing a fluorine atom.

The alkyl group containing a fluorine atom is a linear or branched-chain alkyl group having at least one hydrogen atom thereof replaced by a fluorine atom. This alkyl group preferably has 1 to 10 carbon atoms, more preferably 1 to 4 carbon atoms. Non-fluorine-atom substituents may further be introduced in the alkyl group containing a fluorine atom.

The cycloalkyl group containing a fluorine atom is a mono- or polycycloalkyl group having at least one hydrogen atom thereof replaced by a fluorine atom. Non-fluorine-atom substituents may further be introduced in the cycloalkyl group containing a fluorine atom.

The aryl group containing a fluorine atom is an aryl group having at least one hydrogen atom thereof replaced by a fluorine atom. As the aryl group, there can be mentioned, for example, a phenyl group or a naphthyl group. Non-fluorine-atom substituents may further be introduced in the aryl group containing a fluorine atom.

As preferred examples of alkyl groups containing a fluorine atom, cycloalkyl groups containing a fluorine atom and aryl groups containing a fluorine atom, there can be mentioned groups of general formulae (F2) to (F4) below.

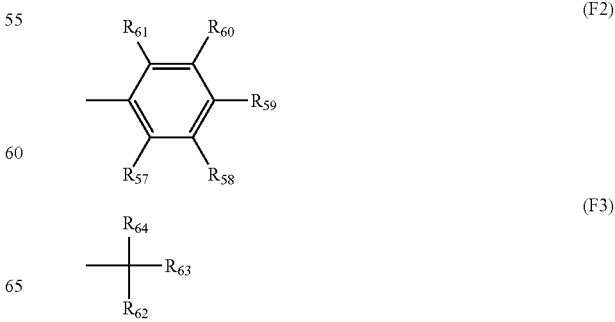

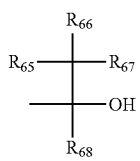

(F4)

In general formulae (F2) to (F4), each of $R_{57}$ to $R_{68}$ independently represents a hydrogen atom, a fluorine atom or an alkyl group; provided that at least one of $R_{57}$ to $R_{61}$ represents a fluorine atom or an alkyl group having at least one hydrogen atom thereof replaced by a fluorine atom; provided that at least one of $R_{62}$ to $R_{64}$ represents a fluorine atom or an alkyl group having at least one hydrogen atom thereof replaced by a fluorine atom; and provided that at least one of $R_{65}$ to $R_{68}$ represents a fluorine atom or an alkyl group having at least one hydrogen atom thereof replaced by a fluorine atom. Each of these alkyl groups preferably has 1 to 4 carbon atoms.

It is preferred for all of $R_{57}$-$R_{61}$ and $R_{65}$-$R_{67}$ to represent fluorine atoms.

Each of $R_{62}$, $R_{63}$ and $R_{68}$ preferably represents an alkyl group having at least one hydrogen atom thereof replaced by a fluorine atom, more preferably a perfluoroalkyl group having 1 to 4 carbon atoms. $R_{62}$ and $R_{63}$ may be bonded to each other to thereby form a ring.

Particular examples of the repeating units containing a fluorine atom are shown below.

In the particular examples, $X_1$ represents a hydrogen atom, —$CH_3$, —F or —$CF_3$. $X_2$ represents —F or —$CF_3$.

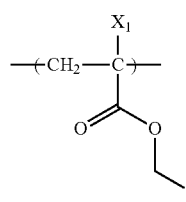
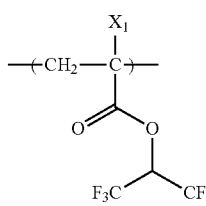
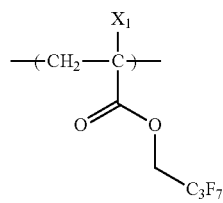
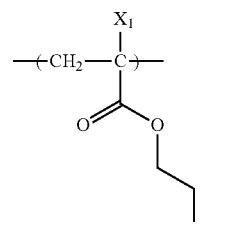
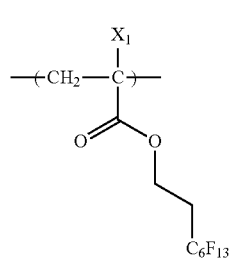
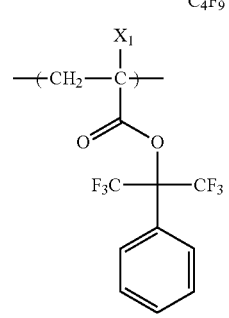

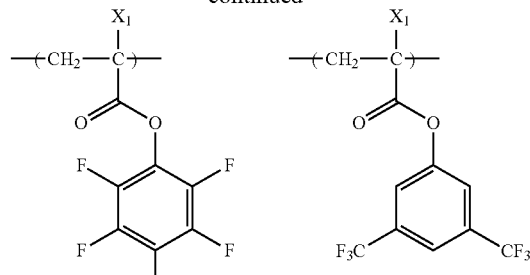
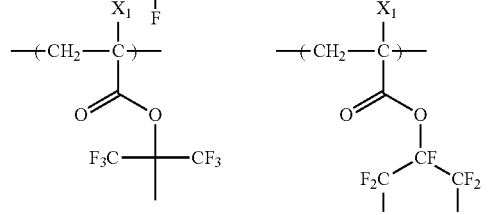
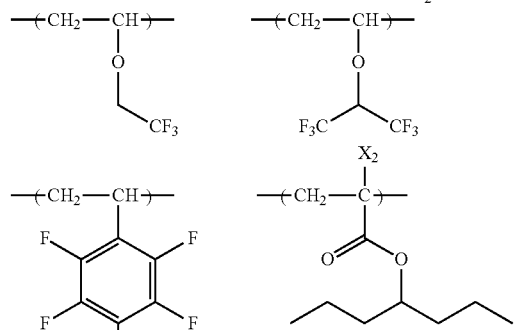
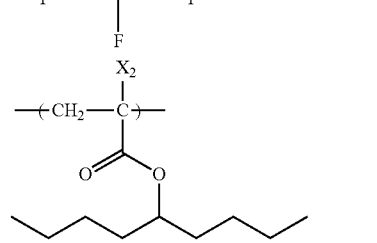
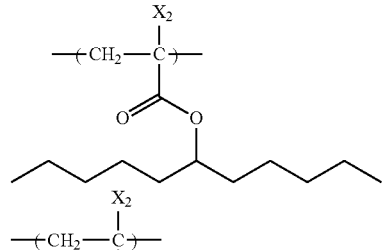
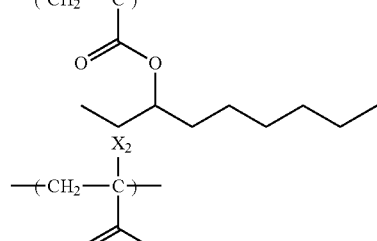
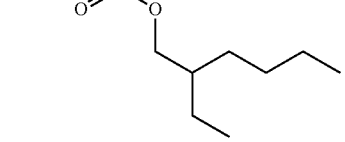

-continued

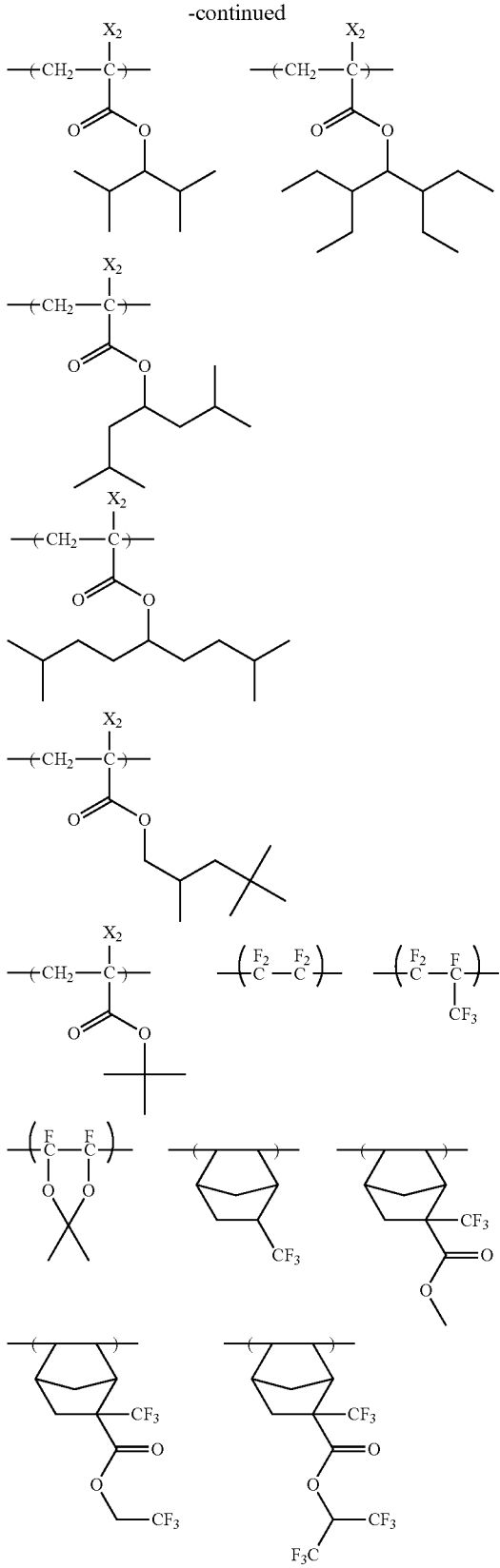

When hydrophobic resin (HR) contains a silicon atom, it is preferred for the resin to contain an alkylsilyl structure or a cyclosiloxane structure as a partial structure containing a silicon atom. The alkylsilyl structure is preferably a structure containing a trialkylsilyl group.

As preferred examples of the alkylsilyl structures and cyclosiloxane structures, there can be mentioned the groups of general formulae (CS-1) to (CS-3) below.

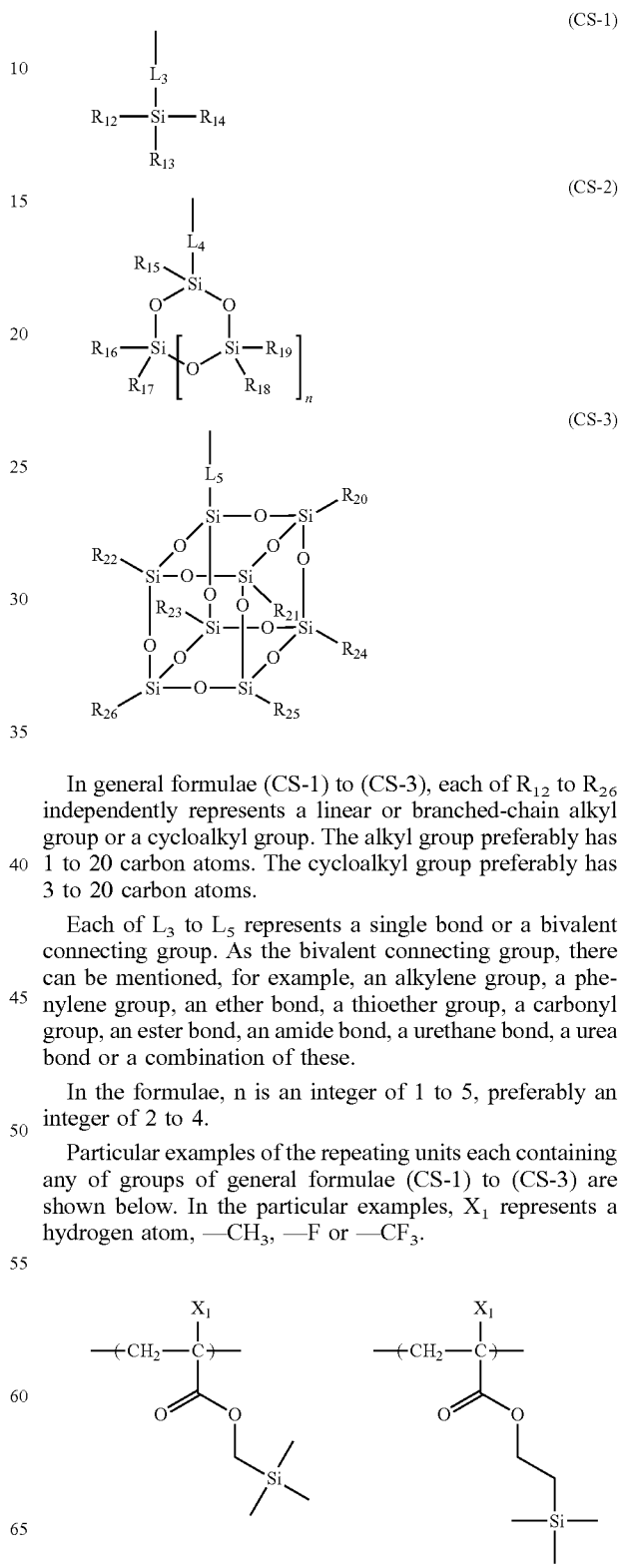

In general formulae (CS-1) to (CS-3), each of $R_{12}$ to $R_{26}$ independently represents a linear or branched-chain alkyl group or a cycloalkyl group. The alkyl group preferably has 1 to 20 carbon atoms. The cycloalkyl group preferably has 3 to 20 carbon atoms.

Each of $L_3$ to $L_5$ represents a single bond or a bivalent connecting group. As the bivalent connecting group, there can be mentioned, for example, an alkylene group, a phenylene group, an ether bond, a thioether group, a carbonyl group, an ester bond, an amide bond, a urethane bond, a urea bond or a combination of these.

In the formulae, n is an integer of 1 to 5, preferably an integer of 2 to 4.

Particular examples of the repeating units each containing any of groups of general formulae (CS-1) to (CS-3) are shown below. In the particular examples, $X_1$ represents a hydrogen atom, —$CH_3$, —F or —$CF_3$.

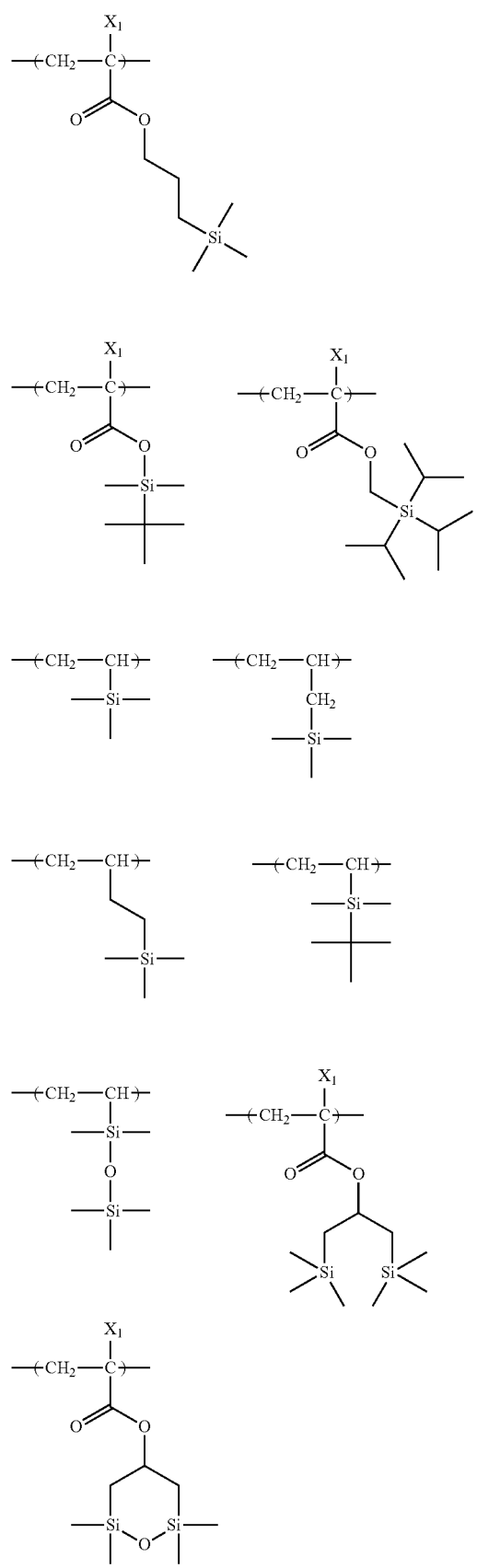
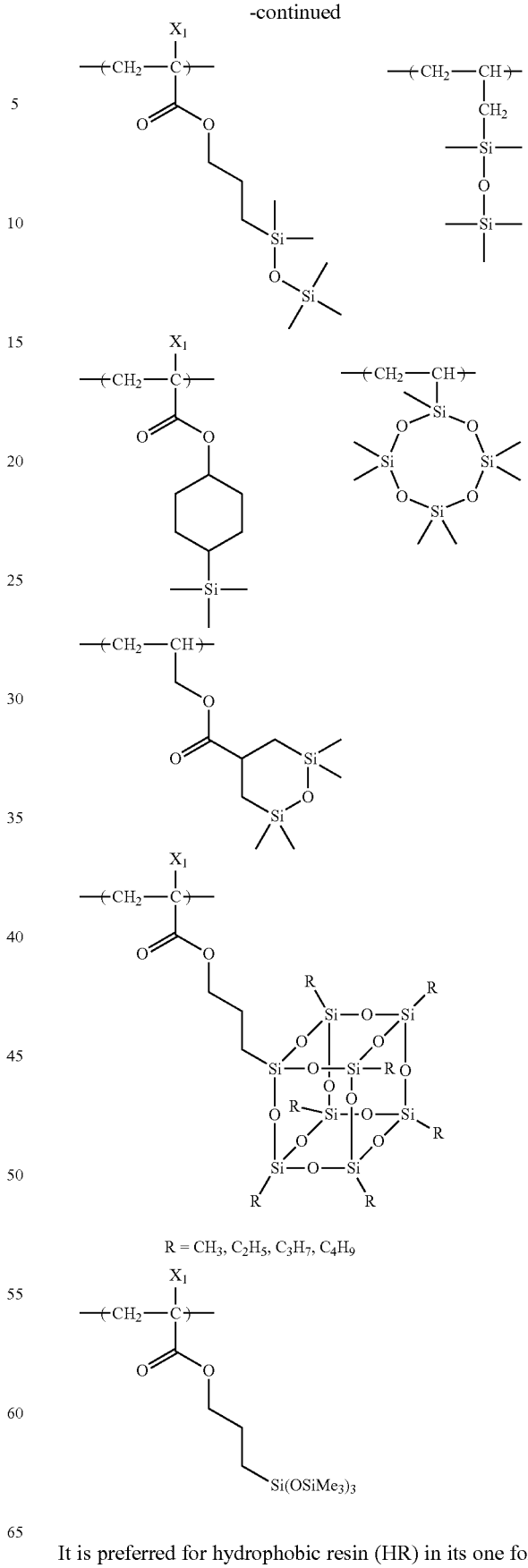
It is preferred for hydrophobic resin (HR) in its one form to contain a repeating unit containing a basic group or a group whose basicity is increased under the action of an acid (hereinafter also referred to as "basic moiety"). For example, the hydrophobic resin may be a resin (hereinafter also referred to as "resin (HR-a)") containing a repeating unit in which at least either a fluorine atom or a silicon atom is introduced and a repeating unit in which a basic moiety is introduced, and may be a resin (hereinafter also referred to as "resin (HR-b)") containing a repeating unit in which not only at least either a fluorine atom or a silicon atom but also a basic moiety is introduced.

With respect to resin (HR-a), particular examples of repeating units in which at least either a fluorine atom or a silicon atom is introduced are as set forth above.

With respect to resin (HR-a), it is preferred for the repeating unit containing a basic group or a group whose basicity is increased under the action of an acid to be any of repeating units of general formula (B-I) below.

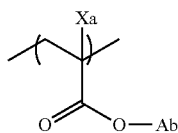

(B-I)

In general formula (B-I), Xa represents a hydrogen atom, an optionally substituted methyl group or any of groups of the formula —$CH_2R_9$. $R_9$ represents a hydroxyl group or a monovalent organic group. The monovalent organic group is, for example, an alkyl group having 5 or less carbon atoms or an acyl group having 5 or less carbon atoms. Preferably, the monovalent organic group is an alkyl group having 3 or less carbon atoms, more preferably a methyl group. Xa is preferably a hydrogen atom, a methyl group, a trifluoromethyl group or a hydroxymethyl group; more preferably a hydrogen atom, a methyl group or a hydroxymethyl group.

Ab represents a group containing a basic group, or a group containing a group whose basicity is increased under the action of an acid.

In Ab, it is preferred for both the basic group and the group whose basicity is increased under the action of an acid to contain a nitrogen atom.

The group containing a basic group represented by Ab is preferably a group with any of skeletons of the basic compounds set forth above as "basic compounds," or an ammonium group.

With respect to resin (HR-b), particular examples of the repeating units in which not only at least either a fluorine atom or a silicon atom but also a basic moiety is introduced are shown below.

Particular examples of the repeating units each containing a basic group or a group whose basicity is increased under the action of an acid introduced in resin (HR) are shown below, which in no way limit the present invention. In the particular examples, X represents a hydrogen atom, —$CH_3$, —$CH_2OH$, —F or —$CF_3$.

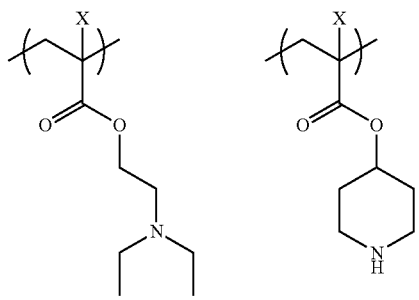

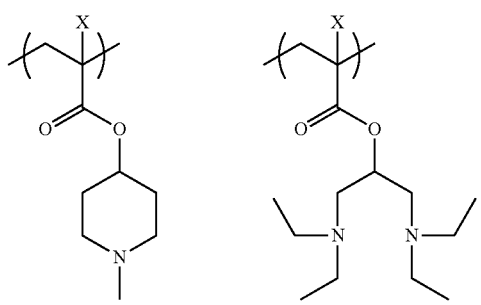

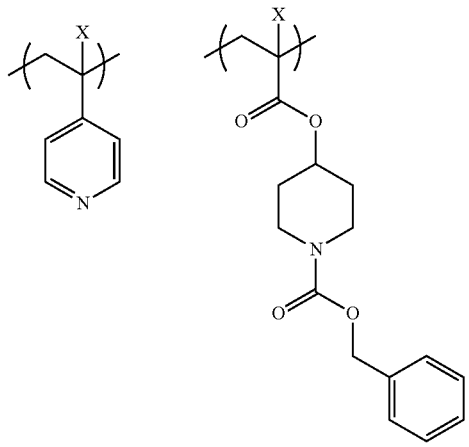

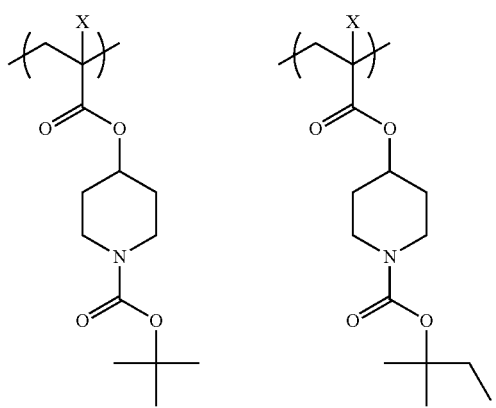

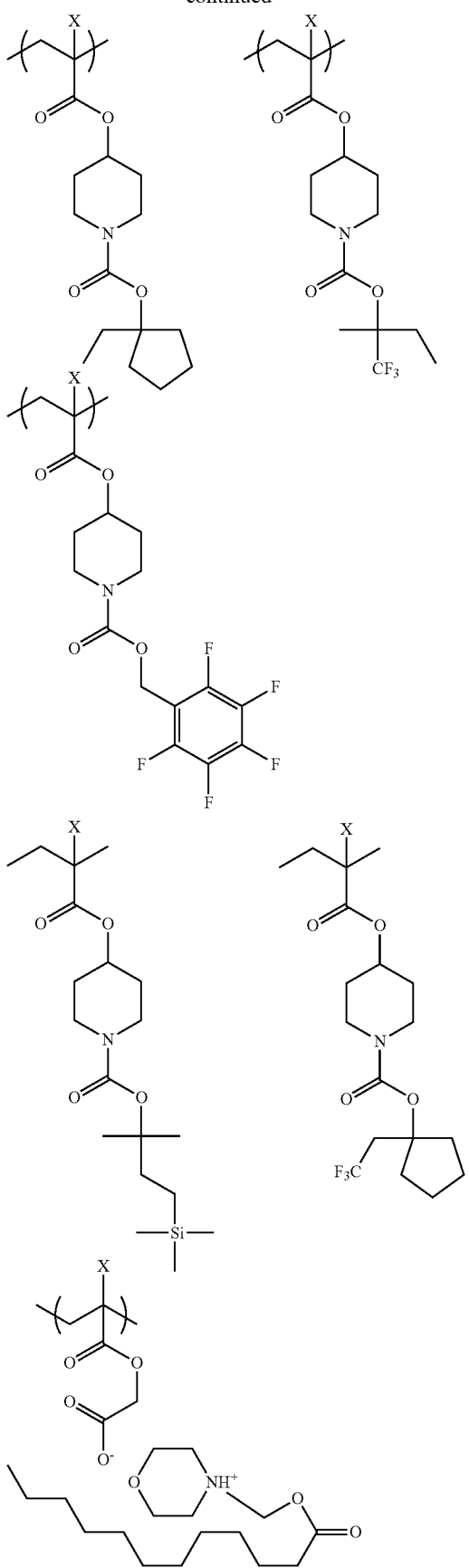

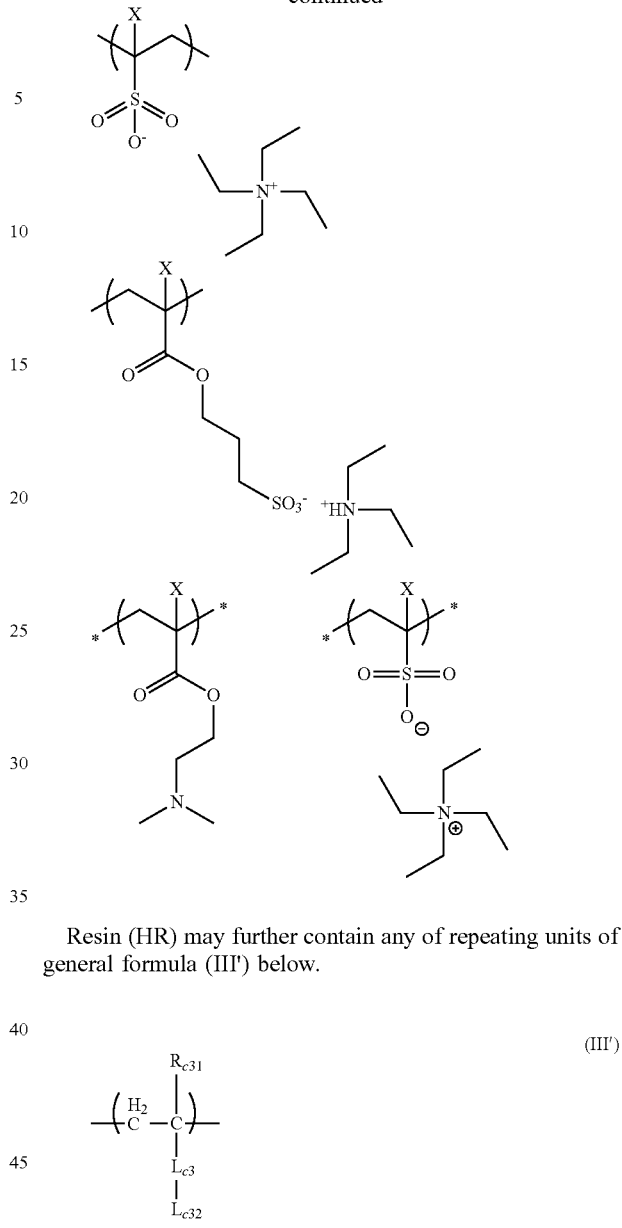

Resin (HR) may further contain any of repeating units of general formula (III') below.

$$\text{(III')}$$

$R_{c31}$ represents a hydrogen atom, an alkyl group (optionally substituted with a fluorine atom or the like), a cyano group or any of groups of the formula —$CH_2$—O—$Rac_2$ in which $Rac_2$ represents a hydrogen atom, an alkyl group or an acyl group.

$R_{c31}$ is preferably a hydrogen atom, a methyl group or a trifluoromethyl group, most preferably a hydrogen atom or a methyl group.

$R_{c32}$ represents a group containing an alkyl group, cycloalkyl group, alkenyl group, cycloalkenyl group or aryl group. This group may be substituted with a group containing a silicon atom, a fluorine atom or the like.

$L_{c3}$ represents a single bond or a bivalent connecting group.

The alkyl group in $R_{c32}$ is preferably a linear or branched-chain alkyl group having 3 to 20 carbon atoms.

The cycloalkyl group preferably has 3 to 20 carbon atoms.

The alkenyl group preferably has 3 to 20 carbon atoms.

The cycloalkenyl group is preferably a cycloalkenyl group having 3 to 20 carbon atoms.

Preferably, $R_{c32}$ is an unsubstituted alkyl group or an alkyl group having at least one hydrogen atom thereof replaced by a fluorine atom.

$L_{c3}$ represents a single bond or a bivalent connecting group. This bivalent connecting group is, for example, an ester group, an alkylene group (preferably having 1 to 5 carbon atoms), an oxy group, a phenylene group, an ester bond (group of the formula —COO—) or a group comprised of a combination of two or more of these. A connecting group having 1 to 12 carbon atoms in total is preferred.

Resin (HR) may further contain any of repeating units of general formula (CII-AB) below.

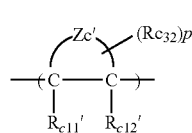

(CII-AB)

In formula (CII-AB), each of $R_{c11}'$ and $R_{c12}'$ independently represents a hydrogen atom, a cyano group, a halogen atom or an alkyl group. Zc' represents an atomic group required for the formation of an alicyclic structure in cooperation with two carbon atoms (C—C) to which $R_{c11}'$ and $R_{c12}'$ are bonded.

$R_{c32}$ represents a substituent introducible in the above alicyclic structure. The definition thereof is the same as that of $R_{c32}$ in general formula (III').

In the formula, p is an integer of 0 to 3, preferably 0 or 1.

Particular examples of the repeating units of general formula (III') and (CII-AB) are shown below. In the particular examples, Ra represents H, $CH_3$, $CH_2OH$, $CF_3$ or CN.

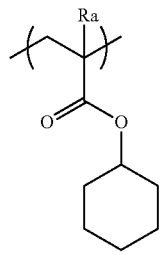
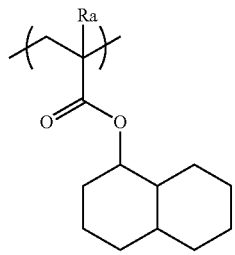
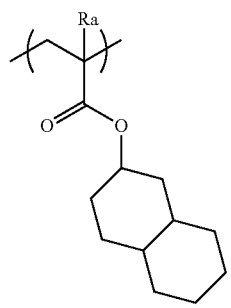
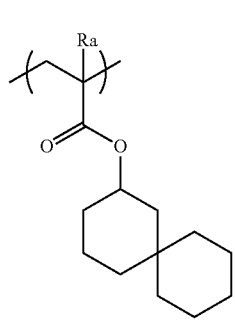

-continued

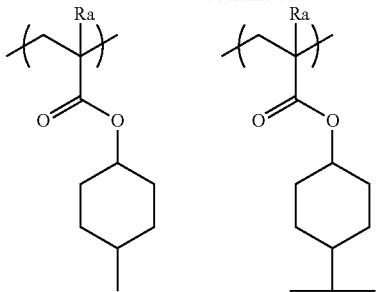
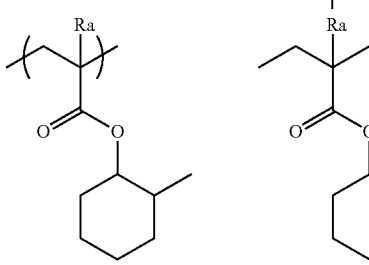
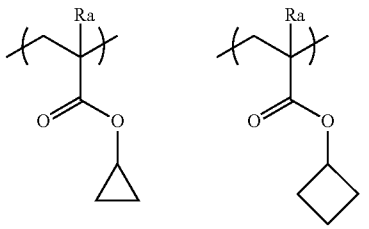
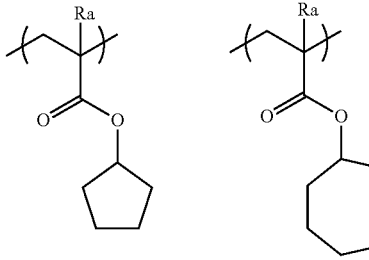
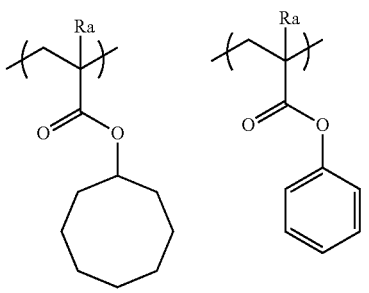
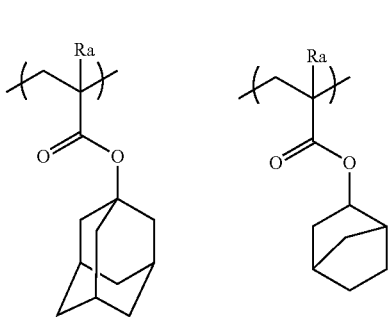

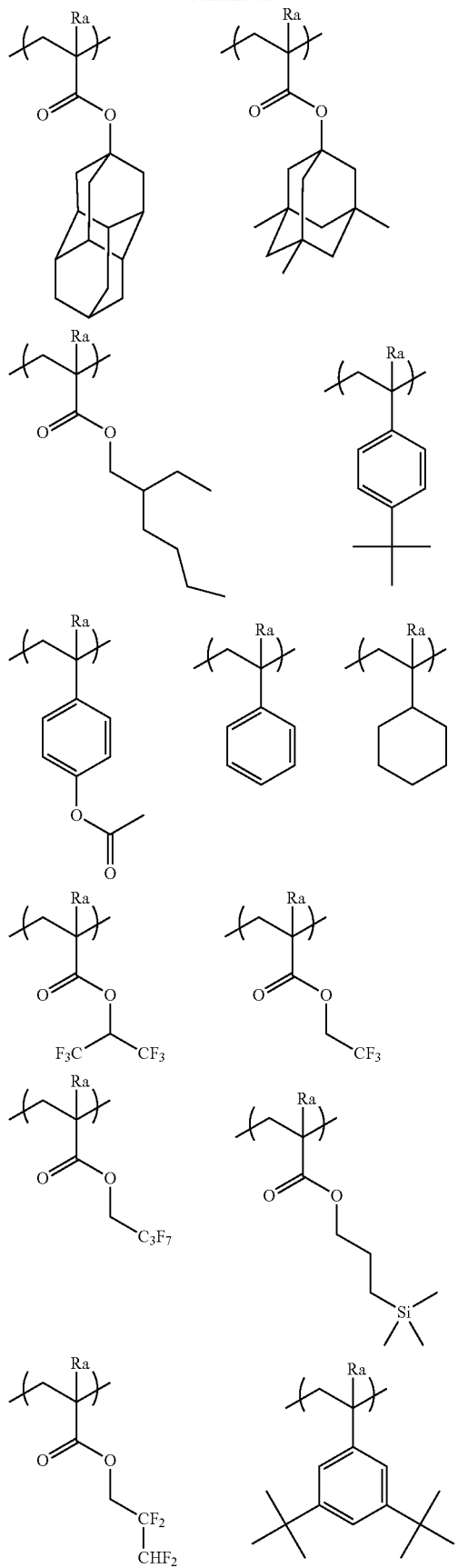
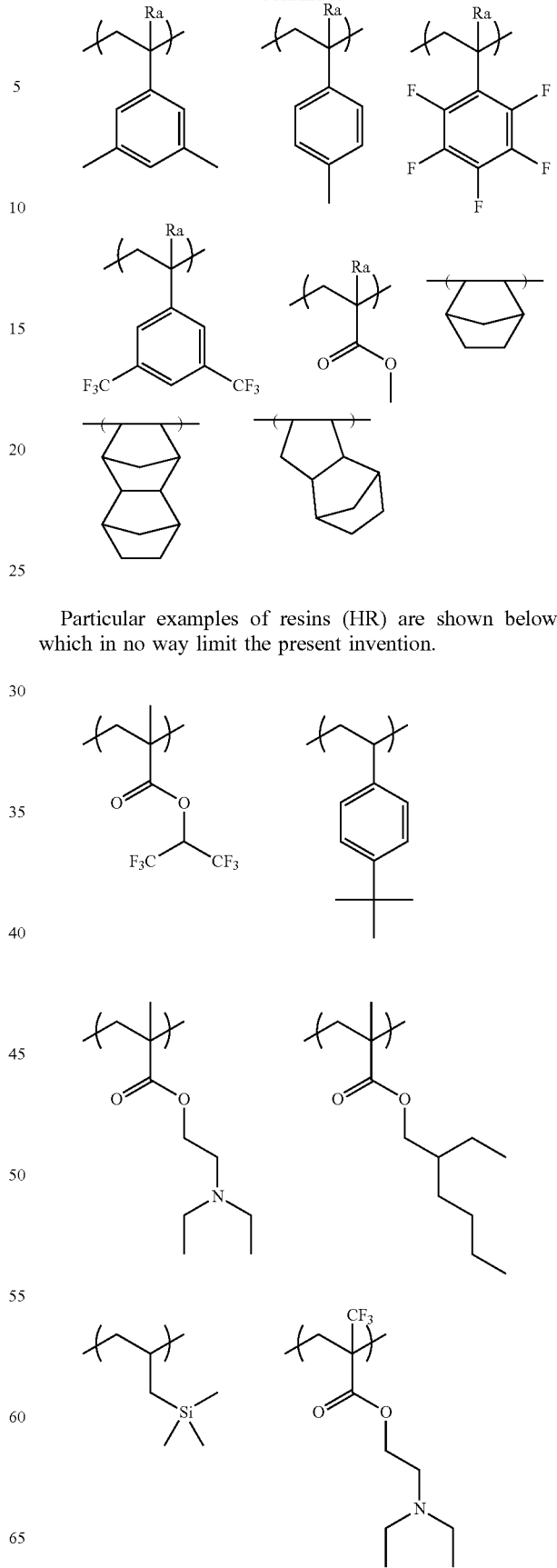
Particular examples of resins (HR) are shown below, which in no way limit the present invention.

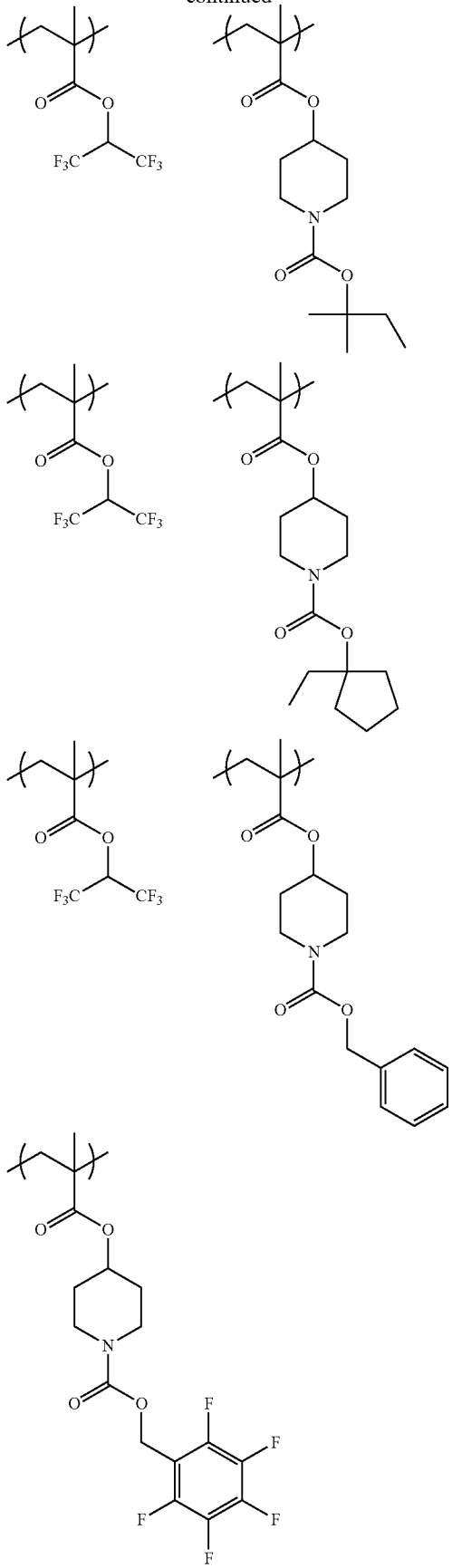

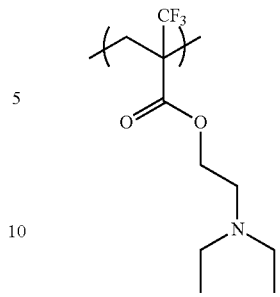

When hydrophobic resin (HR) contains a fluorine atom, the content of fluorine atom, based on the molecular weight of hydrophobic resin (HR), is preferably in the range of 5 to 80%, more preferably 10 to 80%.

When hydrophobic resin (HR) contains a silicon atom, the content of silicon atom is preferably in the range of 2 to 50%, more preferably 2 to 30%, based on the molecular weight of hydrophobic resin (HR).

When the content of fluorine atom or silicon atom based on the molecular weight of hydrophobic resin (HR) falls within the above range, a fluorine atom or a silicon atom is satisfactorily contained in hydrophobic resin (HR). Accordingly, the surface free energy of hydrophobic resin (HR) can be satisfactorily lowered, so that hydrophobic resin (HR) can be localized in the surface layer portion of the resist film with high certainty. This realizes trapping of any excess acid produced in the surface layer of exposed areas with high certainty to thereby uniformize the acid concentration distribution in the thickness direction of exposed areas of the resist film with high certainty. Therefore, it can be expected that the above-mentioned failure, such as T-top shape or bridge defect, can be suppressed with high certainty.

The content of "repeating unit in which at least either a fluorine atom or a silicon atom is introduced" in resin (HR-a) is preferably in the range of 20 to 99 mol %, more preferably 25 to 95 mol % and most preferably 30 to 90 mol %, based on all the repeating units constructing hydrophobic resin (HR).

The content of "repeating unit containing a basic group or a group whose basicity is increased under the action of an acid" in resin (HR-a) is preferably 15 mol % or less, more preferably 8 mol % or less and most preferably 1 to 8 mol %, based on all the repeating units constructing hydrophobic resin (HR).

The content of "repeating unit containing not only at least either a fluorine atom or a silicon atom but also a basic group or a group whose basicity is increased under the action of an acid" in resin (HR-b) is preferably in the range of 20 to 100 mol %, more preferably 25 to 100 mol % and most preferably 30 to 100 mol %, based on all the repeating units constructing hydrophobic resin (HR).

The content of repeating unit expressed by general formula (III') or (CII-AB) in hydrophobic resin (HR) is preferably in the range of 20 to 80 mol %, more preferably 25 to 70 mol % and most preferably 30 to 60 mol %, based on all the repeating units constructing hydrophobic resin (HR).

The weight average molecular weight of resin (HR), in terms of polystyrene-equivalent value measured by GPC, is preferably in the range of 1000 to 100,000, more preferably 1000 to 50,000 and further more preferably 7500 to 15,000.

The polydispersity index of resin (HR) is preferably in the range of 1 to 5, more preferably 1 to 3 and further more preferably 1 to 2. This makes it feasible to attain enhanced resolution, pattern shape and roughness characteristics.

One of hydrophobic resins (HR) may be used alone, or two or more thereof may be used in combination.

The content of hydrophobic resin (HR), based on the total solids of the composition, is preferably in the range of 0.01 to 10 mass %, more preferably 0.05 to 8 mass % and further more preferably 0.1 to 5 mass %.

Commercially available products may be used as hydrophobic resin (HR). Also, use may be made of those synthesized in accordance with routine methods. As general synthesizing methods for hydrophobic resin (HR), there can be mentioned, for example, those described above in connection with resin (B).

Impurities, such as metals, should naturally be in low quantities in hydrophobic resin (HR). In particular, the amount of residual monomers and oligomer components is preferably 0 to 10 mass %, more preferably 0 to 5 mass % and further more preferably 0 to 1 mass %. This makes it feasible to diminish the amount of in-liquid foreign matter and to reduce any change over time of sensitivity, etc.

[6] Solvent

The composition of the present invention may comprise a solvent. Solvents are not particularly limited as long as they can be used in the preparation of the composition of the present invention. As the solvents, there can be mentioned, for example, organic solvents, such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate and an alkyl pyruvate.

As particular examples of these solvents, there can be mentioned those set forth in sections [0441] to [0455] of US Patent Application Publication No. 2008/0187860.

In the present invention, a mixed solvent comprised of a mixture of a solvent containing a hydroxyl group in its structure and a solvent containing no hydroxyl group may be used as the organic solvent.

Compounds set forth above by way of example can be appropriately selected as the solvent containing a hydroxyl group and solvent containing no hydroxyl group. The solvent containing a hydroxyl group is preferably an alkylene glycol monoalkyl ether, an alkyl lactate or the like, more preferably propylene glycol monomethyl ether (PGME, also known as 1-methoxy-2-propanol) or ethyl lactate. The solvent containing no hydroxyl group is preferably an alkylene glycol monoalkyl ether acetate, an alkyl alkoxypropionate, an optionally cyclized monoketone compound, a cyclolactone, an alkyl acetate or the like. Of these, propylene glycol monomethyl ether acetate (PGMEA, also known as 1-methoxy-2-acetoxypropane), ethyl ethoxypropionate, 2-heptanone, γ-butyrolactone, cyclohexanone and butyl acetate are especially preferred. Propylene glycol monomethyl ether acetate, ethyl ethoxypropionate and 2-heptanone are most preferred.

The mixing ratio (by mass) of a solvent containing a hydroxyl group and a solvent containing no hydroxyl group is in the range of 1/99 to 99/1, preferably 10/90 to 90/10 and more preferably 20/80 to 60/40. A mixed solvent in which a solvent containing no hydroxyl group is contained in an amount of 50 mass % or more is especially preferred from the viewpoint of uniform applicability.

In an aspect of the present invention, the solvent preferably contains propylene glycol monomethyl ether acetate. It is preferred for the solvent to be one comprised only of propylene glycol monomethyl ether acetate or a mixed solvent comprised of two or more solvents in which propylene glycol monomethyl ether acetate is contained.

In another aspect, it is preferred for the solvent to be a mixed solvent containing γ-butyrolactone (compound of formula (7) below). In that instance, the content of γ-butyrolactone, based on the whole mass of the solvent, is preferably 10 mass % or less, more preferably 5 mass % or less. The lower limit value is not particularly specified. However, typically, the content is 0.1 mass % or more.

(7)

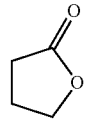

[7] Surfactant

It is optional for the composition of the present invention to further comprise a surfactant. When a surfactant is contained, it is preferred for the composition to contain any one, or two or more, of fluorinated and/or siliconized surfactants (fluorinated surfactant, siliconized surfactant and surfactant containing both fluorine and silicon atoms).

By virtue of the incorporation of a surfactant in the actinic-ray- or radiation-sensitive resin composition of the present invention, a resist pattern ensuring diminished adhesion and development defects can be formed with favorable sensitivity and resolution, in the event of using an exposure light source of 250 nm or shorter, especially 220 nm or shorter.

As the fluorinated and/or siliconized surfactants, there can be mentioned those described in section [0276] of US Patent Application Publication No. 2008/0248425. For example, there can be mentioned Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by DIC Corporation), Surflon S-382, SC101, 102, 103, 104, 105, 106 and KH-20 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA SOLUTIONS, INC.), and FTX-204G, 208G, 218G, 230G, 204D, 208D, 212D, 218D and 222D (produced by NEOS). Further, polysiloxane polymer KP-341 (produced by Shin-Etsu Chemical Co., Ltd.) can be employed as a siliconized surfactant.

As the surfactant, besides the above generally known surfactants, use can be made of a surfactant based on a polymer containing a fluoroaliphatic group derived from a fluoroaliphatic compound, which polymer is produced by a telomerization technique (also known as a telomer process) or an oligomerization technique (also known as an oligomer process). The fluoroaliphatic compound can be synthesized by the process described in JP-A-2002-90991.

As such surfactants, there can be mentioned Megafac F178, F-470, F-473, F-475, F-476 and F-472 (produced by DIC Corporation); a copolymer from an acrylate (or methacrylate) containing a $C_6F_{13}$ group and a poly(oxyalkylene) acrylate (or methacrylate); a copolymer from an acrylate (or methacrylate) containing a $C_3F_7$ group, polyoxyethylene)

acrylate (or methacrylate) and poly(oxypropylene) acrylate (or methacrylate); and the like.

Moreover, in the present invention, use can be made of surfactants other than the fluorinated and/or siliconized surfactants, described in section [0280] of US Patent Application Publication No. 2008/0248425.

One of these surfactants may be used alone, or some thereof may be used in combination.

When the actinic-ray- or radiation-sensitive resin composition contains a surfactant, the amount of surfactant added is preferably in the range of 0.0001 to 2 mass %, more preferably 0.0005 to 1 mass %, based on the total mass (excluding any solvent) of the actinic-ray- or radiation-sensitive resin composition.

When the amount of surfactant added is controlled at 10 ppm or less based on the total mass (excluding any solvent) of the actinic-ray- or radiation-sensitive resin composition, the localization of resin (HR) according to the present invention in the surface layer is promoted to thereby cause the surface of the resist film to be highly hydrophobic, so that the water tracking property in the stage of liquid-immersion exposure can be enhanced.

[10] Other Additive

According to necessity, the composition of the present invention may further comprise a dye, a plasticizer, a photosensitizer, a light absorber, an alkali-soluble resin, a dissolution inhibitor, a compound capable of accelerating the dissolution in a developer (for example, a phenol compound of 1000 or less molecular weight, or a carboxylated alicyclic or aliphatic compound), etc.

The above phenol compound of 1000 or less molecular weight can be easily synthesized by persons of ordinary skill in the art to which the present invention pertains while consulting the processes described in, for example, JP-A's H4-122938 and H2-28531, U.S. Pat. No. 4,916,210 and European Patent 219294.

As the carboxylated alicyclic or aliphatic compound, there can be mentioned, for example, a carboxylic acid derivative with a steroid structure, such as cholic acid, deoxycholic acid or lithocholic acid, an adamantanecarboxylic acid derivative, adamantanedicarboxylic acid, cyclohexanecarboxylic acid, cyclohexanedicarboxylic acid or the like. These are however nonlimiting.

From the viewpoint of enhancement of resolving power, the composition of the present invention is preferably used in a film thickness of 30 to 250 nm. More preferably, the composition is used in a film thickness of 30 to 200 nm. This film thickness can be attained by setting the solid content of the composition within an appropriate range so as to cause the composition to have an appropriate viscosity, thereby improving the applicability and film forming property.

The solid content of the composition according to the present invention is generally in the range of 1.0 to 10 mass %, preferably 2.0 to 5.7 mass % and more preferably 2.0 to 5.3 mass %. Not only can the resist solution be uniformly applied onto substrates but also a resist pattern excelling in line width roughness, by regulating the solid content so as to fall within the above range. The reason therefor is not apparent. However, it can be presumed that, by regulating the solid content at 10 mass % or less, preferably 5.7 mass % or less, any aggregation of materials, especially a photoacid generator, in the resist solution can be inhibited, resulting in the formation of a uniform resist film.

The solid content refers to the percentage of the weight of non-solvent resist components based on the total weight of the actinic-ray- or radiation-sensitive resin composition.

The actinic-ray- or radiation-sensitive resin composition of the present invention is used in such a manner that the above-mentioned components are dissolved in a given organic solvent, preferably the above-mentioned mixed solvent, and filtered and applied onto a given support (substrate). The filter medium for use in the filtration is preferably one made of a polytetrafluoroethylene, polyethylene or nylon that has a pore size of 0.1 μm or less, preferably 0.05 μm or less and more preferably 0.03 μm or less. In the filtration, as described in, for example, JP-A-2002-62667, a cyclic filtration may be carried out, or multiple types of filters may be connected in series or parallel. Moreover, the composition may be filtered a plurality of times. Further, the composition may be, for example, deaerated prior to and/or after the filtration.

<Method of Forming Pattern>

Now, the method of forming a pattern according to the present invention will be described.

The method of forming a pattern according to the present invention comprises at least the operations of:

(i) forming a film (resist film) comprising the actinic-ray- or radiation-sensitive resin composition of the present invention, (ii) exposing the film to actinic rays or radiation, and (iii) developing the film having been exposed to actinic rays or radiation with a developer.

In the operation (ii) above, the exposure may be a liquid-immersion exposure.

The pattern forming method of the present invention preferably comprises a baking operation (iv) conducted after the exposing operation (ii).

The pattern forming method of the present invention may comprise a plurality of exposing operations (ii).

The pattern forming method of the present invention may comprise a plurality of baking operations (iv).

The resist film of the present invention is one formed from the above actinic-ray- or radiation-sensitive resin composition of the present invention. In particular, the film is preferably one formed by coating a substrate with the actinic-ray- or radiation-sensitive resin composition. In the pattern forming method of the present invention, the operation of forming the film of the actinic-ray- or radiation-sensitive resin composition on a substrate, the operation of exposing the film to light, and the developing operation can be performed using generally known methods.

The pattern forming method preferably comprises the operation of prebake (PB) performed after the film formation but prior to the exposing operation.

Also, the pattern forming method preferably comprises the operation of post-exposure bake (PEB) performed after the exposing operation but prior to the developing operation.

In both PB and PEB, the baking is preferably performed at 70 to 130° C., more preferably 80 to 120° C.

The baking time is preferably in the range of 30 to 300 seconds, more preferably 30 to 180 seconds and further more preferably 30 to 90 seconds.

The baking can be performed by means provided in the common exposure/developing equipment. The baking can also be performed using a hot plate or the like.

The baking accelerates the reaction in exposed areas, so that the sensitivity and pattern profile can be enhanced.

The wavelength of light source for use in the exposure apparatus in the present invention is not particularly limited. Use can be made of infrared rays, visible light, ultraviolet rays, far ultraviolet rays, extreme ultraviolet light, X-rays, electron beams, etc. Use is made of far ultraviolet rays of wavelength preferably 250 nm or shorter, more preferably 220 nm or shorter and most preferably 1 to 200 nm, such as a KrF excimer laser (248 nm), an ArF excimer laser (193 nm) and an $F_2$ excimer laser (157 nm), X-rays, EUV (13 nm), electron beams, etc. A KrF excimer laser, an ArF excimer laser, EUV and electron beams are preferred. An ArF excimer laser is more preferred.

A technique of liquid immersion exposure can be employed in the exposing operation according to the present invention. The technique of liquid immersion exposure can be combined with a super-resolution technology, such as a phase shift method or a modified illumination method.

When the liquid immersion exposure is performed, the operation of washing the film surface with an aqueous chemical liquid may be carried out (1) after the film formation on a substrate but prior to the operation of exposure, and/or (2) after the operation of exposing the film to light via the immersion liquid but before the operation of baking the film.

The immersion liquid is preferably comprised of a liquid being transparent in exposure wavelength, whose temperature coefficient of refractive index is as low as possible so as to ensure minimization of any distortion of optical image projected on the film. Especially in the use of an ArF excimer laser (wavelength: 193 nm) as an exposure light source, it is preferred to use water from not only the above viewpoint but also the viewpoint of easy procurement and easy handling.

In the use of water, an additive (liquid) capable of not only decreasing the surface tension of water but also increasing an interface activating power may be added thereto in a slight proportion. It is preferred for this additive to be one that does not dissolve the resist layer on the wafer and that is negligible with respect to its influence on any optical coat applied to an under surface of lens element.

This additive is preferably, for example, an aliphatic alcohol exhibiting a refractive index approximately equal to that of water, such as methyl alcohol, ethyl alcohol, isopropyl alcohol or the like. The addition of an alcohol exhibiting a refractive index approximately equal to that of water is advantageous in that even when the alcohol component is evaporated from water to thereby cause a change of content concentration, any change of refractive index of the liquid as a whole can be minimized.

On the other hand, when a substance being opaque in 193 nm light or an impurity whose refractive index is greatly different from that of water is mingled in the immersion water, the optical image projected on the resist is distorted. Accordingly, it is preferred to use distilled water as the immersion water. Further, use may be made of pure water having been filtered through an ion exchange filter or the like.

Desirably, the electrical resistance of the water used as the immersion liquid is 18.3 MΩcm or greater, and the TOC (organic matter concentration) thereof is 20 ppb or below. Prior deaeration of the water is desired.

The lithography performance can be enhanced by raising the refractive index of the immersion liquid. From this viewpoint, an additive suitable for increasing the refractive index may be added to the water, or heavy water ($D_2O$) may be used in place of the water.

The receding contact angle of the resist film formed from the actinic-ray- or radiation-sensitive resin composition of the present invention is 70° or greater at 23±3° C. in 45±5% humidity, which is appropriate in the exposure via the liquid immersion medium. The receding contact angle is preferably 75° or greater, more preferably 75 to 85°.

When the receding contact angle is extremely small, the resist film cannot be appropriate in the exposure via the liquid immersion medium, and the effect of suppressing any residual water (watermark) defect cannot be satisfactorily exerted. For the realization of desirable receding contact angle, it is preferred to incorporate the above-mentioned hydrophobic resin (HR) in the actinic-ray- or radiation-sensitive composition. Alternatively, the receding contact angle may be increased by forming a coating layer (known as "top coat") of hydrophobic resin composition on the resist film.

In the operation of liquid immersion exposure, it is needed for the immersion liquid to move on the wafer while tracking the movement of an exposure head involving high-speed scanning on the wafer and thus forming an exposure pattern. Therefore, the contact angle of the immersion liquid with respect to the resist film in a dynamic condition is important, and it is required for the resist to be capable of tracking the high-speed scanning of the exposure head without leaving any droplets.

The substrate for film formation in the present invention is not particularly limited. Use can be made of any of an inorganic substrate of silicon, SiN, $SiO_2$ or the like, a coated inorganic substrate such as SOG and substrates commonly employed in a semiconductor production process for an IC or the like, a circuit board production process for a liquid crystal, a thermal head or the like and other photoapplication lithography processes. Further, according to necessity, an antireflection film may be provided between the resist film and the substrate. Any of heretofore known organic and inorganic antireflection films can be appropriately used as the antireflection film.

In the pattern forming method of the present invention, the developing operation (iii) may be one (iii-1) in which development is performed with a developer comprising an organic solvent. Also, the developing operation may be one (iii-2) in which development is performed with an alkali developer. The developing operation may comprise both the operations (iii-1) and (i-2). In that instance, the sequence of developments (iii-1) and (iii-2) is not critical.

In the present invention, generally, a negative pattern is formed through the operation (iii-1) of developing with a developer comprising an organic solvent, while a positive pattern is formed through the operation (iii-2) of developing with an alkali developer. When both the operations (iii-1) and (iii-2) are conducted, a pattern of resolution corresponding to twice the frequency of optical aerial image can be obtained as illustrated in, for example, FIGS. 1 to 11 in U.S. Pat. No. 8,227,183 B.

As the developer (hereinafter also referred to as organic developer) for use in the operation (iii-1) of developing with a developer comprising an organic solvent in the pattern forming method of the present invention, use can be made of a polar solvent, such as a ketone solvent, an ester solvent, an alcohol solvent, an amide solvent or an ether solvent, and a hydrocarbon solvent.

As the ketone solvent, there can be mentioned, for example, 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate or the like.

As the ester solvent, there can be mentioned, for example, methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate or the like.

As the alcohol solvent, there can be mentioned, for example, an alcohol, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; or the like.

As the ether solvent, there can be mentioned, for example, not only any of the above-mentioned glycol ether solvents but also dioxane, tetrahydrofuran or the like.

As the amide solvent, use can be made of, for example, N-methyl-2-pyrrolidone, N,N-dimethylacetamide, N,N-dimethylformamide, hexamethylphosphoric triamide, 1,3-dimethyl-2-imidazolidinone or the like.

As the hydrocarbon solvent, there can be mentioned, for example, an aromatic hydrocarbon solvent, such as toluene or xylene, or an aliphatic hydrocarbon solvent, such as pentane, hexane, octane or decane.

In particular, it is preferred for the organic developer to be a developer comprising at least one organic solvent selected from the group consisting of ketone solvents and ester solvents. Developers comprising butyl acetate as an ester solvent and methylamyl ketone (2-heptanone) as a ketone solvent are especially preferred.

A plurality of solvents may be mixed together before use. Alternatively, each of these solvents may be used in a mixture with a solvent other than those mentioned above or water. However, from the viewpoint of the fullest exertion of the effects of the present invention, it is preferred for the water content of the developer as a whole to be less than 10 mass %. More preferably, the developer contains substantially no trace of water.

Namely, the amount of organic solvent used in the organic developer is preferably in the range of 90 to 100 mass %, more preferably 95 to 100 mass %, based on the whole mass of the developer.

The vapor pressure of the organic developer at 20° C. is preferably 5 kPa or below, more preferably 3 kPa or below and most preferably 2 kPa or below. When the vapor pressure of the organic developer is 5 kPa or below, any evaporation of the developer on a substrate or in a development cup can be suppressed, so that the temperature uniformity within the plane of the wafer can be enhanced to thereby improve the dimensional uniformity within the plane of the wafer.

According to necessity, an appropriate amount of surfactant can be added to the organic developer.

The surfactant is not particularly limited. For example, use can be made of any of ionic and nonionic fluorinated and/or siliconized surfactants and the like. As such fluorinated and/or siliconized surfactants, there can be mentioned, for example, those described in JP-A's S62-36663, S61-226746, S61-226745, S62-170950, S63-34540, H7-230165, H8-62834, H9-54432 and H9-5988 and U.S. Pat. Nos. 5,405,720, 5,360,692, 5,529,881, 5,296,330, 5,436,098, 5,576,143, 5,294,511 and 5,824,451. Nonionic surfactants are preferred. Although nonionic surfactants are not particularly limited, using a fluorinated surfactant or siliconized surfactant is more preferred.

The amount of surfactant added is generally in the range of 0.001 to 5 mass %, preferably 0.005 to 2 mass % and more preferably 0.01 to 0.5 mass % based on the whole mass of the developer.

As the developing method, use can be made of, for example, a method in which the substrate is dipped in a tank filled with a developer for a given period of time (dip method), a method in which a developer is puddled on the surface of the substrate by its surface tension and allowed to stand still for a given period of time to thereby effect development (puddle method), a method in which a developer is sprayed onto the surface of the substrate (spray method), or a method in which a developer is continuously discharged onto the substrate being rotated at a given speed while scanning a developer discharge nozzle at a given speed (dynamic dispense method).

In the above various developing methods, when the operation of discharging a developer toward a resist film through a development nozzle of a development apparatus is included, the discharge pressure of discharged developer (flow rate per area of discharged developer) is, for example, preferably 2 ml/sec/mm$^2$ or below, more preferably 1.5 ml/sec/mm$^2$ or below and further more preferably 1 ml/sec/mm$^2$ or below. There is no particular lower limit of the flow rate. However, from the viewpoint of through-put, it is preferred for the flow rate to be 0.2 ml/sec/mm$^2$ or higher. The particulars thereof are described in, for example, especially sections 0022 to 0029 of JP-A-2010-232550.

The operation of developing with a developer comprising an organic solvent may be followed by the operation of discontinuing the development by replacement with another solvent.

When the pattern forming method of the present invention comprises the operation (iii-2) of developing with an alkali developer, useful alkali developers are not particularly limited. General use is made of a 2.38 mass % aqueous tetramethylammonium hydroxide solution. Solutions of other concentrations (for example, lower concentration) can also be used. Appropriate amounts of an alcohol and a surfactant may be added to an alkaline aqueous solution before the use thereof.

The alkali concentration of the alkali developer is generally in the range of 0.1 to 20 mass %.

The pH value of the alkali developer is generally in the range of 10.0 to 15.0.

Pure water is used as a rinse liquid for use in the rinse treatment performed after the alkali development. Before the use thereof, an appropriate amount of surfactant may be added thereto.

Further, the developing operation or rinse operation may be followed by the operation of removing any portion of developer or rinse liquid adhering onto the pattern by means of a supercritical fluid.

The operation (iii-1) of developing with a developer comprising an organic solvent is preferably followed by the operation of rinsing with a rinse liquid. The rinse liquid is not particularly limited as long as it does not dissolve the resist pattern, and solutions comprising common organic solvents can be used as the same. It is preferred for the rinse liquid to be one comprising at least one organic solvent selected from the group consisting of a hydrocarbon solvent, a ketone solvent, an ester solvent, an alcohol solvent, an amide solvent and an ether solvent.

Particular examples of the hydrocarbon solvent, ketone solvent, ester solvent, alcohol solvent, amide solvent and ether solvent are the same as set forth above in connection with the developer comprising an organic solvent.

The operation (iii-1) of developing with the developer comprising an organic solvent is more preferably followed by the operation of rinsing with a rinse liquid comprising at least one organic solvent selected from the group consisting of a ketone solvent, an ester solvent, an alcohol solvent and an amide solvent; further more preferably followed by the operation of rinsing with a rinse liquid comprising an alcohol solvent or an ester solvent; especially preferably followed by the operation of rinsing with a rinse liquid comprising a monohydric alcohol; and most preferably followed by the operation of rinsing with a rinse liquid comprising a monohydric alcohol, the monohydric alcohol most preferably having 5 or more carbon atoms.

As the monohydric alcohol for use in the rinse operation, there can be mentioned a linear, branched or cyclic monohydric alcohol. In particular, use can be made of 1-hexanol, 2-hexanol, 4-methyl-2-pentanol, 1-pentanol, 3-methyl-1-butanol or the like.

Two or more of these components may be mixed together before use. Also, they may be mixed with other organic solvents before use.

The water content of the rinse liquid is preferably 10 mass % or below, more preferably 5 mass % or below and most preferably 3 mass % or below. Favorable development performance can be attained by controlling the water content of the rinse liquid at 10 mass % or below.

With respect to the rinse liquid for use after the operation of developing with a developer comprising an organic solvent, the vapor pressure thereof at 20° C. is preferably in the range of 0.05 to 5 kPa, more preferably 0.1 to 5 kPa and most preferably 0.12 to 3 kPa. When the vapor pressure of the rinse liquid is in the range of 0.05 to 5 kPa, not only can the temperature uniformity within the plane of the wafer be enhanced but also any swell attributed to the penetration of the rinse liquid can be suppressed to thereby improve the dimensional uniformity within the plane of the wafer.

An appropriate amount of surfactant may be added to the rinse liquid before use.

In the rinse operation, the wafer having undergone the development with a developer comprising an organic solvent is rinsed with the above rinse liquid comprising an organic solvent. The method of rinse treatment is not particularly limited. For example, use can be made of any of a method in which the rinse liquid is continuously discharged onto the substrate being rotated at a given speed (spin application method), a method in which the substrate is dipped in a tank filled with the rinse liquid for a given period of time (dip method), a method in which the rinse liquid is sprayed onto the surface of the substrate (spray method), etc. Preferably, the rinse treatment is carried out according to the spin application method, and thereafter the substrate is rotated at a rotating speed of 2000 to 4000 rpm to thereby remove the rinse liquid from the top of the substrate. Also, preferably, a baking operation (post bake) is carried out subsequent to the rinse operation. Any inter-pattern and intra-pattern remaining developer and rinse liquid are removed by carrying out the bake. The bake operation subsequent to the rinse operation is generally performed at 40 to 160° C., preferably 70 to 95° C., for a period of 10 seconds to 3 minutes, preferably 30 to 90 seconds.

In the organic developer, alkali developer and/or rinse liquid for use in the present invention, it is preferred to lessen the amount of impurities, such as various particulates and metal elements. For obtaining such chemicals in which the amount of impurities is less, it is preferred to carry out impurity reduction by producing chemicals in a clean room and, for example, filtering chemicals through any of various filters, such as a Teflon (registered trademark) filter, a polyolefin filter and an ion exchange filter. With respect to metal elements, the concentration of each of metal elements Na, K, Ca, Fe, Cu, Mg, Mn, Li, Al, Cr, Ni and Zn is preferably 10 ppm or less, more preferably 5 ppm or less.

The storage containers for developers and rinse liquids are not particularly limited. Appropriate use can be made of containers of a polyethylene resin, a polypropylene resin, a polyethylene-polypropylene resin, etc. being applied to electronic material usage. From the viewpoint of reducing the amount of impurities leached from a container, it is preferred to select a container in which the amount of components leached from the inside wall of the container into chemicals is less. As such a container, there can be mentioned, for example, a container whose inside wall is comprised of a perfluororesin (e.g., FluoroPurePFA combination drum (liquid-contact inside surface: PFA resin lining) manufactured by Entegris, Inc., or a steel-made drum can (liquid-contact inside surface: zinc phosphate coating) manufactured by JFE Steel Corporation).

Furthermore, the present invention relates to a process for manufacturing an electronic device in which the above-described negative pattern forming method of the present invention is included, and relates to an electronic device manufactured by the process.

The electronic device of the present invention can be appropriately mounted in electrical and electronic equipments (household electronic appliance, OA/media-related equipment, optical apparatus, telecommunication equipment and the like).

EXAMPLES

The present invention will be described in greater detail below by way of its examples. However, the gist of the present invention is in no way limited to these examples.

<Acid Generator>

Synthetic Example 1

Synthesis of Compound A-1

Synthesis of 2-(adamantane-1-carbonyloxy)-1,1-difluoroethyl-1-sulfonate was performed through condensation between 1,1-difluoro-2-hydroxyethyl-1-sulfonate and 1-adamantanecarboxylic acid chloride.

Synthesis of 4-(methoxy)-1-naphthyltetramethylenesulfene was performed through reaction between 1-(methoxy)naphthalene and tetramethylene sulfoxide in the presence of Eaton's reagent (phosphorus pentoxide-methanesulfonic acid solution).

Thereafter, 2-(adamantane-1-carbonyloxy)-1,1-difluoroethyl-1-sulfonate was mixed with 4-(methoxy)-1-naphthyltetramethylenesulfene, and a salt exchange was performed. Thus, desired compound A-1 was obtained.

Synthetic Example 2

Synthesis of Compound A-5

Synthesis of 2-(adamantane-1-carbonyloxy)-1,1-difluoroethyl-1-sulfonate was performed through condensation between 1,1-difluoro-2-hydroxyethyl-1-sulfonate and 1-adamantanecarboxylic acid chloride.

Synthesis of 4-(pentafluoroethoxy)-1-naphthyltetramethylenesulfene was performed through reaction between 1-(pentafluoroethoxy)naphthalene and tetramethylene sulfoxide in the presence of Eaton's reagent.

Thereafter, 2-(adamantane-1-carbonyloxy)-1,1-difluoroethyl-1-sulfonate was mixed with 4-(pentafluoroethoxy)-1-naphthyltetramethylenesulfene, and a salt exchange was performed. Thus, desired compound A-5 was obtained.

Synthetic Example 3

Synthesis of Compound A-7

Synthesis of adamantanemethyloxycarbonyldifluoromethane sulfonate was performed through condensation between difluorosulfoacetate and 1-(hydroxymethyl)adamantane in the presence of p-toluenesulfonic acid added.

Synthesis of 4-(trifluoromethoxy)-1-naphthyltetramethylenesulfene was performed through reaction between 1-(trifluoromethoxy)naphthalene and tetramethylene sulfoxide in the presence of Eaton's reagent.

Thereafter, adamantanemethyloxycarbonyldifluoromethane sulfonate was mixed with 4-(trifluoromethoxy)-1-naphthyltetramethylenesulfene, and a salt exchange was performed. Thus, desired compound A-7 was obtained.

The following compounds A-2 to A-4 and A-6 and comparative compound (RA-1) were synthesized by the same synthesizing method as in the above syntheses of compounds A-1, A-5 and A-7.

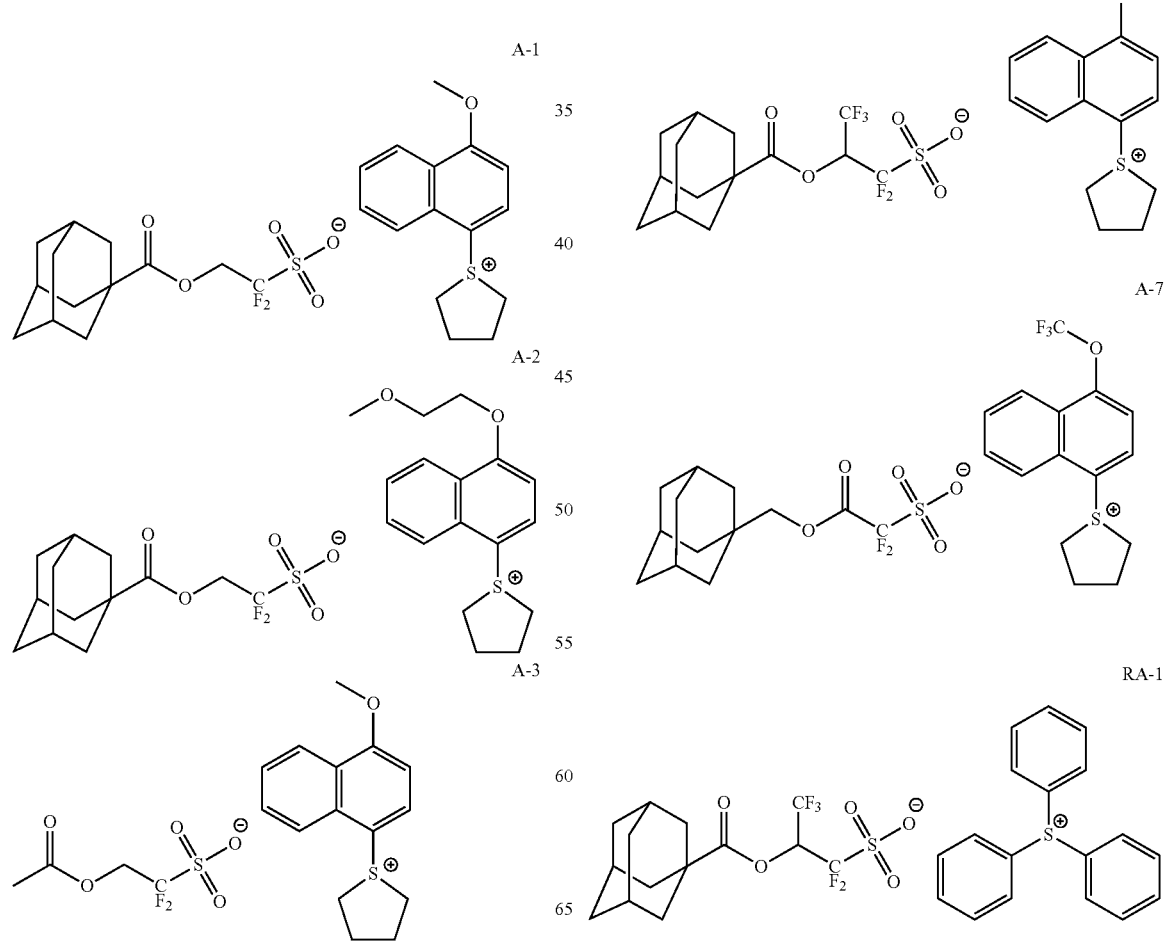

<Resin>

Synthetic Example 2

Resin B-1

In a nitrogen gas stream, cyclohexanone (24.5 g) was heated at 80° C. While agitating this liquid, a solution of mixtures comprised of the following monomer-1 (7.9 g) and monomer-2 (4.4 g) (mol ratio: 1/1) together with cyclohexanone (45.6 g) and V601 (0.60 g) (produced by Wako Pure Chemical Industries, Ltd., 6.6 mol % based on the total amount of monomer-1 and monomer-2) was dropped into the heated liquid over a period of six hours. After the completion of the dropping, agitation was continued at 80° C. for two hours. The resultant reaction liquid was allowed to stand still to cool, and precipitation was performed with heptane/ethyl acetate (mass ratio: 90/10) provided in a 7-fold amount relative to the amount of the reaction liquid. The thus obtained solid was dried in vacuum. As a result, resin (B-1) according to the present invention was obtained (yield 10.7 g, 87%).

Monomer1

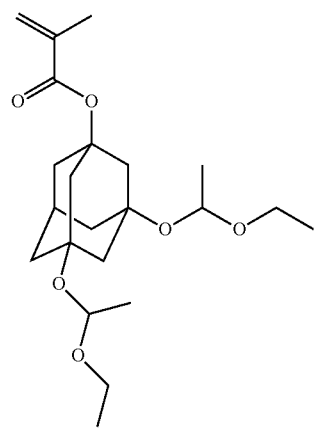

Monomer2

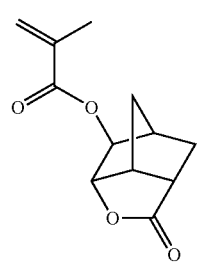

With respect to the obtained resin B-1, it was found by GPC (carrier: tetrahydrofuran (THF)) measurement that the weight average molecular weight (Mw: polystyrene-equivalent) was 10,300 and the polydispersity index (Pd) was 1.24. The component ratio determined by $^{13}$C-NMR was 50/50.

The following resins B-2 to B-4 and comparative resin RB-1 were synthesized in the same manner as described above for resin B-1. The component ratio, weight average molecular weight (Mw) and polydispersity index (Pd) of each of these resins are listed in Table 1.

B-1

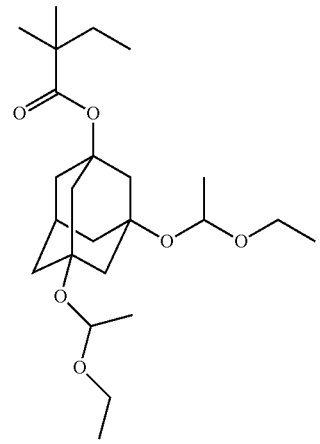

B-2

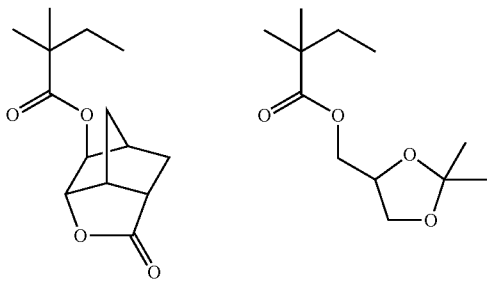

B-3

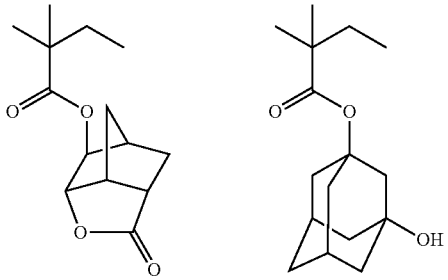

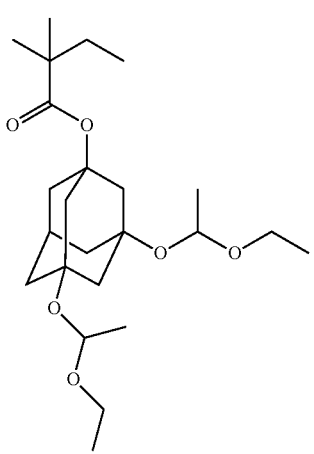

-continued
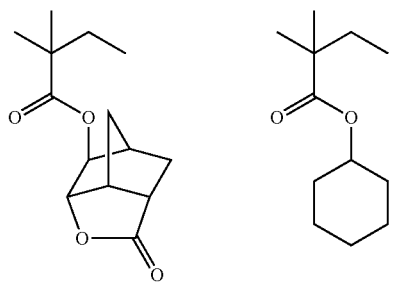
B-4
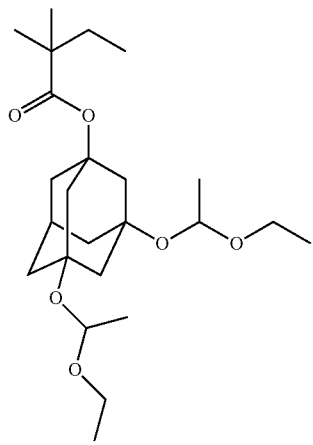
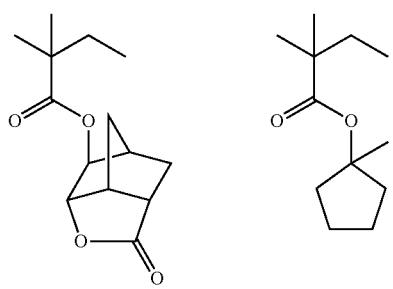
RB-1
TABLE 1
| Resin | Composition ratio | Mw | Pd |
|---|---|---|---|
| B-1 | 50/50 | 10300 | 1.24 |
| B-2 | 50/50 | 10300 | 1.46 |
| B-3 | 50/10/40 | 10100 | 1.26 |
| B-4 | 50/10/40 | 10100 | 1.3 |
| RB-1 | 50/50 | 9800 | 1.28 |
<Basic Compound>
The following compounds were used as basic compounds.
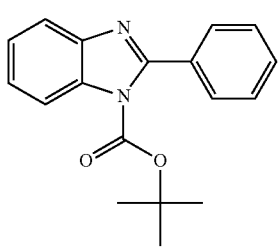
C-1
-continued
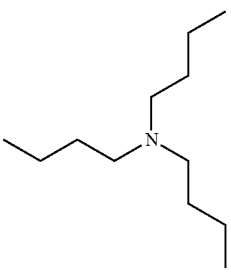
C-2
<Compound (D)>
The following compounds were used as compound (D).
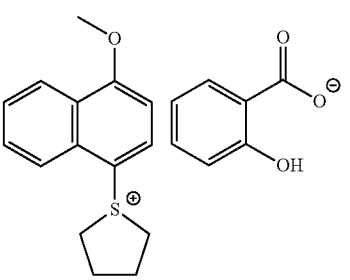
D-1
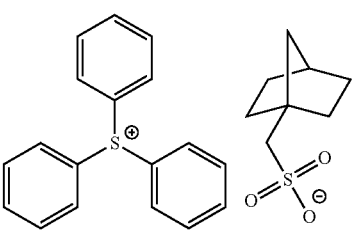
D-2
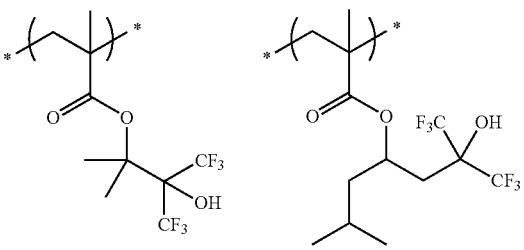
D-3
<Hydrophobic Resin (HR)>
The following resins were used as hydrophobic resin (HR).
HR-1

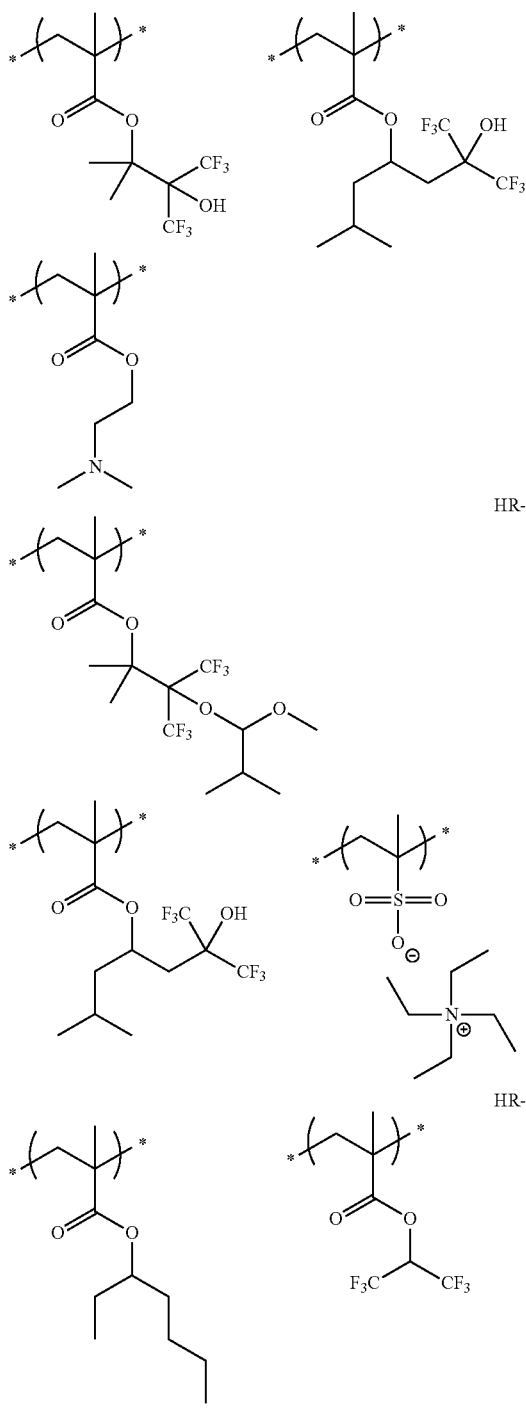

<Solvent>

The following solvents were employed.

SL1: propylene glycol monomethyl ether acetate (PG-MEA),

SL2: cyclohexanone (CyHx), and

SL3: γ-butyrolactone.

<Preparation of Resist>

Individual components were dissolved in solvents, as indicated in Table 2 to be shown hereinafter. Thus, solutions each of 3.8 mass % solid content were obtained. The solutions were each passed through a polyethylene filter of 0.03 μm pore size, thereby obtaining actinic-ray- or radiation-sensitive resin compositions (resist compositions).

<Formation of Pattern>

An organic antireflection film ARC145A (produced by Brewer Science Inc.) was applied onto a silicon wafer and baked at 205° C. for 60 seconds, thereby forming a 46 nm-thick antireflection film. Further, an organic antireflection film ARC113A (produced by Brewer Science Inc.) was applied thereonto and baked at 205° C. for 60 seconds, thereby forming a 49 nm-thick antireflection film. Each of the above prepared actinic-ray- or radiation-sensitive resin compositions was applied thereonto and baked (prebaked: PB) at 100° C. for 60 seconds, thereby forming a 100 nm-thick resist film.

The thus obtained wafer was line&space-patternwise exposed through a half-tone mask of 38 nm space portion and 90 nm inter-line pitch to light by means of an ArF excimer laser liquid immersion scanner (manufactured by ASML, XT1700i, NA1.20, C-Quad, outer sigma 0.900, inner sigma 0.812, XY deflection). Ultrapure water was used as the immersion liquid. Subsequently, the exposed wafer was baked (post-exposure bake: PEB) at 95° C. for 60 seconds, developed by puddling with a developer (butyl acetate) for 30 seconds, and rinsed by puddling with a rinse liquid (methyl isobutyl carbinol (MIBC)) for 2 seconds. Thereafter, the rinsed wafer was rotated at a rotating speed of 2000 rpm for 30 seconds, thereby obtaining a line&space pattern of 40 nm space width.

<Evaluation Method>

[Dependence on PEB Temperature (PEBS)]

In the above-mentioned exposing operation, the PEB temperature was changed to 90° C., 95° C. and 100° C. With respect to the thus formed line&space patterns, the rate of change of space CD width was calculated.

With respect to the calculating method, a plot was made pointing the CD widths, provided that the CD width at a PEB temperature of 95° C. was normalized to "1", on the vertical axis and pointing the PEB temperature on the horizontal axis. A linear approximation of the plot was effected, thereby determining the amount of normalized CD change per 10° C. on the horizontal axis. The amount of normalized CD change per 10° C. was defined as an index of dependence on PEB temperature (PEBS). The smaller this value, the favorably smaller the performance change per temperature change.

Evaluation mark A was given when the CD change was less than 10%; B when the CD change was 10% to less than 15%; C when the CD change was 15% to less than 20%; D when the CD change was 20% to less than 25%; and E when the CD change was 25% or greater. The results are listed in Table 2.

[Dependence on after-PEB Time Delay]

The resist film after PEB in the above-mentioned exposing operation was allowed to have a time delay, and development was performed after the lapse of 24 hours. The rate of change of space CD width of thus formed line&space pattern was calculated. The amount of change of normalized CD after the lapse of 24 hours was determined on the basis of CD at a time delay of 0 hour. The smaller this value, the favorably smaller the performance change per time delay.

Evaluation mark A was given when the CD change was less than 2.5%; B when the CD change was 2.5% to less than 5%; C when the CD change was 5% to less than 10%; D when the CD change was 10% to less than 12.5%; and E when the CD change was 12.5% or greater. The results are listed in Table 2.

[Focus Latitude (DOF)]

The DOF of line&space pattern formed through the above-mentioned exposing operation was calculated. On the basis of space width of a dose closest to a 40 nm space width at a focus center value, a focus margin in which the change of space width in the focus direction of the dose was 10% or less was determined. The greater this value, the larger the focal depth, namely, the more favorable the performance exhibited.

Evaluation mark A was given when this value was 0.20 μm or greater; B when the value was 0.175 μm to less than 0.20 μm; C when the value was 0.15 μm to less than 0.175 μm; D when the value was 0.125 μm to less than 0.15 μm; and E when the value was less than 0.125 μm. The results are listed in Table 2.

acid when exposed to actinic rays or radiation, the compound expressed by general formula (1) or (2) below, and a resin (B) containing a repeating unit (b) containing a group that is configured to decompose when acted on by an acid to thereby produce an alcoholic hydroxyl group,

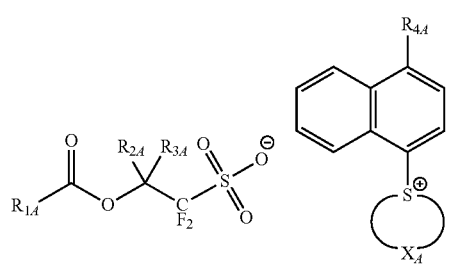

(1)

TABLE 2

| | Compd(A) (mass %) | Resin (B) (100 mass %) | Basic compd or compd (D) (mass %) | Hydrophobic resin (HR) (mass %) | Solvent (mass ratio) | PEBS | Dependence on after-PEB time delay | DOF |
|---|---|---|---|---|---|---|---|---|
| Ex. 1 | A-1(13) | B-1 | C-1(5) | HR-1(1) | SL1/SL2 = 2000/1000 | A | B | C |
| Ex. 2 | A-1(13) | B-1 | D-1(7) | HR-1(1) | SL1/SL2 = 2000/1000 | A | A | C |
| Ex. 3 | A-1(13) | B-2 | C-2(4) | HR-2(1) | SL1/SL2/SL3 = 1950/1000/50 | A | C | B |
| Ex. 4 | A-1(13) | B-2 | D-2(7) | HR-1(1) | SL1/SL2 = 2000/1000 | A | A | C |
| Ex. 5 | A-2(13) | B-1 | C-1(5) | HR-1(1) | SL1/SL2 = 2000/1000 | A | A | B |
| Ex. 6 | A-2(13) | B-1 | D-1(7) | HR-2(1) | SL1/SL2 = 2000/1000 | A | A | A |
| Ex. 7 | A-2(13) | B-2 | C-2(4) | HR-1(1) | SL1/SL2 = 2000/1000 | A | B | B |
| Ex. 8 | A-2(13) | B-3 | D-1(7) | HR-4(1) | SL1/SL2 = 2000/1000 | B | B | C |
| Ex. 9 | A-3(11) | B-1 | C-1(5) | HR-1(1) | SL1/SL2 = 2000/1000 | A | A | B |
| Ex. 10 | A-3(11) | B-2 | D-1(7) | HR-1(1) | SL1/SL2 = 2000/1000 | B | A | C |
| Ex. 11 | A-3(11) | B-2 | C-1(5) | HR-2(1) | SL1/SL2 = 2000/1000 | B | B | B |
| Ex. 12 | A-3(11) | B-4 | D-1(7) | HR-1(1) | SL1/SL2 = 2000/1000 | A | A | B |
| Ex. 13 | A-4(11) | B-1 | C-1(5) | HR-1(1) | SL1/SL2/SL3 = 1950/1000/50 | A | A | B |
| Ex. 14 | A-4(11) | B-1 | D-2(7) | HR-3(1) | SL1/SL2 = 2000/1000 | B | A | A |
| Ex. 15 | A-5(13) | B-3 | C-2(4) | HR-4(1) | SL1/SL2 = 2000/1000 | B | B | C |
| Ex. 16 | A-5(13) | B-4 | D-1(7) | HR-3(1) | SL1/SL2 = 2000/1000 | A | A | A |
| Ex. 17 | A-6(13) | B-1 | C-1(5) | HR-1(1) | SL1/SL2 = 2000/1000 | A | A | B |
| Ex. 18 | A-6(13) | B-1 | D-3(7) | HR-1(1) | SL1/SL2 = 2000/1000 | A | A | B |
| Ex. 19 | A-7(13) | B-2 | C-2(4) | HR-4(1) | SL1/SL2 = 2000/1000 | C | C | C |
| Ex. 20 | A-7(13) | B-3 | D-1(7) | HR-1(1) | SL1/SL2/SL3 = 1950/1000/50 | B | A | B |
| Comp. Ex. 1 | RA-1(13) | B-3 | C-2(4) | HR-1(1) | SL1/SL2 = 2000/1000 | D | D | E |
| Comp. Ex. 2 | A-3(11) | RB-1 | C-2(4) | HR-1(1) | SL1/SL2 = 2000/1000 | E | E | E |

* Mass ratio is one when resin (B) amounts to 100.

In view of the excellent resist pattern forming capability attested to by the above results, it is apparent that the composition and pattern forming method according to the present invention can be appropriately used in semiconductor production processes.

What is claimed is:

1. An actinic-ray- or radiation-sensitive resin composition comprising a compound (A) that is configured to produce an -continued

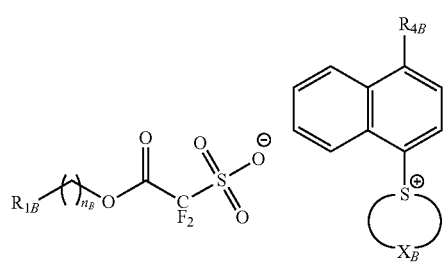

(2)

in general formula (1), $R_{1A}$ represents a linear, branched-chain or cyclic organic group;

each of $R_{2A}$ and $R_{3A}$ independently represents a hydrogen atom, a methyl group or $CF_3$;

$R_{4A}$ represents a hydrogen atom, a hydroxyl group, a linear or branched-chain alkyl group, a cycloalkyl group, a linear, branched-chain or cyclic alkyloxy group or any of groups of general formula (1a) below, provided that a fluorine atom may be contained in each of the alkyl group and the alkyloxy group; and $X_A$ represents an alkylene chain in which a heteroatom may be contained, the alkylene chain constructing a ring in cooperation with the S atom in the formula, and in general formula (2), $R_{1B}$ represents a linear, branched-chain or cyclic organic group;

$R_{4B}$ represents a hydrogen atom, a hydroxyl group, a linear or branched-chain alkyl group, a cycloalkyl group, a linear, branched-chain or cyclic alkyloxy group or any of groups of general formula (1a) below, provided that a fluorine atom may be contained in each of the alkyl group and the alkyloxy group;

$X_B$ represents an alkylene chain in which a heteroatom may be contained, the alkylene chain constructing a ring in cooperation with the S atom in the formula; and $n_B$ is 0 or 1,

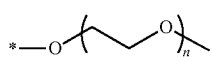

(1a)

in general formula (1a), n is an integer of 1 or greater; and

* represents a site of bonding to the naphthyl group in general formula (1) or (2).

2. The actinic-ray- or radiation-sensitive resin composition according to claim 1, wherein $R_{4A}$ in general formula (1), or $R_{4B}$ in general formula (2), is any of groups of general formula (3a) or (3b) below,

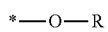

(3a)

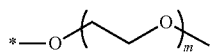

(3b)

in general formula (3a),

R represents a linear or branched-chain fluoroalkyl group having 1 to 4 carbon atoms in which at least one fluorine atom is introduced; and

* represents a site of bonding to the naphthyl group in general formula (1) or (2), and in general formula (3b), m is an integer of 1 to 4; and

* represents a site of bonding to the naphthyl group in general formula (1) or (2).

3. The actinic-ray- or radiation-sensitive resin composition according to claim 1, wherein the resin (B) contains at least any of structures of general formula (OR-1) below as the group that is configured to decompose when acted on by an acid to thereby produce an alcoholic hydroxyl group,

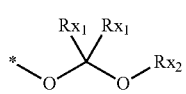

(OR-1)

in which each of $Rx_1$s independently represents a hydrogen atom or a monovalent organic group, provided that two $Rx_1$s may be bonded to each other to thereby form a ring;

$Rx_2$ represents a monovalent organic group, provided that one of $Rx_1$s and $Rx_2$ may be bonded to each other to thereby form a ring; and

* represents a site of bonding to residue of repeating unit (b).

4. The actinic-ray- or radiation-sensitive resin composition according to claim 1, further comprising any of nitrogen-containing compounds (C) of general formula (5) below,

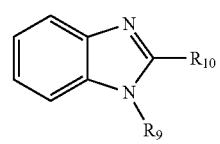

(5)

in which $R_9$ represents a hydrogen atom or an organic group that is configured to decompose when acted on by an acid, and $R_{10}$ represents a hydrogen atom, an alkyl group or an aryl group.

5. The actinic-ray- or radiation-sensitive resin composition according to claim 1, further comprising (D) any of compounds of general formula (6a) or (6b) below, or any of salts of the compounds,

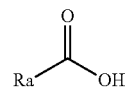

(6a)

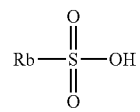

(6b)

in general formula (6a), Ra represents an organic group, provided that one in which a carbon atom directly bonded to the carboxylic acid group in the formula is substituted with a fluorine atom is excluded, and in general formula (6b), Rb represents an organic group, provided that one in which a carbon atom directly bonded to the sulfonic acid group in the formula is substituted with a fluorine atom is excluded.

6. The actinic-ray- or radiation-sensitive resin composition according to claim 1, further comprising a hydrophobic resin (HR) containing a fluorine atom or a silicon atom.

7. The actinic-ray- or radiation-sensitive resin composition according to claim 6, wherein the hydrophobic resin (HR) contains a repeating unit containing a basic group or a group whose basicity is increased when acted on by an acid.

8. The actinic-ray- or radiation-sensitive resin composition according to claim 1, further comprising a solvent containing a compound (G) expressed by formula (7) below, in which the compound (G) is contained in an amount of 10% or less based on the whole mass of the solvent

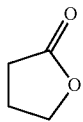 (7)

9. An actinic-ray- or radiation-sensitive film formed from the actinic-ray- or radiation-sensitive resin composition of claim 1.

10. A method of forming a pattern, comprising forming the actinic-ray- or radiation-sensitive resin composition of claim 1 into an actinic-ray- or radiation-sensitive film, exposing the actinic-ray- or radiation-sensitive film to actinic rays or radiation, and developing the exposed actinic-ray- or radiation-sensitive film.

11. The pattern forming method according to claim 10, wherein the development is performed with a developer comprising an organic solvent.

12. A process for manufacturing an electronic device, comprising the pattern forming method according to claim 10.

13. The actinic-ray- or radiation-sensitive resin composition according to claim 1, wherein $R_{4A}$ in general formula (1) represents a hydrogen atom, a hydroxyl group, a linear or branched-chain alkyl group, a cycloalkyl group, a branched-chain or cyclic alkyloxy group, a group of general formula (3a) below, or a group of general formula (1a), provided that a fluorine atom may be contained in each of the alkyl group and the alkyloxy group, and

*—O—R  (3a)

in general formula (3a), R represents a linear fluoroalkyl group having 1 to 4 carbon atoms in which at least one fluorine atom is introduced, and * represents a site of bonding to the naphthyl group in general formula (1).

14. The actinic-ray- or radiation-sensitive resin composition according to claim 1, wherein each of $R_{2A}$ and $R_{3A}$ represents a hydrogen atom.

* * * * *